United States Patent [19]

Koshimizu

[11] Patent Number: 5,322,590

[45] Date of Patent: Jun. 21, 1994

[54] PLASMA-PROCESS SYSTEM WITH IMPROVED END-POINT DETECTING SCHEME

[75] Inventor: Chishio Koshimizu, Nirasaki, Japan

[73] Assignee: Tokyo Electron Limited, Tokyo, Japan

[21] Appl. No.: 107,027

[22] Filed: Aug. 16, 1993

Related U.S. Application Data

[63] Continuation of Ser. No. 857,642, Mar. 24, 1992, abandoned.

[30] Foreign Application Priority Data

| Mar. 24, 1991 | [JP] | Japan | 3-83519 |
|---|---|---|---|
| May 15, 1991 | [JP] | Japan | 3-139570 |
| Jul. 23, 1991 | [JP] | Japan | 3-206300 |
| Oct. 9, 1991 | [JP] | Japan | 3-262404 |
| Oct. 9, 1991 | [JP] | Japan | 3-262405 |
| Oct. 9, 1991 | [JP] | Japan | 3-292117 |
| Jan. 29, 1992 | [JP] | Japan | 4-38504 |
| Jan. 29, 1992 | [JP] | Japan | 4-38507 |

[51] Int. Cl.$^5$ .................. B44C 1/22; C03C 15/00; C03C 25/06
[52] U.S. Cl. .................. 156/626; 156/643; 156/657; 156/345
[58] Field of Search ............. 156/626, 627, 643, 646, 156/657, 662, 345; 204/192.32, 192.33, 192.37, 298.32; 356/319, 320, 326, 437

[56] References Cited

U.S. PATENT DOCUMENTS

| 4,289,188 | 9/1981 | Mizutani et al. | 156/626 |
| 4,493,745 | 1/1985 | Chen et al. | 156/626 |
| 4,872,944 | 10/1989 | Rufin et al. | 156/626 |

FOREIGN PATENT DOCUMENTS 63-81929 4/1988 Japan.
1-230236 9/1989 Japan.

Primary Examiner—William Powell
Attorney, Agent, or Firm—Oblon, Spivak, McClelland, Maier & Neustadt

[57] ABSTRACT

In one aspect of the invention, $CHF_3$ gas and $CF_4$ gas (i.e., reactant gases), and argon gas (i.e., plasma-stabilizing gas) are introduced into a vacuum chamber. RF power is then applied between the electrodes within the chamber, thereby generating plasma. The plasma is applied to a substrate placed in the chamber, thus etching the $SiO_2$ film formed on the substrate. A spectrometer extracts a light beam of a desired wave-length, emitted from the $CF_2$ radical which contributes to the etching. An end-point detecting section monitors the luminous intensity of the $CF_2$ radical reacting with $SiO_2$ during the etching. Once the $SiO_2$ film has been etched away, the luminous intensity of the $CF_2$ radical increases. Upon detecting this increase, the section determines that etching has just ended. The selected wavelength ranges from 310 nm to 236 nm, preferably being 219.0 nm, 230.0 nm, 211.2 nm, 232.5 nm, or any one ranging from 224 nm to 229 nm. In another aspect of the invention, the device attached to the observation window of the chamber removes products stuck to the window during the etching. The window thus cleaned, more light than otherwise passes through the window and reaches the spectrometer. This enables the section to detect even a slight change in the luminous intensity of the $CF_2$ radical, thereby detecting the end point of etching with accuracy.

20 Claims, 26 Drawing Sheets

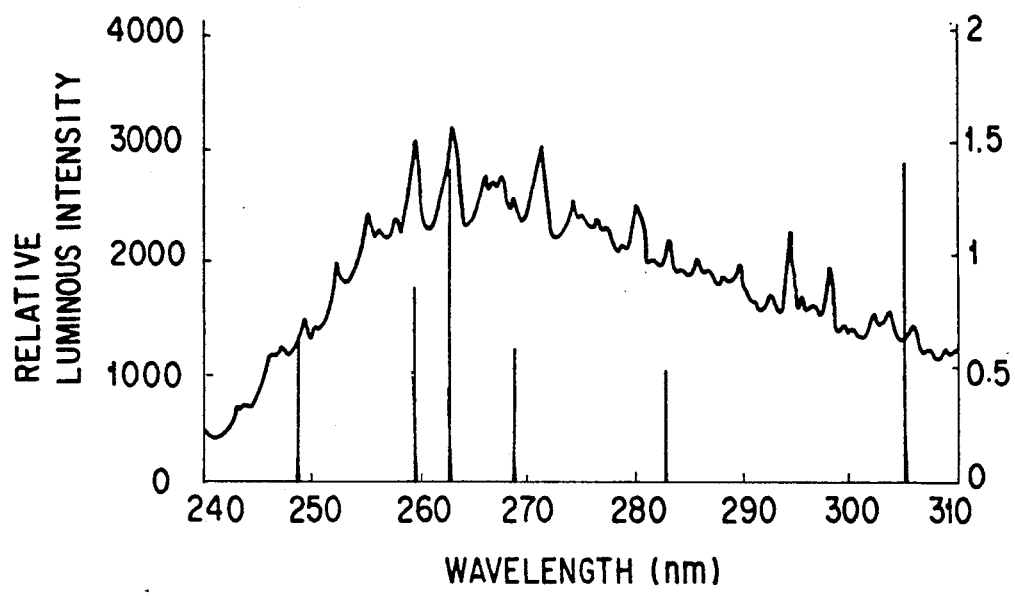
F I G. 6
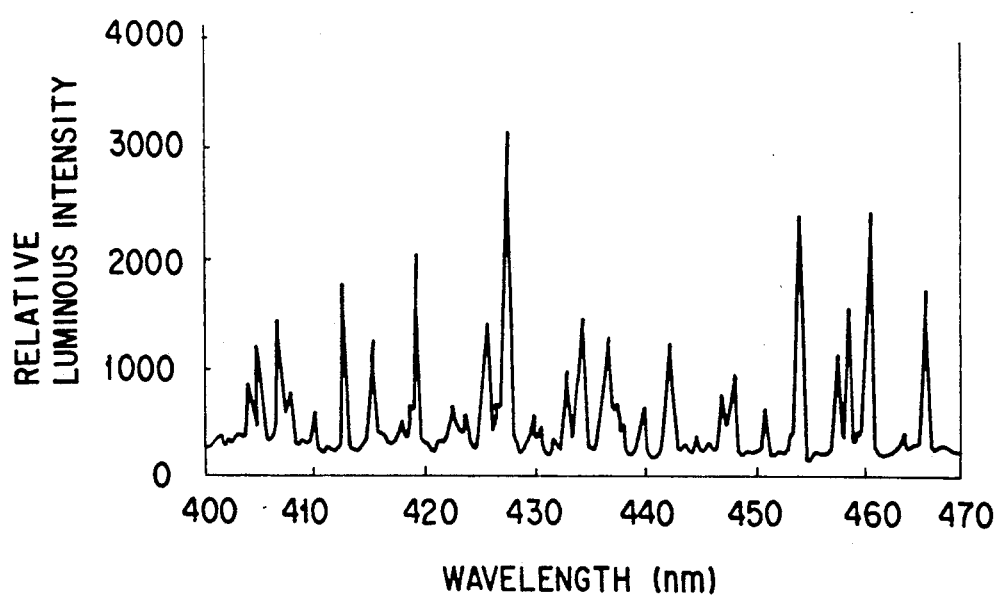
F I G. 7

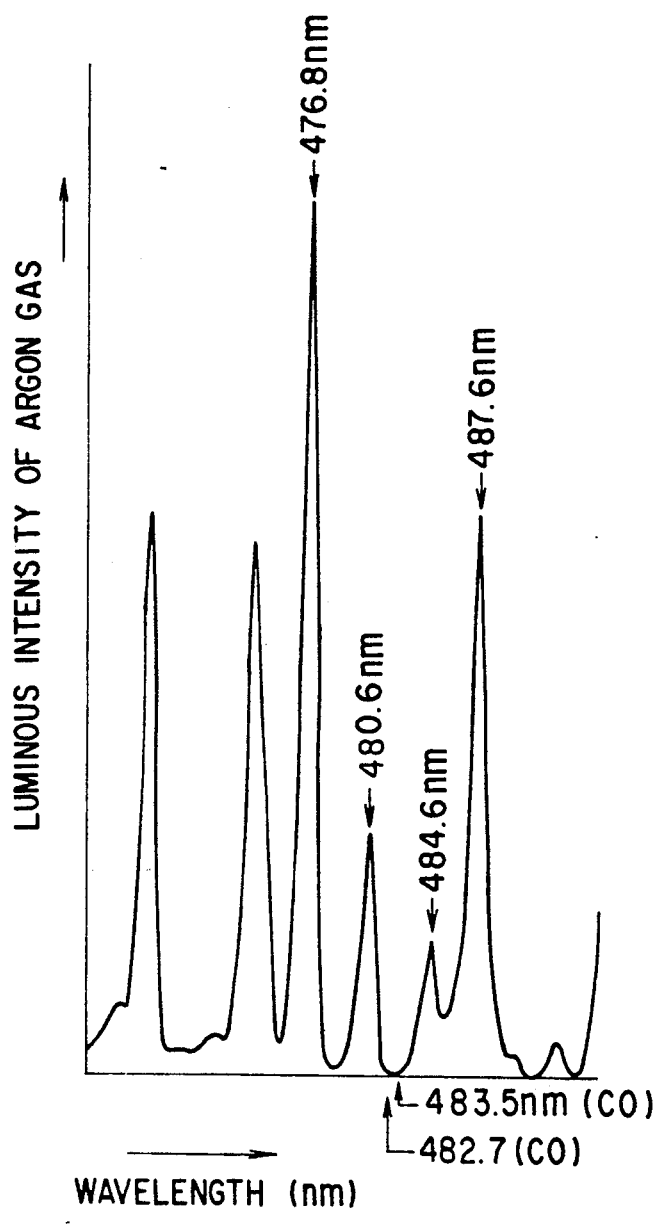
F I G. 9

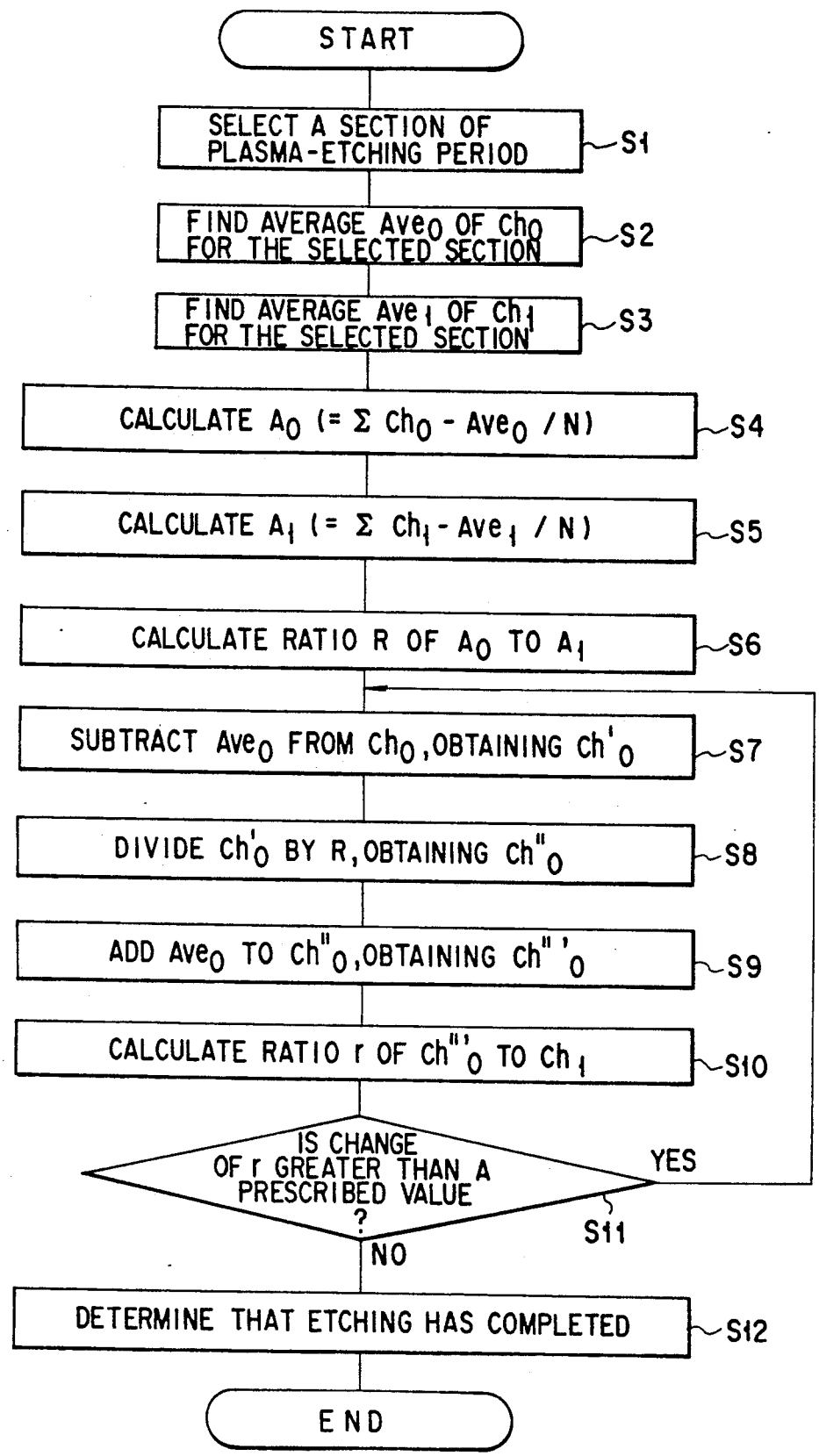
F I G. 12D

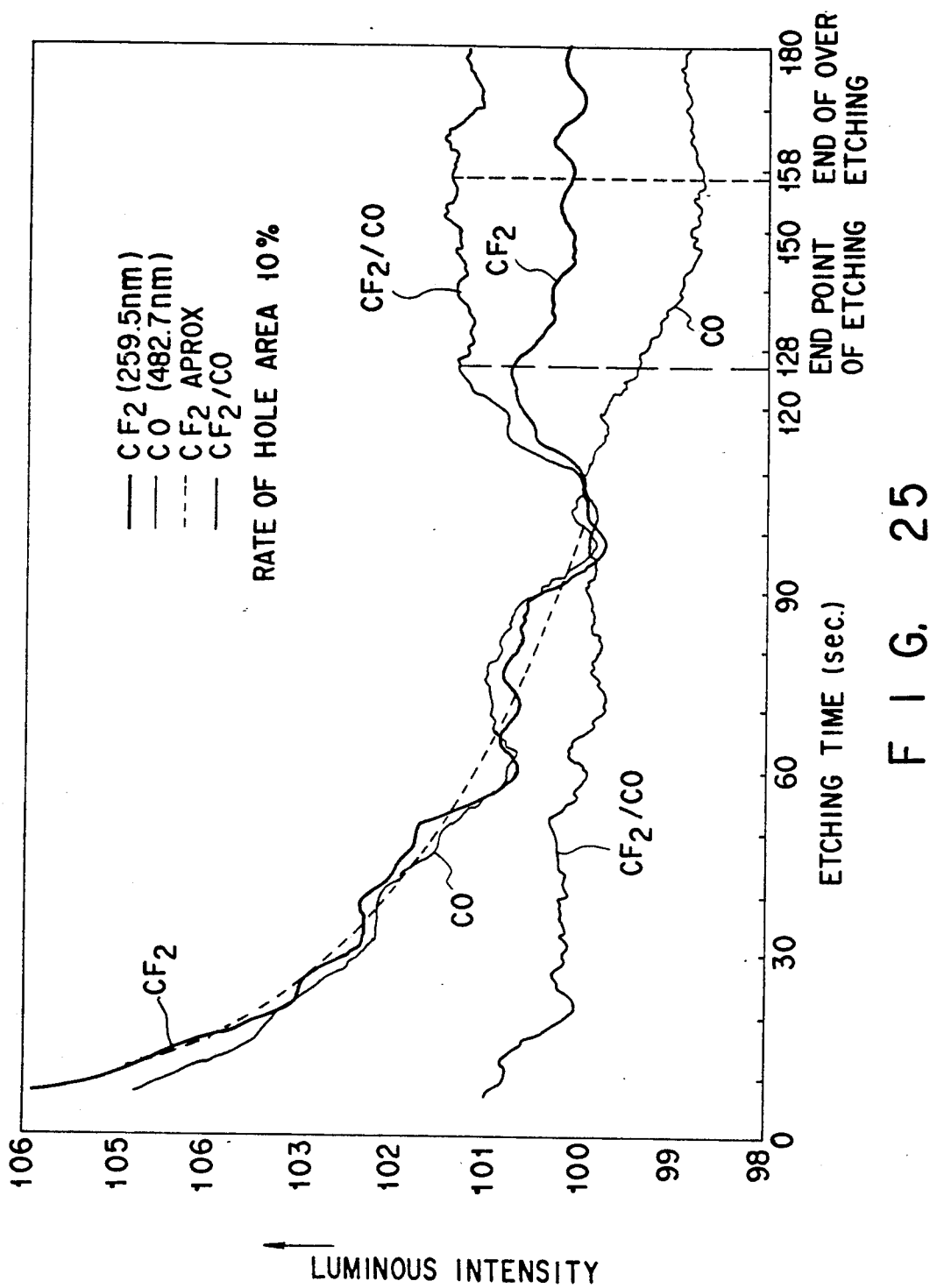
F I G. 25

PLASMA-PROCESS SYSTEM WITH IMPROVED END-POINT DETECTING SCHEME

This application is a continuation of application Ser. No. 07/857,642, filed on Mar. 24, 1992, now abandoned.

BACKGROUND OF THE INVENTION

1. Field of the Invention

The present invention generally relates to a plasma-process system, and more particularly to a plasma-process system including a plasma-process method with improved end-point detecting scheme and also a plasma-process apparatus with improved end-point detecting scheme.

2. Description of the Related Art

In the manufacture of semiconductor devices, dry etching is a process indispensable to the forming of fine IC patterns on a semiconductor wafer. Various types of dry etching are known, among which is plasma process. In the plasma process, plasma is generated from reactant gases within a vacuum chamber, and ions, neutral radicals, atoms, and molecules—all present in the plasma—are applied to a semiconductor wafer, thereby removing things to be removed, such as a silicon dioxide film in non-masked potions on the wafer.

If the plasma process, or plasma etching, is continued even after the things to be removed which should be removed, have been completely removed from the semiconductor wafer, the surface of the wafer will be unnecessarily etched away, or the resist layer on the wafer will be etched to become thinner than is required. Hence, it is required that the end point of the plasma etching be detected with high accuracy.

In a typical conventional method of detecting the end point of plasma etching, the luminous intensity of the product of plasma etching is monitored, and the end point of the plasma etching is determined from the changes in the luminous intensity. In the case of plasma etching, wherein a silicon dioxide film is etched with CF-based reactant gas, the luminous intensity of carbon monoxide, i.e., the reaction product, is monitored, and the end point of plasma etching is determined from the changes in the luminous intensity of the carbon monoxide. (Refer to Published Unexamined Japanese Patent Application No. 63-81929 and Published Unexamined Japanese Patent Application No. 1-230236.)

More specifically, the plasma etching is performed in a reaction chamber containing plasma electrodes and having an observation window. The observation window is made of quartz glass and has a diameter of several centimeters. An optical system including a lens is fixed outside the reaction chamber and located near the observation window. The light emitted from the plasma during the plasma etching is applied through the window to the optical system. The optical system collects the light and outputs it to a photoelectric transducer or the like through an optical fiber. The transducer converts the input light into electric signals, which are supplied to a detecting section. The detecting section processes the signals, thereby detecting the end point of the plasma etching. In the case of plasma etching for etching a silicon dioxide film with CF-based reactant gas, the light emitted from the carbon monoxide (i.e., the reaction product) is collected by an optical system and converted into electric signals by a photoelectric transducer, and these signals are processed to monitor the changes in the luminous intensity of the carbon monoxide and ultimately to determine the end point of the plasma etching.

The end point of the plasma etching is determined for the following reason. As long as the plasma etching proceeds, the reaction product is continuously formed. When the plasma etching comes to an end, that is, when the thing to be etched is etched away completely, the forming of the reaction product stops, whereby the luminous intensity of the product decreases abruptly. Hence, the end point of the plasma etching can be detected by finding an abrupt decrease in the luminous intensity of the reaction product, at a specific wavelength.

For a successful plasma etching, it is necessary to stabilize the plasma in the reaction chamber or to increase the efficiency of etching an undercoating film or a resist layer. To this end, a gas is used in addition to the etching gas, in an amount greater than the etching gas. For example, to stabilize the plasma, argon gas is added to CF-base gas. In this case, the emission spectrum of the carbon monoxide (i.e., the reaction product) overlaps that of the argon gas, which is very broad.

This overlapping of spectra is inevitable for two reasons. First, the wavelength of the intense light the argon gas emits and that of the intense light the carbon monoxide emits fall in a range of 300 to 800 nm; in other words, the light beams emitted from the argon gas and the carbon monoxide have very similar wavelengths. Secondly the carbon monoxide is generated in a very small amount since that the etching reaction is proceeding at only a small portion of the wafer, whereas the argon gas is introduced into the reaction chamber in an amount several to ten times greater than the etching gas applied. As a result, the luminous intensity of the carbon gas is far greater than that of the carbon monoxide.

Since the emission spectrum of the carbon monoxide overlaps that of the argon gas, for the reasons mentioned above, the luminous intensity of the carbon monoxide can hardly be found correctly. Consequently, it is difficult to detect the end point of the plasma etching in the conventional method.

In the conventional method, the luminous intensity of the reaction product is monitored over a wavelength range of about 300 to 900 nm, because of the limited sensitivity of the luminous intensity detector used, such as a spectrometer. In particular, the luminous intensity is monitored with respect to a wavelength of 482.0 nm at which the peak intensity is found in the emission spectrum of carbon monoxide. Obviously, the wavelength range of 300 to 900 nm is very similar to the range of 350 to 860 nm for the intense light which argon gas emits. Consequently, the emission spectrum of carbon monoxide overlaps that of the plasma itself, making it difficult to detect the luminous intensity of carbon monoxide with sufficiently high accuracy.

In recent years it has been demanded that finer IC patterns be formed on a semiconductor wafer. To meet this demand, the IC patterns formed on wafers at present are actually finer than those formed before. Thus, the tendency is that the ratio of the etched surface portion to the entire surface area of a semiconductor wafer, i.e., the rate of hole area, is now 10% or less. In some cases, this ratio is as small as 2% or 3%. The amount of the carbon monoxide, generated generated during plasma etching, is extremely small, for example only 1% or less of the amount of the carbon gas introduced into the reaction chamber. Hence, the conventional method can no longer serve to detect the luminous intensity of carbon monoxide with high accuracy, making it difficult to determine the end point of the plasma etching.

Further, to meet the demand for the forming of finer IC patterns, or the increasing demand for the forming contact holes only, trenches only or wiring patterns only by means of plasma etching, the rate of hole area is likely to be only 1% or even less at present. As a consequence, the change in the amount of etching gas supplied immediately before or after the end of plasma etching is extremely small. Hence, the intensity of the emission spectrum of the etching gas changes very little shortly before or after the end of plasma etching, and the luminous intensity of the gas is extremely low shortly before or after the end of plasma etching. Thus, with the conventional method it would be impossible to detect the end point of plasma etching with high accuracy.

In another conventional method, not only the luminous intensity of the reaction product, but also the luminous intensity of the etching gas is monitored, and the end point of plasma etching is determined from the difference between the luminous intensity of the product and that of the gas or from the ratio of the former to the latter. This method is based on the assumption that the amount of the etching gas in the reaction chamber remains almost constant during the plasma etching, but increases at the end thereof.

This conventional method, however, is disadvantageous, too. The amount of the etching gas and that of the reaction product do not always remain constant throughout the etching. In some cases, the luminous intensity of the gas and that of the product decrease as the etching proceeds. This is perhaps because of the changes in the operating conditions of the exhaust system, the changes in the temperature in the reaction chamber, or the like. Consequently, the end point of the plasma etching cannot be correctly determined, solely from the difference between the luminous intensity of the product and that of the gas or the ratio of the luminous intensity of the product to that of the etching gas.

Particularly, in the case where the luminous intensity of an etching gas gradually decreases during the plasma etching proceeds, more than it changes at the very end of the etching, it is difficult to distinguish the change during the etching from the change at the end of the etching, or vice versa. It would be more difficult to do so in the case where the rate of hole area is low, since the luminous intensity of the etching gas changes only a little at the end of the plasma etching.

As has been described, the optical system is fixed outside the reaction chamber in a prior-art plasma-process apparatus. Here arises a problem. The position where the plasma is generated changes in accordance with the size of the semiconductor wafer being plasma-processed and also with the conditions of plasma process. Hence, in the prior-art plasma-process apparatus, it is impossible to detect the peak point of the plasma by means of the optical system, which cannot be moved at all.

In addition, the plasma is generated within the reaction chamber in various manners, depending on the conditions of the plasma process such as the size of the wafer, the way of processing the wafer, and the composition of the etching gas used. As a result of this, the peak point of the plasma, i.e., the point where the plasma has the highest luminous intensity, moves back or forth, and up or down, in the space between the plasma electrodes, every time the plasma-process conditions are changed.

With the prior-art plasma-process apparatus, wherein the optical system containing a lens used for detecting the luminous intensity of plasma is fixed in place, the peak point of the plasma can not always located. Hence, the apparatus cannot detect slight changes in the luminous intensity of the plasma, making it even more difficult to detect the end point of plasma etching. In view of this, the conventional plasma-process apparatus needs some improvement.

The recent tendency in the art is that a light beam having a short wavelength, e.g., 200 nm, which is shorter than any one within the emission spectrum of argon gas, is observed so that its luminous intensity is detected. However, as much as 50% of the light having such a short wavelength is absorbed, in some cases, by the optical fiber as it is applied from the optical system to the photoelectric transducer or the like.

Furthermore, the reaction product formed during the plasma-process sticks onto the inner surface of the observation window of the reaction chamber, inevitably rendering the window opaque. The amount of light applied from the window to the optical system is less than otherwise. This makes it still difficult to determine the end point of plasma etching with accuracy, since it is necessary at present to detect the end point from the changes in the plasma luminous intensity which are extremely small in most cases for the aforementioned reasons.

SUMMARY OF THE INVENTION

It is, therefore, an object of the present invention to provide a new and advanced plasma-process method which has an improved scheme of detecting the end point of the plasma process, and in which the end point of the plasma etching can be detected with accuracy even if a gas is used whose emission spectrum overlaps that of the reaction product being formed during the plasma etching, for example.

It is another object of the invention to provide a new and improved plasma-process apparatus which has an improved scheme of detecting the end point of the plasma process, and in which the end point of the plasma etching can be detected with accuracy even if a gas is used whose emission spectrum overlaps that of the reaction product being formed during the plasma etching, for example.

According to a first aspect of the present invention, there is provided a plasma-process method comprising the steps of:

placing an object at a predetermined position within a reaction chamber in which to generate plasma, said object having a silicon dioxide film formed on at least a part of a surface thereof;

conducting a CF-based gas used as reactant gas and a predetermined additional gas into the reaction chamber;

generating plasma in the reaction chamber, thereby to perform etching the silicon dioxide film formed on the object;

monitoring luminous intensity of active species present in the CF-based gas, which contribute to the etching; and detecting an end point of the etching from the monitored luminous intensity of the active species, without influence of influence of the emission spectrum of the additional gas.

According to a second aspect of the invention, there is provided a plasma-process method comprising the step of:

placing an object at a predetermined position within a reaction chamber in which to generate plasma, said object having a silicon dioxide film formed on at least a part of a surface;

conducting a CF-based gas used as reactant gas and a predetermined additional gas into the reaction chamber generating plasma in the reaction chamber, thereby to etch away the silicon dioxide film formed on the object;

monitoring an intensity of a light beam emitted from the plasma and having a desired spectrum selected from a desired wavelength which falls within a range of 210 to 236 nm; and detecting an end point of the etching from a monitored intensity of the light beam having the desired wavelength, without influence of influence of an emission spectrum of the additional gas.

According to a third aspect of this invention, there is provided a plasma-process apparatus which comprises:

processing means having a reaction chamber which is capable of containing an object, in which plasma can be generated to process the object, and which has an observation window;

removing means provided with the observation window, for removing a substance from the observation window;

photoelectric means optically coupled to the observation window, for generating an electric signal corresponding to the luminous intensity of a light beam emitted from the plasma and having a predetermined wavelength; and detecting means connected to the photoelectric means, for detecting the end point of plasma process being performed in the reaction chamber, in accordance with the electric signal generated by the photoelectric means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a diagram showing the emission spectrum of the plasma, for the wavelength range of 240 to 310 nm, and also various rates of change in the luminous intensity of the $CF_2$ radical;

FIG. 7 is a diagram showing the emission spectrum of the plasma, for the wavelength range of 400 to 470 nm;

FIG. 9 shows part of the emission spectrum of argon gas, recorded in the plasma-process method according to the second embodiment;

FIG. 12D is a flow chart, also explaining the various calculations made in the end-point detecting system of FIG. 11;

FIG. 25 is a graph explaining how the luminous intensities of an active species and a reaction product, and the ratio of these luminous intensities changed as the plasma etching went on in the apparatus shown in FIG. 22;

DETAILED DESCRIPTION OF THE PREFERRED EMBODIMENTS

A first embodiment of the invention, or a plasma-process method, will now be described, with reference to FIGS. 1–4, FIGS. 5A and 5B, and FIGS. 6 and 7.

The plasma etching apparatus and the etching end-point detecting system, both designed to perform the plasma-process method, will be described first, with reference to FIG. 1.

Figure 1:
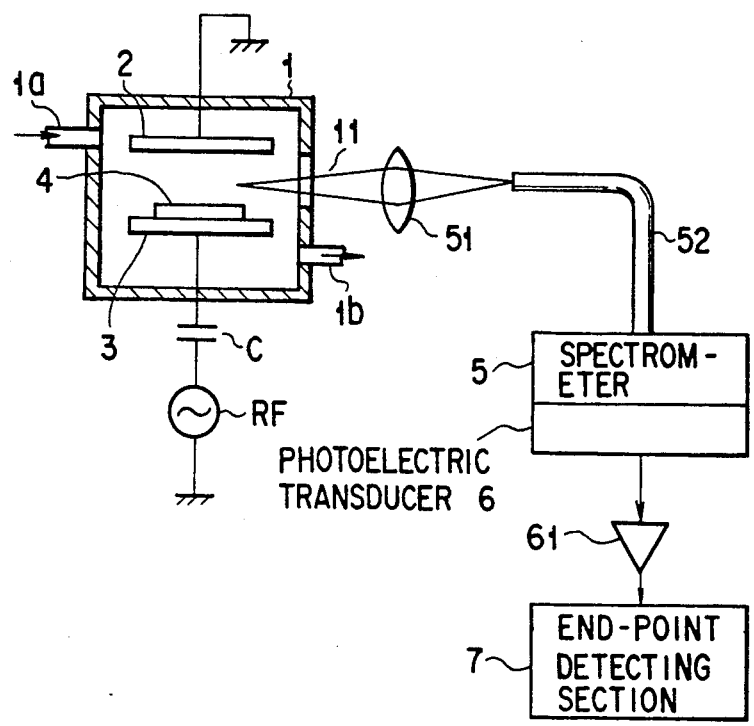
FIG. 1 is a diagram schematically showing a plasma-etching apparatus designed to perform a plasma-process method according to a first embodiment of the present invention.

As is shown in FIG. 1, the plasma etching apparatus comprises a vacuum chamber 1. Two plate-shaped electrodes 2 and 3 are located in the chamber 1; the electrode 2 is positioned above, and parallel to, the electrode 3. The upper electrode 2 is connected to the ground, whereas the lower electrode 3 is connected to a high-frequency power supply RF by a capacitor C. The power supply RF and the capacitor C are located outside the vacuum chamber 1. According to the invention, the electrodes 2 and 3 can be integral parts of the chamber 1, the former defining the top thereof, and the latter defining the bottom thereof.

A gas-inlet pipe 1a and a gas-outlet pipe 1b are connected to the vacuum chamber 1. The pipe 1a is used to introduce CF-based gas (a reactant gas) and argon gas (additional gas) into the space between the parallel plate-shaped electrodes 2 and 3. The pipe 1b is connected to a vacuum pump (not shown), for exhausting gases out of the vacuum chamber 1. A semiconductor substrate 4, which is to be plasma-etched, is placed on the lower electrode 3, and is clamped thereto by means of a clamper (not shown).

A window 11 is made in the side wall of the vacuum chamber 1, allowing the emitted from plasma generated between the electrodes 2 and 3 to travel outwards from the chamber 1.

Outside the chamber 1, a spectrometer 5, a photo-electric transducer 6, and an end-point detecting section 7 are arranged. Also located outside the chamber 1 are: an optical system for directing the light to the spectrometer 5 through the window 11, such as a focusing lens 51, an optical fiber 52, for example, and an amplifier 61. The focusing lens 51 collects the light passing through the window 11. The light collected by the lens 51 is applied through the optical fiber 52 to the spectrometer 5. The spectrometer 5 splits the light, forming an emission spectrum, and outputs a light beam having a selected wavelength. The photo-electric transducer 6 converts this light beam into an electric signal. The amplifier 61 amplifies the electric signal. The amplified signal is input to the end-point detecting section 7. The section 7, which comprises an A/D converter and a CPU, processes the signal, thereby monitoring the luminous intensity of the plasma and detecting changes in the luminous intensity, in order to determine the end point of the plasma etching being carried out within the vacuum chamber 1.

The plasma etching apparatus and the etching end-point detecting system, both shown in FIG. 1, were actually used, carrying out the plasma-process method according to the first embodiment of the invention, in order to detect the end point of the plasma etching undergoing in the vacuum chamber 1.

More specifically, a silicon substrate 4 having a silicon dioxide film formed on its upper surface was plated on the lower electrode 3. $CH_3$ gas and $CF_4$, both being CF-based gases, were supplied into the vacuum chamber 1 through the gas inlet pipe 1a. Also, argon gas, i.e., an additional gas, was introduced via the pipe 1a into the chamber 1 at the rate of 1000 SCCM, in order to stabilize the plasma which would be generated within the vacuum chamber 1. Then, the vacuum pump (not shown) was driven, evacuating the chamber 1 until the pressure within the chamber 1 decreased to 1.2 Torr. Next, the high-frequency power supply RF supplies a high-frequency power of 750 W and 13.56 MHz between the electrodes 2 and 3. As a result, plasma was generated in the vacuum chamber 1, whereby the silicon dioxide ($SiO_2$) film on the substrate 4 was etched. At this time, the temperature of the substrate 4 was 20° to 40° C.

Attention was paid to the $CF_2$ radical, i.e., one of the various active species present in the plasma generated between the electrodes 2 and 3. In other the spectrometer 5 extracted a light beam having a wave-length of 262.8 nm, which was one of the light beams emitted from the $CF_2$ radical, from the input light applied from the chamber 1 through the focusing lens 51 and the optical fiber 52. The photoelectric transducer 6 converted this light beam into an electric signal, which was amplified by the amplifier 61. Based on this signal, the end-point detecting section 7 monitored the luminous intensity of the $CF_4$ radical (i.e., the intensity of the light emitted from this radical). When the luminous intensity increased by 1.4% after the plasma had been stabilized, the section 7 determined that the plasma etching came to an end, thus detecting the end point of the plasma etching, and stopped the power supply to the electrodes 2 and 3.

Figure 2:
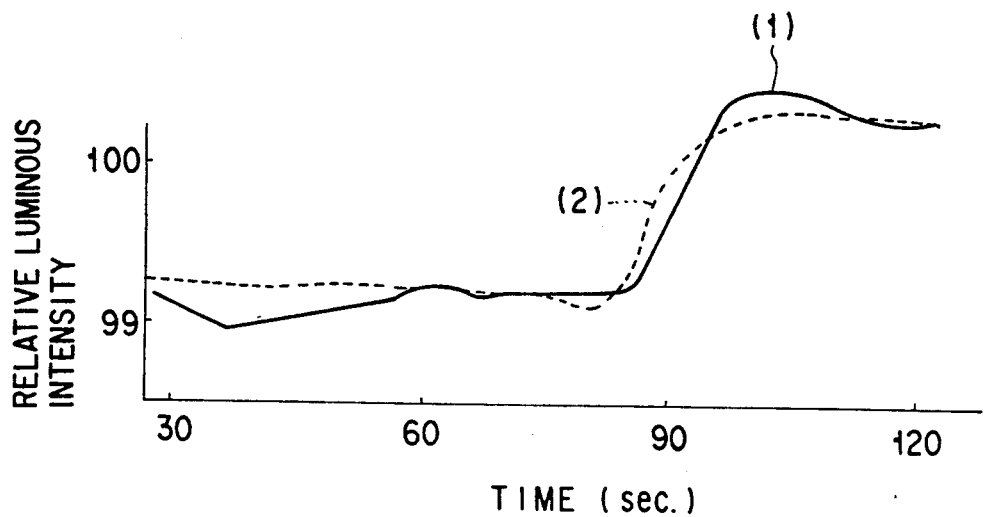
FIG. 2 is a graph representing how the luminous intensity of $CF_2$ radical change with time in the plasma-process method according to the first embodiment of the invention.

The emission spectrum of $CF_2$ radical covers a specific range of wavelengths. Of this emission spectrum, two light beams having wavelengths 262.8 nm and 259.4 nm, respectively, both emitted from the $CF_2$ radical in the plasma, were checked in terms of their intensities. The results were as is illustrated in FIG. 2, in which the solid curve (1) and broken curve (2) illustrate how the intensities of these light beams changed with time. It should be noted that "100" in FIG. 2 indicates the average of the luminous intensities of the plasma recorded before and after the plasma etching. As is evident from FIG. 2, the intensities of both light beams emitted from the $CF_2$ radical greatly changed at the end of the plasma etching, by about 1.4% and about 0.85%, respectively.

To ascertain that the plasma etching was completed the very moment the luminous intensity of the $CF_2$ radical increased by about 1.4%, plasma etching was conducted on two groups of silicon substrates 4 in the same conditions as specified above, except for two respects. First, the plasma etching on each first-group substrate was stopped immediately before the luminous intensity of the $CF_2$ radical increased by 1.4%. Second, the plasma etching on each second-group substrate was stopped immediately after the luminous intensity of the $CF_2$ radical increased abruptly. The surfaces of the substrates 4 of both groups, all having been plasma-etched in said ways, were photographed by means of an SEM (Scanning Electron Microscope), and the resultant photographs were examined and analyzed. The analysis showed that a thin silicon dioxide film remained on each first-group substrate and had some openings, thus exposing some portions of the single-crystal silicon substrate, and also that no silicon dioxide film remained on each second-group substrate, exposing the entire upper surface of the single-crystal silicon substrate.

The facts described in the preceding paragraph teach that the $CF_2$ radical contributed to the etching of the silicon dioxide film. In other words, it was proved that this radical directly reacted with silicon dioxide in the way represented by the following formula, removing the silicon dioxide film from the silicon substrate 4.

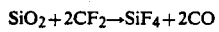

$$SiO_2 + 2CF_2 \rightarrow SiF_4 + 2CO$$

Obviously, once the silicon dioxide film had been etched and removed from the substrate 4, $CF_2$ radical abruptly increased by the same number as had been consumed during the plasma etching. Upon detecting this abrupt increase in the number of $CF_2$ radicals, the section 7 determines that the plasma etching has just come to an end, thus detecting the end point of the plasma etching.

When CF-based gases are used as reactants, not only $CF_2$ radical, but also other CF-based active species such as $CF_1$ radical, CF ion, and $CF_3$, and also fluorine radical, fluorine ion, and hydrogen radical are generated as is known in the art. Therefore, it was examined how the luminous intensity of the $CF_1$ radical changed with time. In order to analyze a light beam having a wavelength of about 200 nm, the window 5, the focusing lens 5, and the optical fiber 52 were replaced by those made of quartz glass. Then, the emission spectrum of the $CF_1$ radical was identified. It was thereby found that the $CF_1$ radical emitted light beams having wavelengths of 202.4 nm, 208 nm, 223.8 nm, and 230.5 nm.

Of these light beams, the two having the wavelengths of 202.4 nm and 208 nm were examined to see how their intensities changed as the plasma etching was carried out. The plasma etching was performed on a silicon wafer having a silicon dioxide film formed on the entire surface, under the following conditions. The pressure in the vacuum chamber 1 was 250 mTorr; a high-pressure frequency power of 600 W and 13.56 MHz was applied to the electrodes 2 and 3; and $CHF_3$ gas, $CF_4$ gas, and argon gas were supplied into the chamber 1 at 20 SCCM, 20 SCCM, and 400 SCCM, respectively. Further, the light emitted from the $CF_4$ radical was passed through an interference filter whose center wavelength is 260 nm, and whose half-amplitude is 10 nm, and the intensity of the light output by the filter was measured. The results of this experiment were as is shown in FIGS. 3 and 4.

Figure 3:
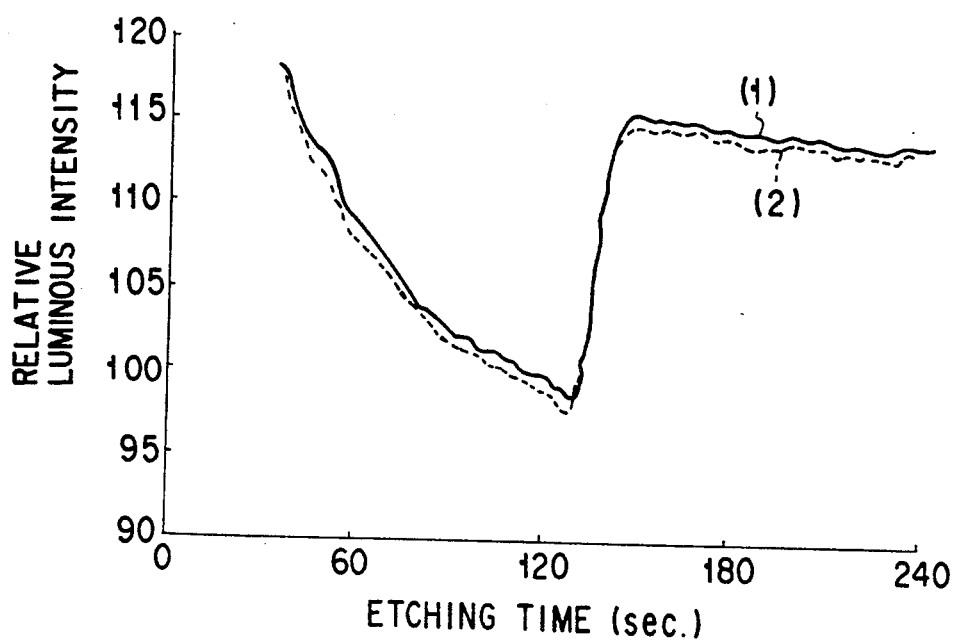
FIG. 3 is a graph representing how the luminous intensity of $CF_1$ radical at a specific wavelength change with time in the plasma-process method according to the first embodiment.
Figure 4:
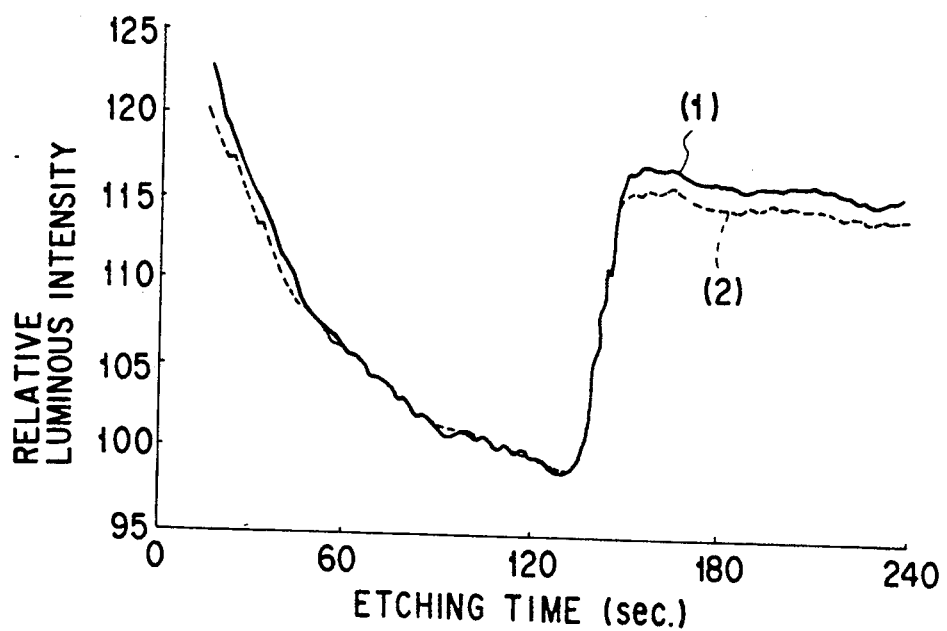
FIG. 4 is a graph representing how the luminous intensity of $CF_1$ radical at a different wavelength change with time in the plasma-process method according to the first embodiment.

In FIG. 3, the solid curve (1) represents how the 202.4 nm luminous intensity of $CF_1$ radical changed with time. In FIG. 4, the solid curve (1) represents how the 208 nm luminous intensity of the $CF_1$ radical changed with time. In both FIG. 3 and FIG. 4, the broken curves (2) indicate how the intensities of the 260 nm beams emitted from the $CF_2$ radical changed with time. As can be under stood from FIGS. 3 and 4, the two luminous intensities of the $CF_1$ radical, at 202.4 nm and 208 nm, respectively, increased about 18% at the end of the plasma etching, as did the 260 nm luminous intensity of the $CF_4$ radical. Obviously, the $CF_1$ radical did also contribute to the etching of the silicon dioxide ($SiO_2$) film.

Figure 5:
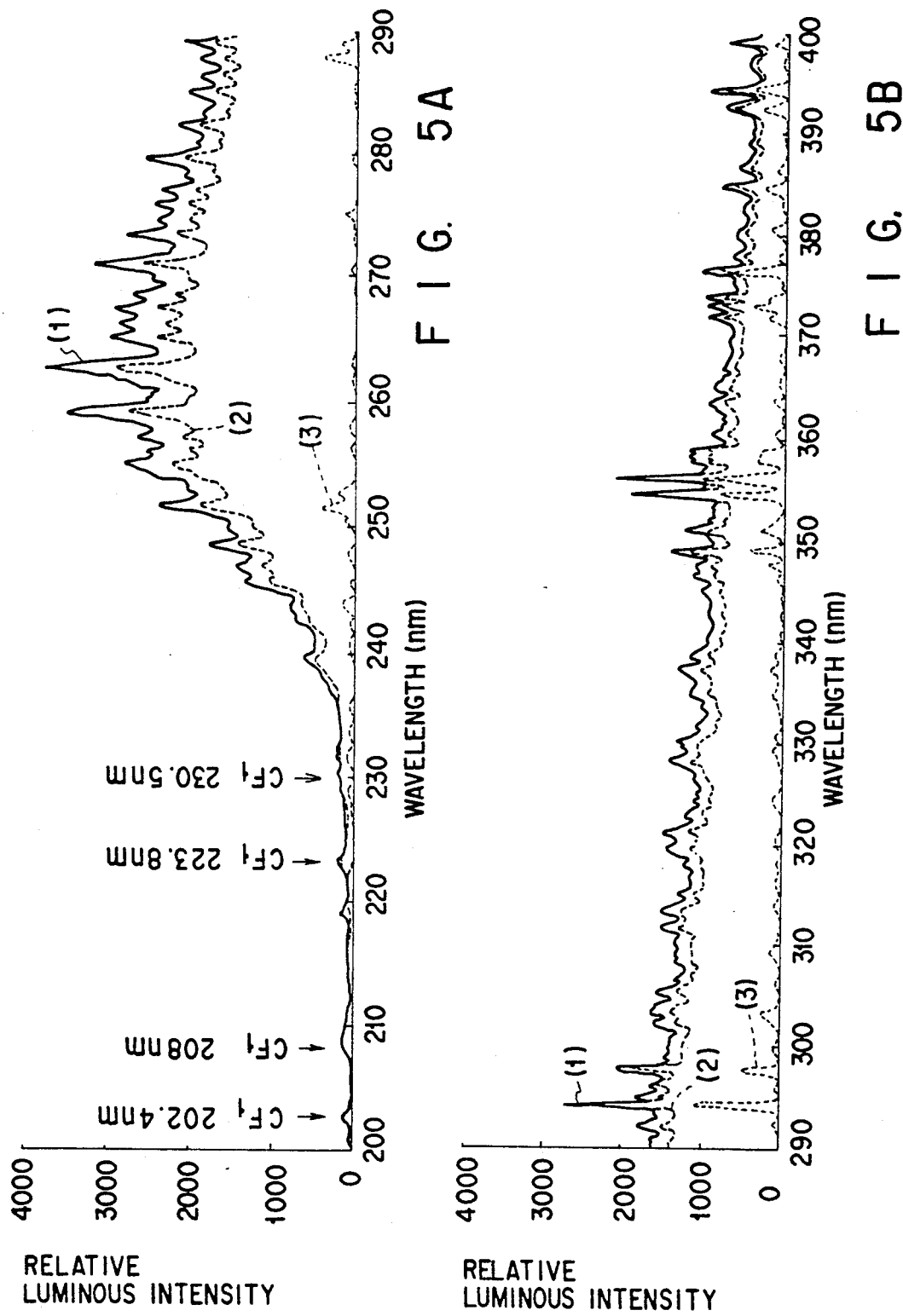
FIGS. 5A and 5B show the emission spectrum of the plasma being applied to a semiconductor wafer in the plasma-process method according to the first embodiment of the invention.

Moreover, three experiments were conducted. In the first experiment, a silicon wafer having no silicon dioxide film formed on it was placed on the lower electrode 3, plasma was generated in the chamber 1 in the same way as in the experiment of FIGS. 3 and 4, and the emission spectrum of the plasma, over the wavelength range of 200 nm to 400 nm, was examined. In the second experiment, a silicon wafer having a silicon dioxide film formed on its entire surface was placed on the lower electrode 3, plasma was generated in the chamber 1 in the same way as in the experiment of FIGS. 3 and 4, and the 200–400 mn emission spectrum of the plasma was analyzed. In the third experiment, a silicon wafer having no silicon dioxide film formed on it was placed on the lower electrode 3, plasma was generated in the chamber 1 in the same way as in the experiment of FIGS. 3 and 4, except that argon gas only was introduced into the chamber 1 at the rate of 400 SCCM, and the 200–400 nm emission spectrum of the plasma was examined. FIGS. 5A and 5B illustrate the results of these experiments. More precisely, the solid curve (1) indicates the emission spectrum observed in the first experiment, the broken curve (2) represents the emission spectrum of plasma obtained in the second experiment, and the broken curve (3) depicts the emission spectrum analyzed in the third experiment.

As is evident from FIGS. 5A and 5B, the luminous intensity of the $CF_1$ radical was high over the wavelength range of 200 nm to 230 nm, and that of the $CF_2$ radical was high over the wavelength range of 240 nm to 350 nm. Also, FIGS. 5A and 5B reveals that the luminous intensity of the argon was relatively high at about 252 nm, about 288 nm, and about 294 nm. The luminous intensity of the argon was dominant at 400 nm or more.

As the broken curve (2) in FIGS. 5A and 5B shows, the luminous intensity of the $CF_2$ radical, measured in the second experiment, was lower than the luminous intensity of the $CF_2$ radical, measured in the first experiment, not only at 259.5 nm and 262.8 nm, but also over the 240–400 nm range, but increased prominently at the end of the plasma etching. Therefore, the end point of the plasma etching can be detected by monitoring the luminous intensity of the $CF_1$ radical or that of the $CF_2$ radical at 240 nm to 350 nm. In view of the resolution, sensitivity and price of the spectrometer 5 and also the other light-emitting reactive species, it would be most recommendable that the light emitted from the $CF_2$ radical be input to an interference filter, whose center wave-length ranges from 260 to 280 nm (in which range the luminous intensity of argon is not prominent), whose half-value width is 10 to 40 nm, and which is inexpensive, and that the light output by this filter be converted into an electric signal by means of a silicon photodiode which is also an inexpensive element.

In the experiments of FIGS. 5A and 5B, the luminous intensity of the $CF_3$ radical could not be detected, inevitably because this radical has a very short life-time. Nevertheless, it is well assumed that this CF-based active species contributed to the experimental plasma etching, like the other CF-based active species (i.e., the $CF_1$ radical and the $CF_2$ radical).

In order to determine how the luminous intensities of the fluorine radical, the fluorine ion, and the hydrogen radical changed as the plasma etching went on in the vacuum chamber 1, the light beams emitted from the fluorine radical and having the wavelengths of 685.6 nm and 703.7 nm, the light beams emitted from the fluorine ion and having the wavelengths of 424.5 nm and 444.6 nm, and the light beams emitted from the hydrogen radical and having the wavelengths of 656.3 nm and 486.1 nm were extracted from the light emitted from the plasma, by means of the spectrometer 5. It was then found that the luminous intensities of the fluorine radical, the fluorine ion and the hydrogen radical changed little even at the very end of the plasma etching.

In view of the above, it is believed that some of the active species present in the plasma greatly contributed to the removal of the silicon dioxide film, some others did not contribute thereto at all, and the remaining others contributed thereto but not so much. When CF-based gases, such as $CF_3$ and $CF_4$, were used as reactant gases, the CF-based active species, such as $CF_1$ radical, $CF_2$ radical, CF ion and $CF_3$ ion, did greatly contribute to the removal of the silicon dioxide film.

In the plasma-process method described above, which is the first embodiment of the invention, the intensities of the light beams emitted from the $CF_2$ radical and having specific wavelengths are monitored, and the end point of the plasma etching is detected from the changes in the intensities of these light beams (i.e., the luminous intensity of the $CF_2$ radical). The luminous intensities of the $CHF_3$ gas, $CF_4$ gas and argon gas, which are the other components of the mixture gas used in the plasma etching, may influence the detection of the end point of the plasma etching. To determine how they influence the end-point detection, the emission spectrum of the mixture gas was recorded, and the rate of change in the luminous intensity of the $CF_2$ radical was measured. The results were as is illustrated in FIGS. 6 and 7. In FIG. 6, the vertical lines represent various rates of change in the luminous intensity of the $CF_2$ radical. Each rate of change is a ratio of the $CF_2$ radical luminous intensity detected at the end of the plasma etching to the $CF_2$ radical luminous intensity detected before the end of the plasma etching.

As can be understood from FIGS. 5A and 5B and FIG. 6, the relatively great changes in the luminous intensity of the $CF_2$ radical can be detected, not affected by the luminous intensity of the argon gas, even if the argon gas has been introduced into the vacuum chamber 1 in an amount greater than the reactant gases combined. Although the argon gas emits light beams at 350 nm, these light beams are filtered out by the interference filter whose center wavelength ranges from 260 nm to 280 nm. Hence, the plasma-process method, described above, can detect the end point of the plasma etching with high accuracy.

As is evident from FIG. 7, the argon gas has high luminous intensity for some wavelengths over the range of 400 nm to 470 nm.

In the first embodiment described above, argon gas is used as additional gas to stabilize the plasma, in greater quantities than the reactant gases combined. The plasma-process method according to the first embodiment can be effectively employed also in the case where the additional gas is one which helps to improve etching anisotropy and whose emission spectrum overlaps that of the reaction product such as carbon monoxide (CO).

The term "overlapping of emission spectra" or the like term, used herein, means not only that an emission spectrum completely overlaps another, but also that an emission spectrum overlaps a part of another emission spectrum and emission components near to less than resolution of the spectrometer.

In the first embodiment of the present invention, the reactant gases are not necessarily limited to CF-based ones. Cl-base gases, for example, can be used. In the case where Cl-based gases are applied, too, it suffices to monitor the luminous intensity of any active species that contributes to the plasma etching.

Further, the use of the first embodiment of the invention is not limited to the plasma etching of silicon dioxide film. Rather, the plasma-process method described above can be applied to the etching of polysilicon film and aluminum-alloy film. In addition, the method can be applied to plasma etching of a film formed on a polysilicon substrate or an oxide layer, rather than a single-crystal silicon substrate.

The first embodiment of the invention, described above, can be applied to an etching apparatus of cathode-coupling type wherein a semiconductor substrate is placed on the cathode. Alternatively, it can be applied to an etching apparatus of anode-coupling type wherein a semiconductor substrate is placed on the anode. Also can it be applied to an etching apparatus in which reactive gas plasma is generated in a discharge chamber by using thermoelectrons, and the plasma thus generated is applied into the etching zone.

As has been explained, in the plasma-process method according to the first embodiment of the invention, the luminous intensity of an active species which contributes to plasma etching is monitored, and the endpoint of the plasma etching is detected when the luminous intensity of the active species increases greatly. An additional gas (e.g., argon gas for stabilizing the plasma or a gas similar or identical to a reaction product) may be introduced into the vacuum chamber in greater quantities than reactant gases and may have a high luminous intensity and an emission spectrum overlapping that of a reaction product. In such a case, only the light beams emitted from the active species, whose wavelengths fall outside the wavelength range of the additional gas, are monitored. Therefore, the luminous intensity of the active species greatly changes immediately before and after the end of the plasma etching, whereby the end point the etching is detected with high accuracy. The first embodiment is particularly useful in the case where the reaction product has the same emission spectrum as the additional gas, and it suffices to monitor any light beam emitted from the reaction product, no matter whether is wavelength fall outside the wavelength range of the additional gas.

A plasma-process method according to a second embodiment of the invention will now be described, with reference to FIGS. 8, 9, and 10.

A plasma etching apparatus 102 and an etching endpoint detecting system, both designed to effect the plasma-process method, i.e., the second embodiment, will be described first with reference to FIG. 8.

Figure 8:
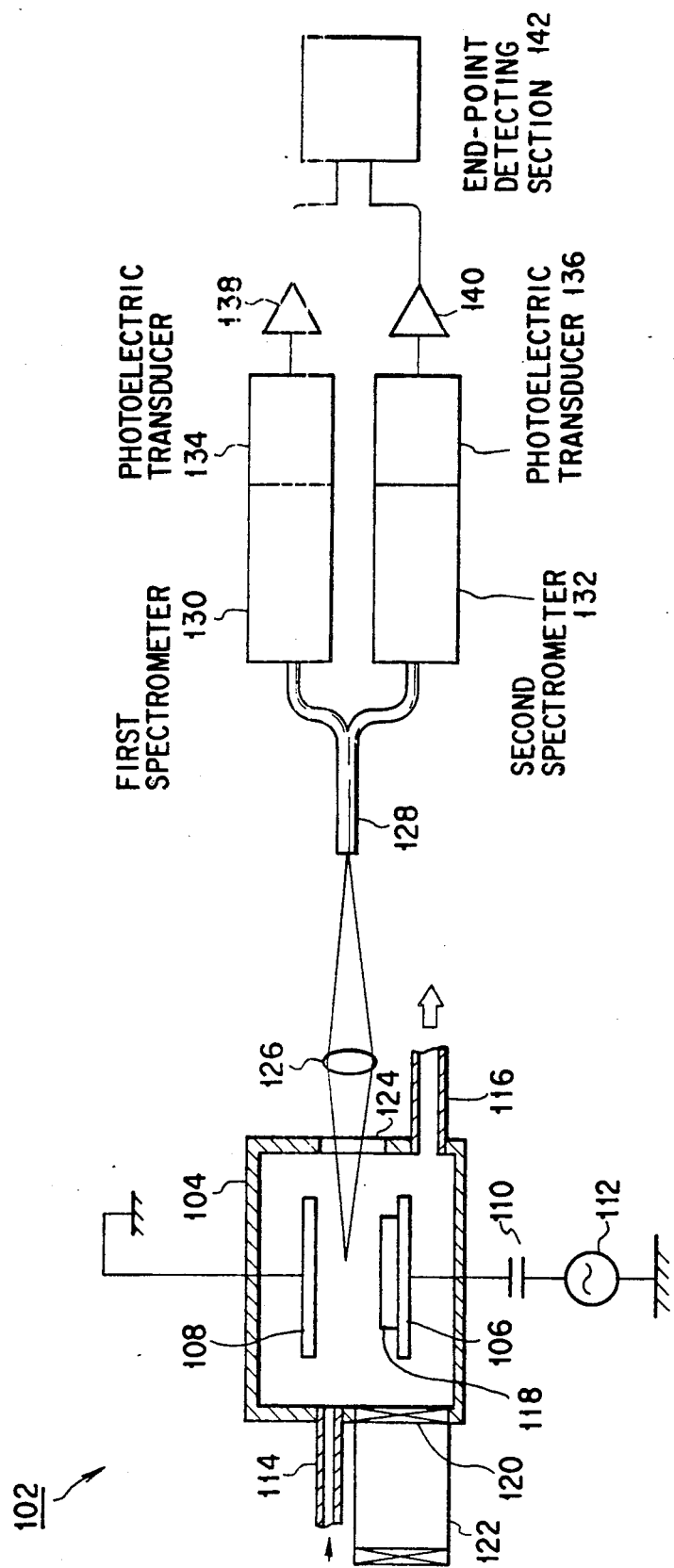
FIG. 8 is a diagram schematically showing a plasma-etching apparatus designed to perform a plasma-process method according to a second embodiment of the invention, and also schematically showing a system for detecting the end point of the plasma etching conducted in the second embodiment.

As is shown in FIG. 8, the plasma etching apparatus 102 comprises a vacuum chamber 104. The chamber 104, which function as reaction chamber, is made of, for example, aluminum. Two plate-shaped electrodes 106 and 108 are located in the vacuum chamber 104; the electrode 106 is positioned below, and parallel to, the electrode 108. The upper electrode 108 is connected to the ground, whereas the lower electrode 106 is connected to a high-frequency power supply 112 by a capacitor 110. The power supply 112 and the capacitor 110 are located outside the vacuum chamber 104.

According to the invention, the electrodes 106 and 108 can be integral parts of the vacuum chamber 104, the former defining the top thereof, and the latter defining the bottom thereof. For the sake of clarity, the electrodes 106 and 108 are greatly spaced from each other. In fact, however, the distance between them is only 5 mm, more or less. A semiconductor substrate 118, which is to be plasma-etched, is placed on the lower electrode 106, and is clamped thereto by means of a clamper (not shown).

A gas-inlet pipe 114 and a gas-outlet pipe 116 are connected to the vacuum chamber 104. The pipe 114 is used to introduce CF-based gas (a reactant gas) and argon gas (additional gas) into the space between the parallel plate-shaped electrodes 106 and 108. The pipe 116 is connected to a vacuum pump (not shown), for exhausting gases out of the vacuum chamber 104.

A load-lock chamber 122 is connected to the vacuum chamber 104, partitioned therefrom by means of a gate vane 120. The semiconductor substrate 118 can be transported from the chamber 118 into the load-lock chamber 122, and vice versa, without opening the vacuum chamber 104 to the atmosphere.

A window 124 made of, for example, quartz, is formed in the side wall of the chamber 104 for allowing the light emitted from plasma generated between electrodes 10 and 108 to travel outwards from the chamber 104.

Outside the vacuum chamber 104, a focusing lens 126 and an optical fiber 128 are arranged. Also located outside the chamber 104 are: two spectrometers 130 and 132, two photoelectric transducers 134 and 136, two amplifiers 138 and 140, and an end-point detecting section 142. The focusing lens 126 collects the light passing through the window 124. The optical fiber 128 is located, with its input end opposing the lens 126. The fiber 128 branches into two light-outputting parts, which are connected to the spectrometers 130 and 132, respectively. Thus, the light collected by the lens 136 is applied through the optical fiber 128 to both spectrometers 130 and 132. Each spectrometer splits the light, forming an emission spectrum, and outputs a light beam having a selected wavelength. The photo-electric transducers 134 and 136 convert the light beams output by the spectrometers 130 and 132 into two electric signals. The amplifiers 138 and 140 amplify these electric signals, respectively. The amplified signals are input to the end-point detecting section 142. The section 142 finds the ratio of the luminous intensity represented by the first signal to the luminous intensity represented by the second signal, and detects the end point of the plasma etching the moment that ratio exceeds a predetermined value.

The plasma etching apparatus and the etching endpoint detecting system, both shown in FIG. 8, were actually used, carrying out the plasma-process method according to the second embodiment, in order to detect the end point of the plasma etching undergoing in the vacuum chamber 104.

More specifically, the silicon substrate 118, already transported into the load-lock chamber 122, was moved into the vacuum chamber 104 through the gate vane 120 by means of an arm (not shown), and then was mounted on the lower electrode 106. The substrate 118 had a silicon dioxide film formed on its upper surface. Formed on the silicon dioxide film was a mask which had been patterned specifically by means of an exposure process.

Now that the semiconductor substrate 118 was thus positioned within the vacuum chamber 104, the chamber 104 was evacuated though the gas-outlet pipe 116, thereby reducing the pressure inside the chamber 104 to a predetermined value. Thereafter, CF-based gases (i.e., etchant gases), such as $CH_3$ gas and $CF_4$, were introduced into the vacuum chamber 104 at the rate of 60 SCCM through the gas-inlet pipe 114. Also, argon gas, i.e., an additional gas, was introduced via the pipe 114 into the chamber 104 at the rate of 1000 SCCM, in order to stabilize the plasma which would be generated within the vacuum chamber 104. Then, the vacuum pump (not shown) was driven, evacuating the chamber 104 until the pressure within the chamber 104 decreased to approximately 1.2 Torr. Next, the high-frequency power supply 112 supplied a high-frequency power of 750 W and 13.56 MHz or 380 KHz, between the electrodes 106 and 108. As a result, plasma was generated in the vacuum chamber 104, whereby the silicon dioxide ($SiO_2$) film on the substrate 118 was etched. At this time, the temperature of the substrate 118 was 20° to 40° C.

The $CH_3$ gas and the $CF_4$ gas, both introduced into the chamber 104, were decomposed, generating various types of active species. These active species contributed to the etching of the silicon dioxide film. The $CF_2$ radical, for example, reacted with silicon dioxide in the way represented by the following formula, removing the silicon dioxide from the silicon substrate 118.

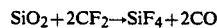

$$SiO_2 + 2CF_2 \rightarrow SiF_4 + 2CO$$

The argon gas (i.e., the plasma-stabilizing gas), the $CF_2$ gas (i.e., the etching gas), and the CO gas (i.e., the reaction product) emitted light beams, with specific emission spectra, respectively. These light beams passed through the window 124 and are collected by the focusing lens 126 and applied to the branched optical fiber 128 to the spectrometers 130 and 132.

The first spectrometer 130 extracted, from the input light, the beam emanating from the CF-based gas active species and having a predetermined wavelength. The light beam output by the spectrometer 130 is supplied to the first photoelectric transducer 134. The transducer 134 converts the input light beam into an electric signal representing the intensity of the light beam, i.e., the luminous intensity of the CF-based reactive species. The amplifier 138 amplified the signal. The signal output by the amplifier 138 was input to the end-point detecting section 142.

In the meantime, the second spectrometer 132 extracted, from the input light, the light beam emitted from the reaction product and having a predetermined wavelength. The light beam output by the spectrometer 132 is supplied to the second photoelectric transducer 136. The transducer 136 converts the input light beam into an electric signal representing the intensity of the light beam, i.e., the luminous intensity of the reaction product. The amplifier 140 amplified the signal output by the transducer 136. The signal output by the amplifier 140 was input to the end-point detecting section 142.

The end-point detecting section 142 monitored the ratio of the luminous intensity of the active species of the CF-based gas to that of the reaction product, and determined the end-point of the plasma etching, in accordance with the changes in said luminous intensity ratio.

In the second embodiment of the invention, the first spectrometer 130 detects the emission spectrum of the $CF_2$ radical which is an active species of the CF-based gases. The emission spectrum of the CO gas (i.e., the reaction product), which ranges from 300 to 800 nm, almost completely overlaps that of the argon gas, which ranges from about 300 to about 800 nm. In addition, the argon gas is introduced into the vacuum chamber 104 in a far greater amount than the CO gas is produced, and has higher luminous intensity than the CO gas. It would therefore be difficult to detect the luminous intensity of the CO gas. Nonetheless, from a microscopic point of view, a number of luminous peaks exist in the 300–800 nm spectrum. It follows that, to determine the luminous intensity of the CO gas for such a specific wavelength that lies between any two adjacent luminous peaks and is responsible for a relatively low luminous intensity of the argon intensity and a relatively high luminous intensity of the CO gas.

FIG. 9 is a graph showing part of the emission spectrum of argon, recorded when the resolution of the spectrometer 132 was enhanced. As is evident from FIG. 9, the luminous intensity of argon gas is extremely low for a wavelength somewhere between 480.8 nm and 484.6 nm at which there were two luminous peaks. This wavelength is nearly equal to 482.7 nm and 483.5 nm at which the CO gas emits light.

Therefore, in the plasma-process method according to the second embodiment, the second spectrometer 132 was one designed to extract a light beam having the wavelength of 483.7 nm. Based on the intensity of the 483.7 nm light beam output by the spectrometer 132, the luminous intensity of the reaction product, i.e., CO gas, was measured. The first spectrometer 130 was one designed to extract a light beam having the wavelength of 259.5 nm. This is because $CF_2$ gas, which was one of the reactive species, has its luminous peak at 259.5 nm. Based on the intensity of the 259.5 nm light beam output by the first spectrometer 130, the luminous intensity of the $CF_2$ gas was determined.

Figure 10:
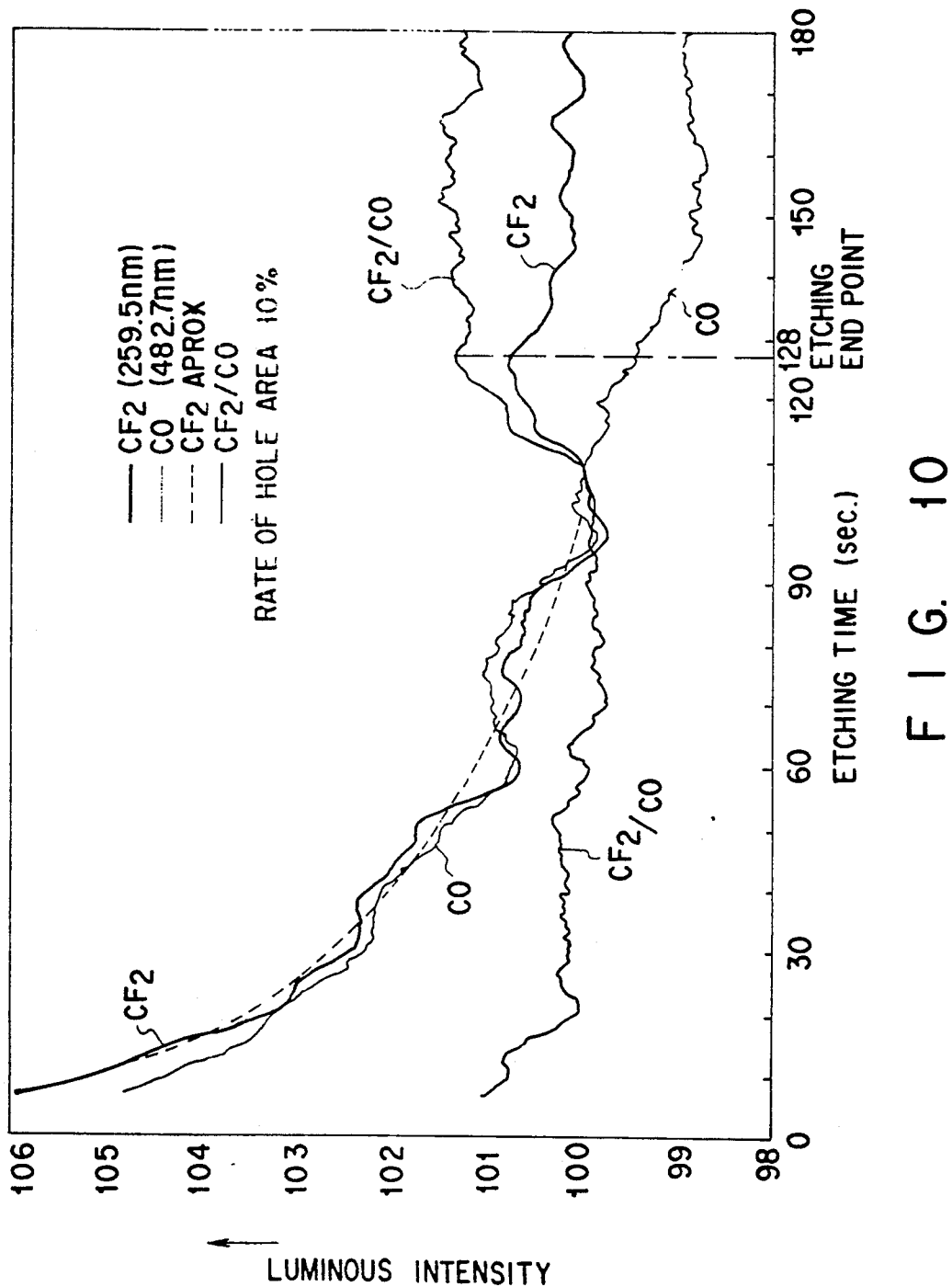
FIG. 10 is a graph showing how the luminous intensity of an active species and that of the reaction product changed as the plasma-process of the second embodiment proceeded, and also how the ratio of the luminous intensity of the active species to that of the reaction product changed with time.

FIG. 10 is a graph showing how the luminous intensities of the $CF_2$ gas and the argon gas changed as the plasma etching proceeded under the conditions specified above, and also illustrates how the ratio of the $CF_2$ luminous intensity of the $CF_2$ gas to the CO luminous intensity changed with time. In FIG. 10, the luminous-intensity ratio, $CF_2/CO$, is presented in terms of percentage (%). As can be understood from FIG. 10, both the luminous intensity of the $CF_2$ gas and that of CO gas gradually decreased, probably because the temperature of the substrate 118 rose as the plasma etching went on. The $CF_2$ luminous intensity increased noticeably at a time shortly after the point which appeared to be the end point of plasma etching. This increase was, however, nothing more than a natural fluctuation of the $CF_2$ luminous intensity. It was therefore difficult to detect the end point of the plasma etching with accuracy. On the other hand, the CO luminous intensity decreased more than before at a time shortly after the point which seemed to be the end point of plasma etching. Based on this decrease in the CO luminous intensity alone, it was difficult to detect the end point of plasma etching with accuracy.

By contrast, the ratio of the $CF_2$ luminous intensity to the CO luminous intensity, that is, $CF_2/CO$, fluctuated almost constantly through out the plasma etching, and abruptly increased at a specific point, by a value greater than the fluctuation. Upon lapse of some time thereafter, the ratio $CF_2/CO$ did not changed so noticeably.

SEM (Scanning Electron Microscope) analysis proved that the point which seemed to be the end point was the actual end point of plasma etching. In other words, the plasma etching completed upon lapse of about 128 seconds. Hence, the end point of plasma etching can be detected accurately, by monitoring the changes in the ratio of the $CF_2$ luminous intensity to the CO luminous intensity.

As described above, in the plasma-process method according to the second embodiment of the invention, the end point of plasma etching is detected from the changes in the ratio of luminous intensity of the active species to that of the reaction product. The fluctuation of the luminous intensity of the active species cancels out that of the luminous of the reaction product, and the ideal detection responsibility can be increased two times. The second embodiment of the invention can successfully detect the end point of the plasma etching conducted on a semiconductor substrate having a rate of hole area of 10% or less, which is impossible to accomplish with the conventional plasma-process method.

The term "overlapping of emission spectra" or the like term, has been used in the above description of the second embodiment of the invention. This term means not only that an emission spectrum completely overlaps another, but also that an emission spectrum overlaps a part (e.g., an end portion) of another emission spectrum.

Two units, each comprising a spectrometer and a photoelectric transducer, are used in the second embodiment of the invention. However, they can be replaced by two units, each comprising an interference filter and a photodiode.

The use of the second embodiment of the invention is not limited to the plasma etching of silicon dioxide film. Rather, the plasma-process method described above can be applied to the etching of polysilicon film and aluminum-alloy film. In addition, the method can be applied to plasma etching of a film formed on a polysilicon substrate or an oxide layer, rather than a single-crystal silicon substrate.

The second embodiment of the invention, described above, can be applied to an etching apparatus of cathode-coupling type wherein a semiconductor substrate is placed on the cathode. Alternatively, it can be applied to an etching apparatus of anode-coupling type wherein a semiconductor substrate is placed on the anode. Also can the second embodiment be applied to an etching apparatus in which reactive gas plasma is generated in a discharge chamber by using thermoelectrons, and the plasma thus generated is applied into the etching zone.

As has been explained, the plasma-process method according to the second embodiment of the invention is advantageous in two respects. First, since the fluctuation of the luminous intensity of the active species cancels out that of the luminous of the reaction product, the detection accuracy is improved so much that the end point of plasma etching can be detected reliably and correctly. Secondly, owing to its high detection accuracy, the second method can detect the end point of the plasma etching conducted on a semiconductor substrate having a rate of hole area of 10% or less, which is impossible to accomplish with the conventional plasma-process method.

A third embodiment of the invention, or a plasma-process method, will now be described, with reference to FIG. 11, FIGS. 12A to 12D, and FIGS. 13 to 15.

First, the basic concept of the third embodiment will be explained. As as been pointed out, as plasma etching goes on, the amount of any active species of plasma and that of the reaction product change at varying rate, and the luminous intensities of the active species and the reaction product also change in proportion to the changes in their amounts. Hence, a light beam of a specific wavelength is monitored by a spectrometer to determine the changes in the luminous intensity of the active species, and a light beam of a different specific wavelength is monitored by another spectrometer to find the changes in the luminous intensity of the active species and the reaction product. The slopes along which the luminous intensities, thus monitored, differ from each other, due to the contribution degree of the additional gas applied (e.g., argon gas) contributed to the plasma etching, the precisions of the spectrometers employed, and some other factors.

The present inventor makes calculations, thereby obtaining a transformation coefficient which equalizes the slopes of the luminous intensities. Then, they applied the transformation coefficient to the luminous intensity of the active species and that of the reaction product, both actually measured, thus modifying the luminous intensities. The inventors then calculated the ratio of the modified luminous intensity of the active species to the modified luminous intensity of the reaction product, for many sampling points throughout the plasma etching. Next, they analyzed the luminous intensity ratios calculated for the sampling points in order to determine how the ratio had changed.

Their analysis showed that the ratio remained at an almost constant value before the end of the plasma etching, suddenly changed at the end of the etching, and assumed another virtually constant value after the end of the etching. Hence, the end point of the plasma etching can be detected with high accuracy, by performing the following five steps. First, the luminous intensities of the active species and that of the reaction product are monitored for a predetermined period, thereby obtaining the slopes of these luminous intensities. Second, a transformation coefficient is calculated from the slopes of the luminous intensities. Third, the coefficient is applied to the actually measured luminous intensities the active species and reaction product, thereby modifying the luminous intensities. Fourth, the ratio of the modified luminous intensity of the active species to the modified luminous intensity of the reaction product, for a number of sampling points throughout the plasma etching. Finally, the luminous intensity ratios calculated for the sampling points is analyzed, thereby determining how the ratio changes as the plasma etching proceeds.

As has been pointed out, the luminous intensity ratio is constant after the end of the plasma etching. The over-etching time can be measured and, hence, controlled, by monitoring said constant luminous intensity ratio. In the case where the plasma etching is applied to form a two-layered wiring on a semiconductor substrate, the end point of etching for forming the first-layer wiring, and also that of etching for forming the second-layer wiring can be detected correctly. This is because the ratio of the luminous intensity of the active species to that of the reaction product greatly changes twice, first at the time the first-layer wiring is formed, and then at the time the second-layer wiring is formed.

A plasma etching apparatus 201 and an etching end-point detecting system, both designed to perform the plasma-process method according to the third embodiment of the invention, will be described first with reference to FIG. 11.

Figure 11:
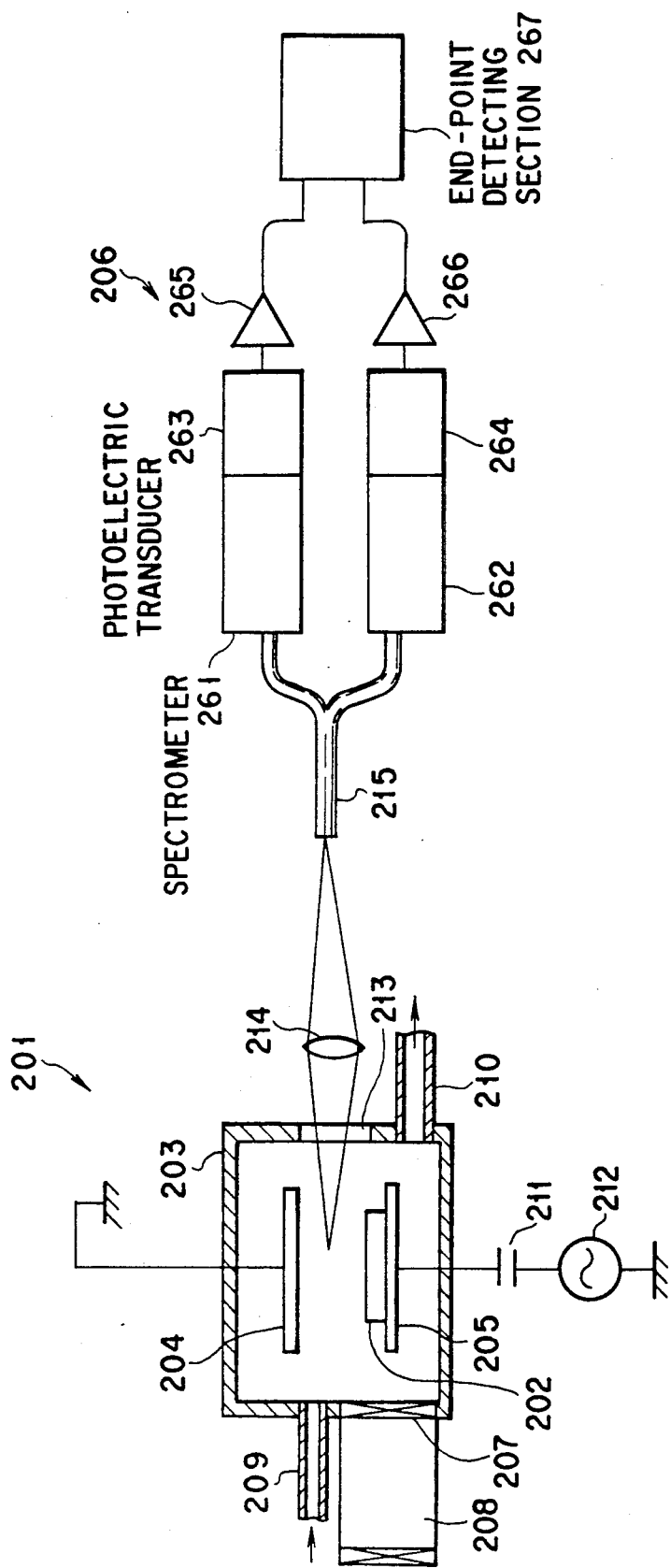
FIG. 11 is a diagram schematically showing a plasma-etching apparatus designed to perform a plasma-process method according to a third embodiment of the invention, and also schematically showing a system for detecting the end point of the plasma etching performed by the third embodiment.

As is evident from FIG. 11, the apparatus 201 comprises a vacuum chamber 203. The chamber 203 is a reaction chamber in which to plasma-etch a semiconductor substrate 202. Two electrodes 204 and 205 are located in the vacuum chamber 203. The apparatus 201 further comprises a control section 206 located outside the vacuum chamber 203, for monitoring the emission spectrum of the plasma generated within the vacuum chamber 203. In this instance, the substrate 202 is a silicon substrate which has a silicon dioxide film on its surface. It is this silicon dioxide film that will be subjected to selective plasma etching.

The vacuum chamber 203 is connected by a gate valve 207 to a load-lock chamber 208, as necessary. The load-lock chamber 208 is connected to a cassette chamber (not shown) which contains silicon wavers identical to the substrate 202. When the gate valve 207 is opened, the silicon waver 202 can be transported from the chamber 203 into the load-lock chamber 208, and vice versa, by means of a transport mechanism (not shown).

A gas-inlet pipe 209 and a gas-outlet pipe 210 are connected to the vacuum chamber 203. The pipe 209 is used to introduce CF-based gas (i.e., etchant gas), such as $CHF_3$ or $CF_4$, and an inert gas (i.e., additional gas), such as argon gas or helium gas, into the vacuum chamber 203. The pipe 210 is connected to a vacuum pump (not shown), for exhausting gases out of the vacuum chamber 203, thereby reducing the pressure in the chamber 203 to a predetermined value, for example about 200 mTorr.

The electrodes 204 and 205 are shaped like a plate. The electrode 204 is positioned above, and parallel to, the electrode 205. The upper electrode 204 is connected to the ground, whereas the lower electrode 205 is connected to a high-frequency power supply 212 by a capacitor 211. The power supply 212 and the capacitor 210 are located outside the vacuum chamber 203. The semiconductor substrate 202, to be plasma-etched, is placed on the lower electrode 205, and is clamped thereto by means of a clamper (not shown).

A window 213 made of, for example, quartz, is formed in the side wall of the chamber 203 for allowing the light emitted from plasma generated between the electrodes 204 and 205 to travel outwards from the vacuum chamber 203.

Outside the vacuum chamber 203, a focusing lens 214 and an optical fiber 215 are arranged. The focusing lens 214 collects the light passing through the window 213. The optical fiber 215 is located, with its input end opposing the lens 214. The fiber 215 branches into two light-outputting parts, which are connected to the control section 206. The window 213 made of quartz, not glass, the focusing lens 214, and the optical fiber 215 co-operate to supply light beams having short wavelengths of at least about 200 nm.

The control section 206 comprises two spectrometers 261 and 262, two photoelectric transducers 263 and 264 connected to the spectrometers 261 and 262, respectively, two amplifiers 265 and 266 connected to the transducers 263 and 264, respectively, and an end-point detecting section 267 connected to the outputs of the amplifiers 265 and 266.

The first spectrometer 261 and the first photo-electric transducer 263 serve to monitor a light beam emitted from the $CF_1$ or $CF_2$ radial present in the plasma generated in the chamber 203. If the light beam emitted from the $CF_2$ radical is monitored, then the beam is one having a wavelength ranging from 240 to 350 nm, for example 255.06 nm, 259.5 nm, 262.8 nm, or 272.2 nm. This is because the argon gas (i.e., the additional gas) emits but a very little amount of light, particularly in the wavelength range of 240 to 350 nm. Contained in the etching gas, the $CF_2$ radial emits light far intense than the light emanating from the reaction product. Thus, any light beam whose wavelength falls within this range of 240 to 350 nm can be extracted by means of a relatively inexpensive, low-resolution interference filter. In particular, if an interference filter whose center wavelength ranges from 260 nm to 270 nm and whose half-amplitude ranges from 10 nm to 20 nm, the light output by this filter be converted into an electric signal by means of a silicon photodiode which is also an inexpensive element.

The second spectrometer 262 and the second photoelectric transducer 264 serve to monitor a light beam emitted from carbon dioxide gas, i.e., the reaction gas. This light beam can be one having a wavelength of 482.7 nm, as in the conventional plasma-process method. In the present embodiment of the invention, however, the spectrometer 262 and the transducer 264 monitors a light beam whose wavelength falls within the range of 210 nm to 236 nm, preferably 291.0 nm, 230.0 nm, 211.2 nm, 232.5 nm, or any wavelength from 224 nm to 229 nm. This is because the emission spectrum of carbon dioxide (CO) gas, which ranges from 210 nm to 236 nm, overlaps but only a part of the emission spectrums of argon gas and $CF_1$ radical (i.e., an etchant), and does not overlap the emission spectrum of $CF_2$ radical (i.e., another etchant). Therefore, changes in the luminance intensity of the CO gas (i.e., the reaction product) can be accurately detected even if the silicon dioxide film formed on the substrate 202 has a low rate of hole area and if the CO gas is generated in a small amount.

The plasma generated in the vacuum chamber 203 during the plasma etching has the same emission spectrum as that one shown in FIGS. 5A and 5B, over the range of 200 nm to 400 nm. As is evident from FIGS. 5A and 5B, the luminous intensity of the argon gas is superposed on the luminous peaks of $CF_2$ radical. FIGS. 5A and 5B also teach that $CF_1$ radical and CO gas emit light at wave-lengths ranging from 200 nm to 240 nm.

It is desirable that both spectrometers 261 and 262 be sensitive to light beams having wavelengths of 300 nm or less.

The end-point detecting section 267 comprises an A/D converter and a CPU, processes the signal. It monitors the luminous intensity of the plasma and detecting changes in the luminous intensity and perform various operations (later explained), in order to determine the end point of the plasma etching being carried out within the vacuum chamber 203.

It will now be explained how the plasma etching apparatus and the etching end-point detecting system, both shown in FIG. 11, performs the plasma-process method according to the third embodiment of the invention, in order to detect the end point of the plasma etching undergoing in the vacuum chamber 203.

First, the silicon substrate 202, already transported into the load-lock chamber, is moved into the vacuum chamber 203 by the transport mechanism (not shown) and is then mounted on the lower electrode 205. As has been described a silicon dioxide film is formed on the substrate 202. Further, a mask having a specific pattern has been formed on the silicon dioxide film by means of exposure process.

Next, the valve 207 is closed, and the chamber 203 was was evacuated though the gas-outlet pipe 210, thereby reducing the pressure inside the chamber 203 to a predetermined value. Thereafter, CF-based gases (i.e., etchant gases), such as $CH_3$ gas and $CF_4$, are introduced into the vacuum chamber 203 via the gas-inlet pipe 209. Also, an inert gas such as argon gas is introduced via the pipe 209 into the chamber 203. The gas pressure within the chamber 203 is thereby maintained at a predetermined value. Next, the high-frequency power supply 212 supplies a high-frequency power of hundreds of watts and a predetermined frequency, for example 13.56 MHz, between the electrodes 204 and 205. As a result, plasma is generated in the vacuum chamber 203, whereby the silicon dioxide ($SiO_2$) film on the substrate 202 is etched.

In the vacuum chamber 203, the CF-based gases are decomposed, generating various types of active species. These active species contributed to the etching of the silicon dioxide film. The $CF_2$ radical, for example, reacted with silicon dioxide in the way represented by the following formula, removing the silicon dioxide from the silicon substrate 202.

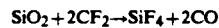

$$SiO_2 + 2CF_2 \rightarrow SiF_4 + 2CO$$

Various reaction products are formed, such as carbon monoxide (CO), $CO^+$ ions, hydrogen radical, and fluorine radical.

The carbon monoxide, the $CO^+$ ions, the argon gas used as plasma-stabilizing gas, and the CF-based gases used as etchants emit light, with the emission spectra which are specific to them. The light passes through the window 213 of the chamber 203 and are collected by the focusing lens 214. The beams output from the lens 214 are applied to the branched optical fiber 215, and hence to the control section 206.

In the control section 206, the spectrometers 261 and 262 extract two light beams of specific wavelengths. These light beams are applied to the photoelectric transducers 263 and 264, respectively. The spectrum detected by either spectrometer is a combination of the emission spectra of carbon monoxide, $CO^+$ ions, argon gas, and CF-based gases. The emission spectrum of carbon monoxide and that of $CO^+$ ions completely overlap the emission spectrum of argon gas which exists in a greater amount than any other thing in the vacuum chamber 203. Nevertheless, the carbon monoxide and the $CO^+$ ions also emit light at wavelengths ranging from 210 nm to 236 nm, more precisely light beams whose wave-lengths are 219.0 nm, 230.0 nm, 211.2 nm, 232.5 nm, and 224 to 229 nm. In contrast, the $CF_2$ gas, one of the active species, has luminous peaks at 255 nm and 259.5 nm, both falling outside the emission spectrum of argon gas. Hence, if the luminous intensity of the carbon monoxide or the $CO^+$ ions at 210 nm to 236 nm, and luminous intensity of the $CF_2$ gas at 255 nm or 259.5 nm are monitored, and changes in these luminous intensities are detected, it is possible to determine the end point of the plasma etching.

In the third embodiment of the invention, the first spectrometer 261 is designed to extract a light beam having wavelength of 255 nm, and the second spectrometer 262 is designed to extract a light beam having a wave-length ranging from 210 nm to 236 nm. The photoelectric transducers 263 and 264 convert the light beams output by the spectrometers 261 and 262 into two electric signals which represent the luminous intensities of the light beams.

The electric signals are input to the amplifiers 265 and 266, respectively. The amplifiers 265 and 266 amplify the input signals. The signals output by the amplifiers 265 and 266 are supplied to the end-point detector section 267.

The end-point detecting section 267 performs operations on the output signals of the amplifiers 265 and 266, thereby to detect the end point of the plasma etching proceeding in the vacuum chamber 203.

More specifically, the section 267 makes calculations, thereby equalizing the slopes of the luminous intensities represented by the output signals of the amplifiers 265 and 266, whereby a transformation coefficient is obtained. The section 267 applies this coefficient to the luminous intensities, thus finding the ratio of the luminous intensity output by the first amplifier 265 to the luminous intensity output by the amplifier 266, at every given sampling point during the plasma etching. The luminous intensity ratio, therefore, changes throughout the plasma etching. When the luminous intensity ratio changes by a specific amount, the section 267 determines that the plasma etching has just come to an end.

The calculations the section 267 performs to detect the end point of the plasma etching will be explained, in detail, with reference to FIGS. 12A to 12D.

Figure 12A:
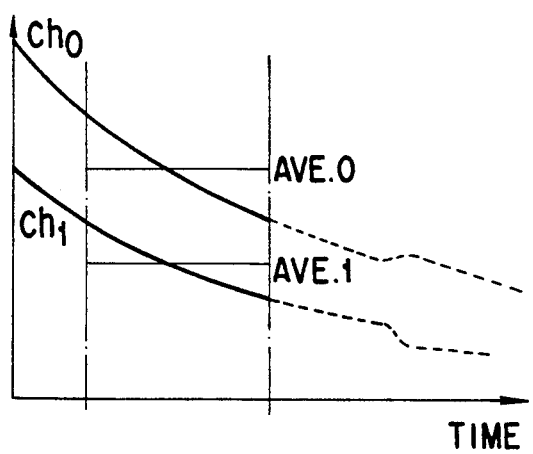
FIGS. 12A to 12C are graphs explaining the calculations performed in the end-point detecting system shown in FIG. 11.

As is shown in FIG. 12A, the luminous intensity $Ch_0$ of a reactive species, detected by the first spectrometer 261, and the luminous intensity $Ch_1$ of a reaction product, detected by the second spectrometer 262, gradually changes as the plasma etching advances.

The operation of the end-point detecting section 267 will be explained, with reference to the graphs of FIGS. 12A, 12B and 12C, and also the flow chart of FIG. 12C. First, a specific section of the plasma etching period is selected in Step S1. Then, in Step S2, the end-point detecting section 267 calculates an average $Ave_0$ of the intensity $Ch_0$, for the selected section of the plasma etching period. In Step S3, the section 267 finds an average $Ave_1$ of the intensity $Ch_1$, for selected section. In Step S4, the section 267 subtracts the average $Ave_0$ from each of N values for $Ch_{0m}$ measured at n sampling points during the selected section of the plasma etching period, thereby obtaining N differences, and the section 267 find an average $A_0$ of these differences is calculated. Namely:

$$A0 = \Sigma |Ch_0 - Ave_0| / N$$

Similarly, in Step S5, the end-point detecting section 267 subtracts the average $Ave_1$ from each of N values for $Ch_1$, measured at N sampling points during the selected section of the plasma etching period, thereby obtaining N differences, and an average $A_1$ of these differences is calculated. Namely:

$$A1 = \Sigma |Ch_1 - Ave_1| / N$$

Thereafter, in Step S6, the section 267 calculates the ratio R of $A_0$ to $A_1$. Namely:

$$R = A_0 / A_1$$

Figure 12B:
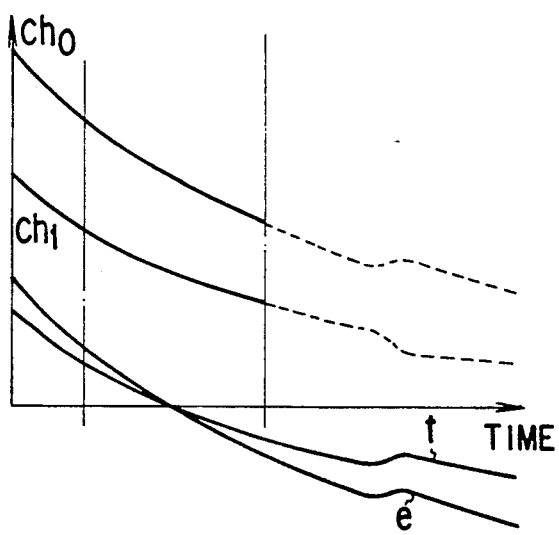

Then, in Step S7, the section 267 subtracts the average $Ave_0$ from the output $Ch_0$ of the first photo-electric transducer 263, thus obtaining value $Ch'_0$ which is represented by the curve e shown in FIG. 12B. That is:

$$Ch'_0 = Ch_0 - Ave_0$$

In Step S8, the section 267 divides $Ch'_0$ by the ratio R, thereby modifying $Ch0$ to $Ch''0$ which is represented by the curve f shown in FIG. 12B. Namely:

$$Ch''_0 = Ch'_0 / R$$

As is evident from FIG. 12B, the slope of the curve e is made identical to that of the curve which represents $Ch_1$.

In Step S9, the end-point detecting section 267 adds the average $Ave_1$ of $Ch_1$ to $Ch''_0$ obtained in Step S8, thereby obtaining value $Ch'''_0$. Namely:

$$Ch'''_0 = Ch'_0 + Ave_1$$

Figure 12C:
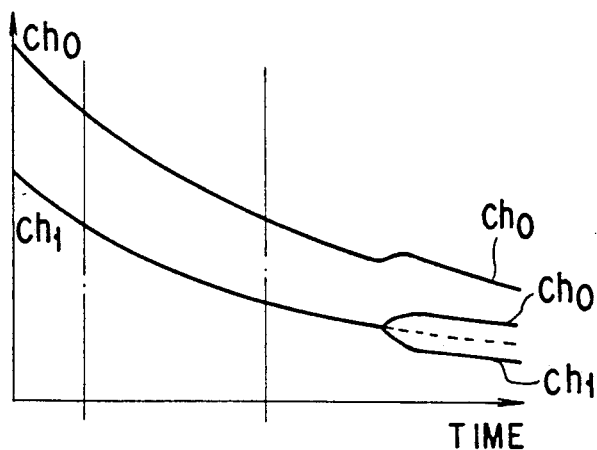

As a result, the slope of the curve showing $Ch_0$ is made equal to that of the curve representing $Ch_1$, as is shown in FIG. 12C.

In Step S10, the section 267 calculates the ratio r of $Ch'''_0$ to $Ch_1$. Then, in Step S11, it determines whether or not the ratio r has changed from the value represented by the broken line (FIG. 12C), by a value greater than a predetermined threshold value. If NO, the section 267 repeats Step S7. If YES, the section 267 determines in Step S12 that the plasma etching in the vacuum chamber 203 has just come to an end.

In the instance described above, the output $Ch0$ of the first transducer 263 is converted by a coefficient. Needless to say, the output $Ch_1$ of the second transducer 264 can be so converted, instead. Further, the end-point detecting section 267 can detects the end-point of plasma etching in any other method. For example, it can find curves similar to the curves showing the changes in the outputs of the photoelectric transducers 263 and 264, and then equalize the slopes of the similar curves, thereby to obtain the ratio r.

When the end-point detecting section 267 detects the end point of the plasma etching, it outputs a detection signal. In accordance with the detecting signal, the plasma etching is stopped, either manually or automatically. If the semiconductor substrate 202 needs to be over-etched, the plasma etching is stopped upon lapse of a desirable over-etching time from the time the section 267 generates the detection signal.

The plasma etching apparatus and the etching end-point detecting system, both shown in FIG. 11, were actually used, effecting the plasma-process method according to the third embodiment, in order to detect the end point of the plasma etching undergoing in the vacuum chamber 203.

EXAMPLE 1

Silicon wafers, each having a silicon dioxide film, were subjected to plasma etching, some having a rate of hole area of 10%, and the others having a rate of hole area of 2.5%. The silicon dioxide film formed on each wafer had a thickness of 10,000 angstroms. Each of the silicon wafers was plasma-processed in the following way, while maintained at $-15°$ C.

First, the silicon wafer was placed on the lower electrode 205. Then, $CHF_2$ gas and $CF_4$ gas, both used as etching gases, were introduced into the vacuum chamber 203 at the rate of 60 SCCM. Simultaneously, argon gas was supplied into the chamber 203 at the rate of 800 SCCM. The chamber 203 was evacuated to 750 mTorr (mt). Thereafter, the high-frequency (RF) power supply 211 supplied a high-frequency power of 750 W and 13.56 MHz, between the electrodes 204 and 205, thus initiating selective plasma-etching of the silicon dioxide film formed on the wafer.

The control section 206 monitored the luminous intensities at the wavelengths of 255 nm and and 219 nm, thereby detecting how the intensities of these light beams changed as the plasma etching advanced. The end-point detecting section 267 found the averages of these intensities, each for the period between the 60th second point and 100th second point of the plasma etching. The section 267 calculated the ratio R of the average of the intensity of the 255 nm light beam to that of the 219 nm light beam, and performed Steps S6 to S10 (FIG. 12D), thus obtaining the ratio r. The results were as is shown in FIG. 13, in which the curves a, b, and c represent the luminous intensity at 255 nm, the luminous intensity at 219 nm, and the ratio r of these luminous intensities modified.

Figure 13:
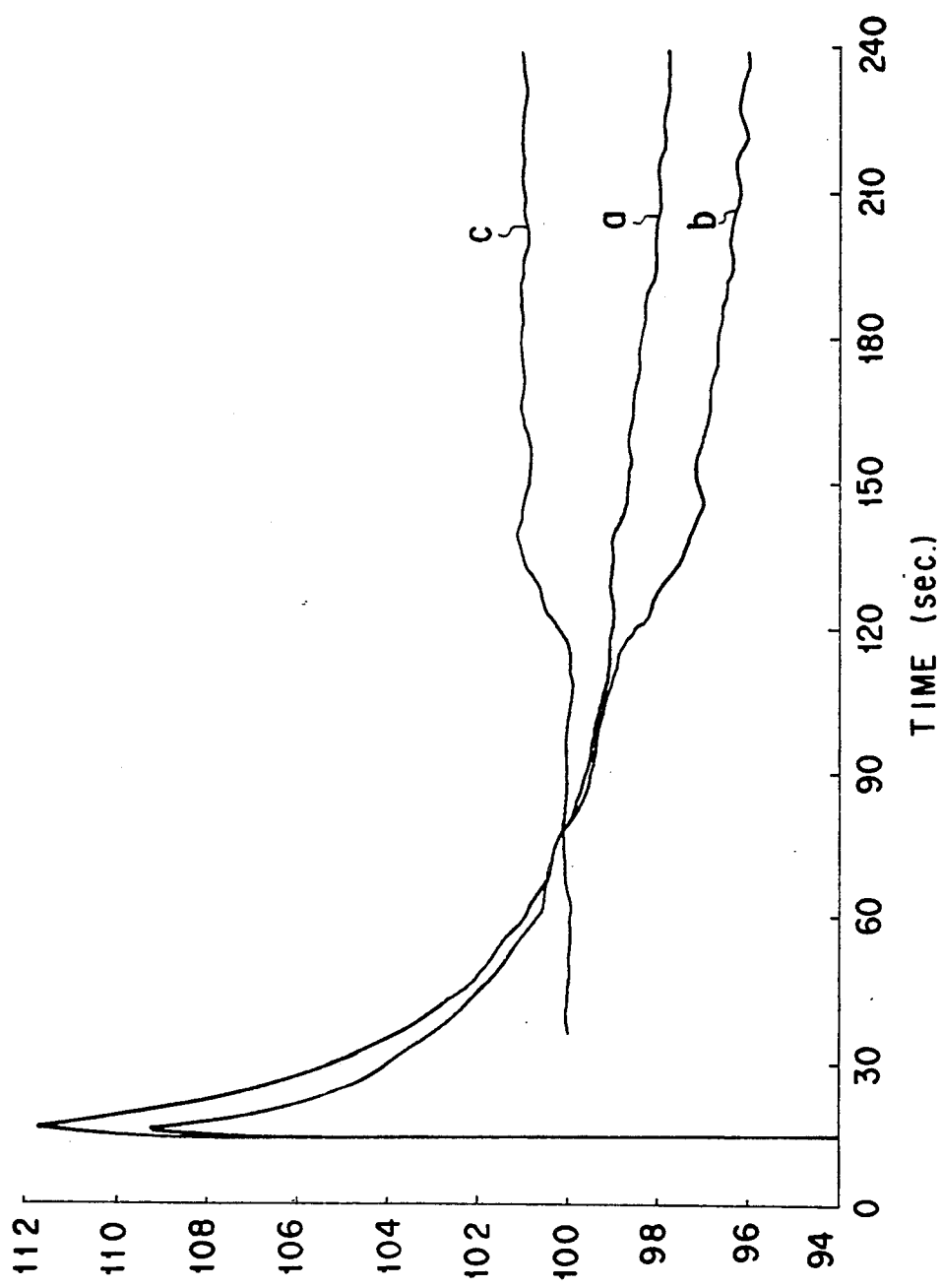
FIG. 13 is a graph explaining how the luminous intensity at 255 nm, the luminous intensity at 219 nm, and the ratio r between these luminous intensities modified did not change as an example of plasma etching went on in the apparatus shown in FIG. 11.

As is evident from FIG. 13, both luminous intensities, at 255 nm and 219 nm, gradually decreased from the start of plasma etching. As FIG. 13 shows, the luminous intensity at 219 nm abruptly decreased upon lapse of 120 seconds from the start of the plasma etching, whereas the luminous intensity at 255 nm decreased more gently than before 120 seconds elapsed. The intensities represented by the curves a and b fluctuated repeated throughout the plasma etching, and it was difficult to detect from them the end point of the plasma etching. By contrast, as the curve c shows, the ratio r of the modified luminous intensity at 255 nm to the luminous intensity at 219 nm remained almost constant until 120 seconds elapsed from the initiation of the plasma etching, suddenly increased at the 120th second point, and remained thereafter at the increased value. Thus, the curve c serves better to detect the end point of the plasma etching. (It should be noted that the ratio r and the intensities of the 255 nm and 219 nm light beams, all shown in FIG. 13, are of the values normalized, each being 100 at the 100th second point of the plasma etching.)

Figure 14:
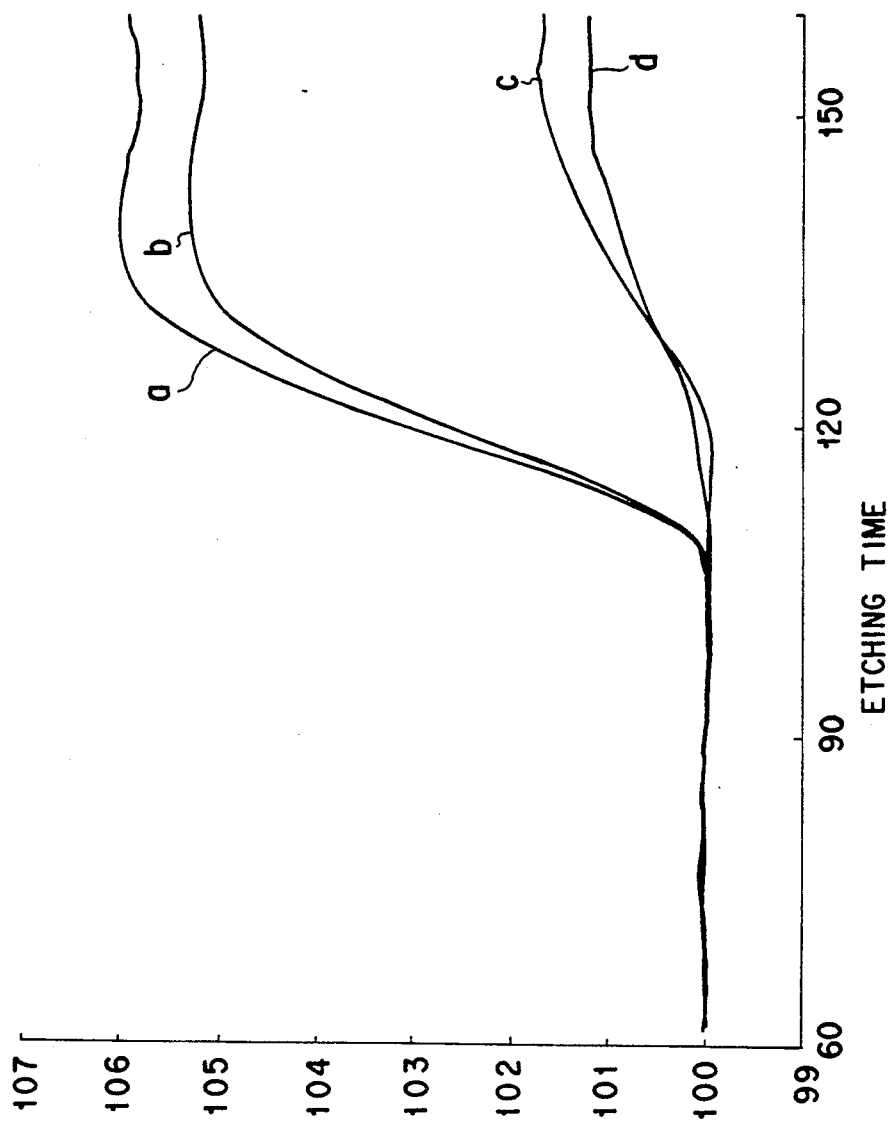
FIG. 14 is a graph showing how the ratio r changed as the plasma etching proceeded.

FIG. 14 is a graph showing how the ratio r changed as the plasma etching proceeded. (In FIG. 14, the value of 100 is given for the ratio r recorded during the period between the 60th second and 100th second points.) As can be understood from FIG. 14, the luminous intensity at 271 nm of $CF_2$ changed by 5.2% for the silicon wafers having the rate of hole area of 10% (see the curve b), and by 1.2% for the wafers having the rate of hole area of 2.5% (see the curve d). On the other hand, the luminous intensity at 255 nm of $CF_2$ changed by 5.9% for the wafers having the rate of hole area of 10% (see the curve a), and by 1.7% for the silicon wafers having the rate of hole area of 2.5% (see the curve c). These changes were so large that the end point of the plasma etching could be reliably detected from them. During the period between the 60th second and the 100th second, the ratio r fluctuated but by 0.13% or less only.

EXAMPLE 2

Silicon wafers, each having a silicon dioxide film, were subjected to plasma etching, each having a rate of hole area of 2.5%. The silicon dioxide film formed on each wafer had a thickness of 10,000 angstroms. Each of the silicon wafers was plasma-processed in the following way, while maintained at $-25°$ C.

First, the silicon wafer was placed on the lower electrode 205. Then, $CHF_3$ gas and $CF_4$ gas, both used as etching gases, were introduced into the chamber 203 at the rate of 60 SCCM. Simultaneously, argon gas was supplied into the chamber 203 at the rate of 800 SCCM. The chamber 203 was evacuated to 750 mTorr (mt). Next, the power supply 212 supplied a high-frequency (RF) power of 750 W and 13.56 MHz, between the electrodes 204 and 205, thus initiating selective plasma-etching of the silicon dioxide film formed on the wafer.

The control section 206 monitored the luminous intensities at wavelengths of 255 nm and 219 nm, thereby detecting how these luminous intensities changed as the plasma etching advanced. The end-point detecting section 267 found the averages of these intensities, each for the period between the 60th second point and 100th second point of the plasma etching. The section 267 calculated the ratio R of the average of the luminous intensity at 255 nm to the luminous intensity at 219 nm, and performed Steps S6 to S10 (FIG. 12D), thus obtaining the ratio r. The results were as is shown in FIG. 15, in which the curves a, b, and c represent the luminous intensity at 255 nm, the luminous intensity at 219 nm, and the ratio r of the former luminous intensity modified to the latter luminous intensity modified, respectively.

Figure 15:
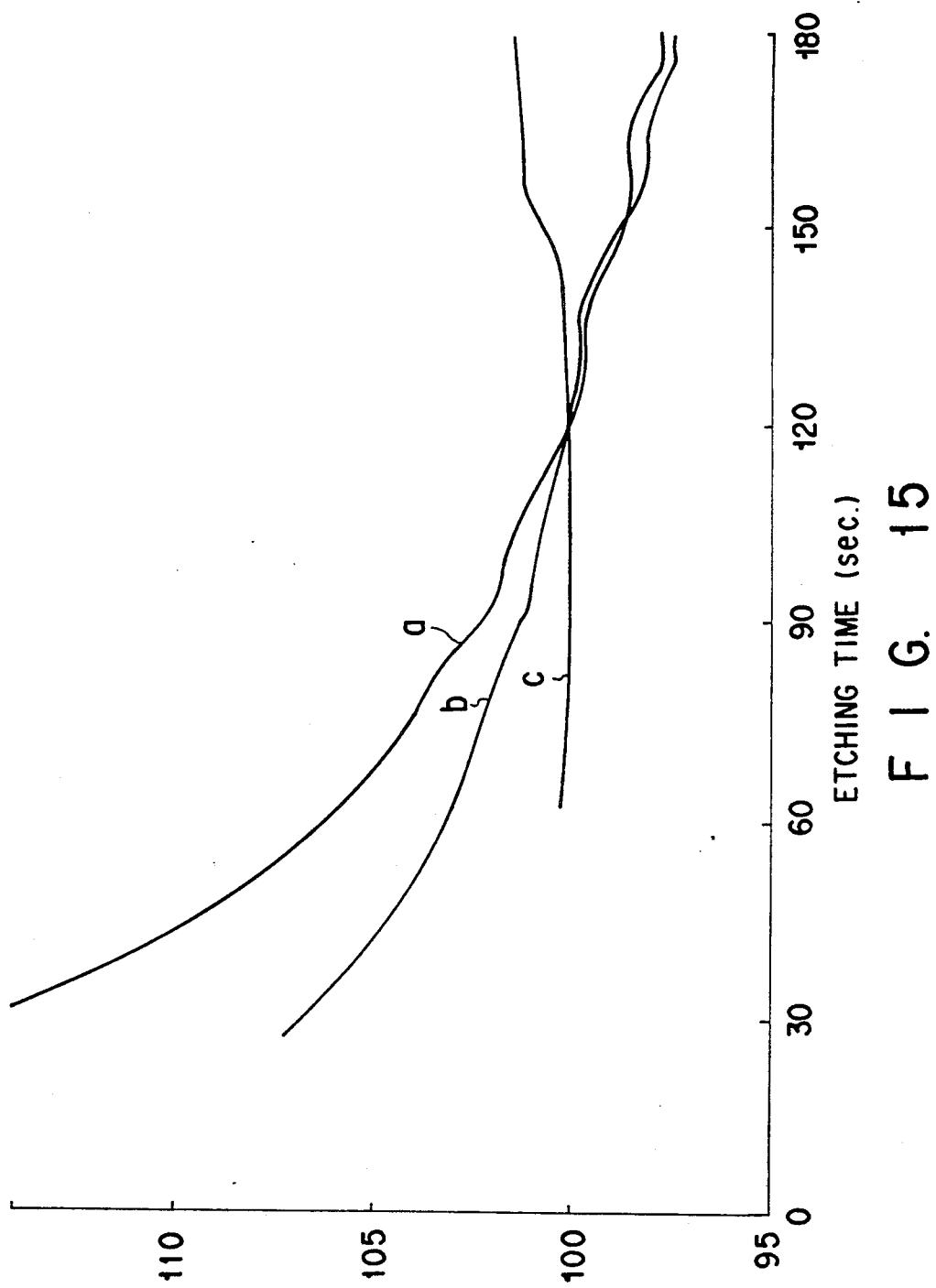
FIG. 15 is a graph explaining how the luminous intensity at 255 nm, the luminous intensity at 219 nm, and the ratio r between these intensities modified did change as another example of plasma etching advanced in in the apparatus shown in FIG. 11.

As is evident from the curve c shown in FIG. 15, the ratio r remained almost constant until 140 seconds elapsed from the initiation of the plasma etching, suddenly increased at the 140th second point, and remained at the increased value after the 150th second point. The ratio r and the luminous intensities at 255 nm and 219 nm, all shown in FIG. 15, are of the values normalized, each being 100 at the 120th second point of the plasma etching.

In the third embodiment of the invention, not a luminous intensity, but the ratio r of one modified luminous intensity to another modified luminous intensity is monitored is monitored, very reliably detecting the endpoint of plasma etching, as is clearly seen from Example 1 and Example 2. Further, since the ratio r remains almost constant even after the end of plasma etching, the over-etching time can be well controlled. To form a two-layered wiring on a semiconductor substrate, it is possible to correctly detect the end point of etching for forming the first-layer wiring, and also that of etching for forming the second-layer wiring.

The use of the third embodiment of the invention is not limited to the plasma etching of silicon dioxide film. Rather, the plasma-process method described above can be applied to the etching of polysilicon film and aluminum-alloy film. In addition, the method can be applied to plasma etching of a film formed on a polysilicon substrate or an oxide layer, rather than a single-crystal silicon substrate.

The third embodiment of the invention, described above, can be applied to an etching apparatus of cathode-coupling type wherein a semiconductor substrate is placed on the cathode. Alternatively, it can be applied to an etching apparatus of anode-coupling type wherein a semiconductor substrate is placed on the anode. Also can the third embodiment be applied to an etching apparatus in which reactive gas plasma is generated in a discharge chamber by using thermoelectrons, and the plasma thus generated is applied into the etching zone.

As has been explained, the plasma-process method according to the third embodiment of the invention is advantageous. Since the luminous intensity of an etching gas and that of a reaction product are monitored, and the ratio r of the modified luminous intensity to the gas to the modified luminous intensity of the product is applied to the detection of the end point of plasma etching performed on a semiconductor substrate, the end point of plasma etching can be detected very reliably, not affected by the fluctuations of both luminous intensities, even if the substrate has a small rate of hole area and, hence, the amount of the reaction product is small. Thus, over-etching of the substrate can be prevented. Further, since the ratio r remains almost constant even after the end of plasma etching, the over-etching time can be well controlled, as necessary.

A fourth embodiment of the invention, or a plasma-process method, will now be described, with reference to FIGS. 16 to 19, FIGS. 20A and 20B, and FIG. 21. In the fourth embodiment, the luminous intensity of a reaction gas is monitored, at a specific wavelength which falls outside the emission spectrum of the intense light emitted from an additional gas Obviously, the changes in this luminous intensity are not influenced by the emission spectrum of the additional gas. Therefore, the end point of the plasma etching can be accurately detected from the changes in the luminous intensity at the specific wavelength. Of a reaction product, at a wavelength which falls outside the emission spectrum of the intense light emitted from an additional gas.

A plasma etching apparatus 301 and an etching endpoint detecting system, both designed to perform the plasma-process method according to the third embodiment of the invention, will be described first with reference to FIG. 16.

Figure 16:
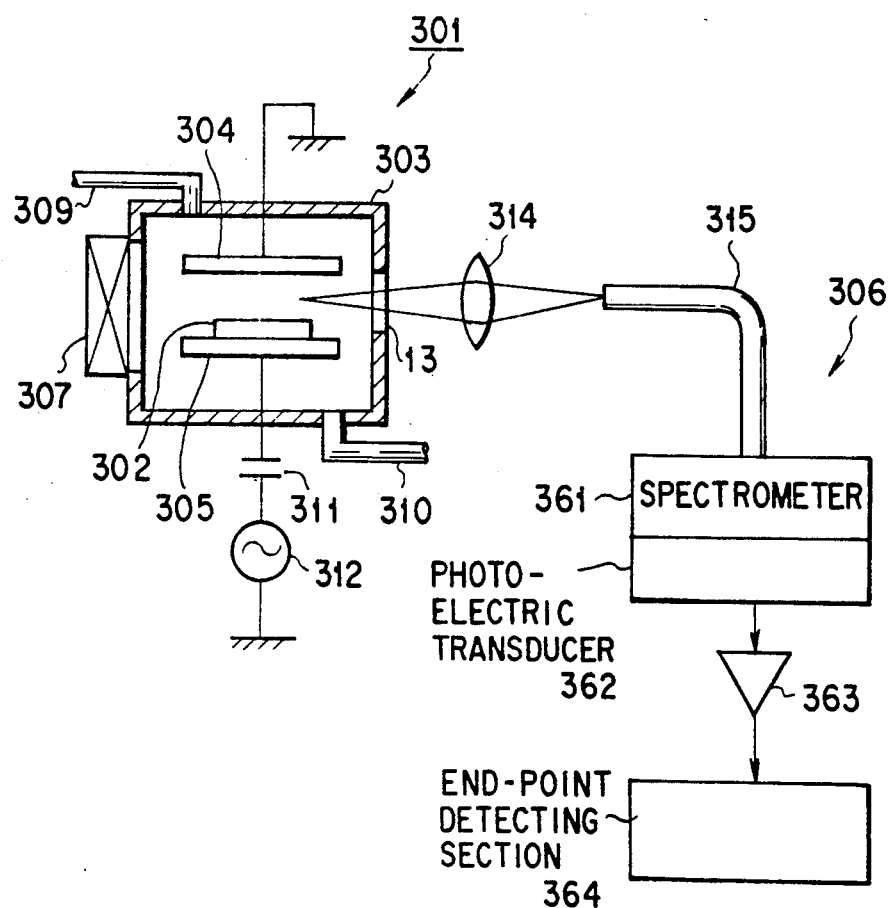
FIG. 16 schematically shows a plasma-etching apparatus designed to perform a plasma-process method according to a fourth embodiment of the invention, and also schematically showing a system for detecting the end point of the plasma etching performed by the fourth embodiment.

As is evident from FIG. 16, the apparatus 301 comprises a vacuum chamber 303. The chamber 303 is a reaction chamber in which to plasma-etch a semiconductor substrate 302. Two electrodes 304 and 305 are located in the vacuum chamber 303. The apparatus 301 further comprises a control section 306 located out side the vacuum chamber 303, for monitoring the emission spectrum of the plasma generated within the vacuum chamber 303. In this instance, the substrate 302 is a silicon substrate which has a silicon dioxide film on its surface. It is this silicon dioxide film that will be subjected to selective plasma etching.

The vacuum chamber 303 is connected by a gate valve 307 or by a load-lock chamber (not shown), as necessary, to a cassette chamber (not show, either). The cassette chamber contains a number of semiconductor substrates which are identical to the substrate 202. When the gate valve 307 is opened, the silicon waver 202 can be transported from the chamber 303 into the load-lock chamber, and vice versa, by means of a transport mechanism (not shown).

A gas-inlet pipe 309 and a gas-outlet pipe 310 are connected to the vacuum chamber 303. The pipe 309 is used to introduce CF-based gas (i.e., etchant gas), such as $CHF_3$ or $CF_4$, and an inert gas (i.e., additional gas), such as argon gas or helium gas, into the vacuum chamber 303. The pipe 310 is connected to a vacuum pump (not shown), for exhausting gases out of the vacuum chamber 303, thereby reducing the pressure in the chamber 303 to a predetermined value, for example about 200 mTorr.

The electrodes 304 and 305 are shaped like a plate. The electrode 304 is positioned above, and parallel to, the electrode 305. The upper electrode 304 is connected to the ground, whereas the lower electrode 305 is connected to a high-frequency power supply 312 by a capacitor 311. The power supply 312 and the capacitor 310 are located outside the vacuum chamber 304. The semiconductor substrate 302, to be plasma-etched, is placed on the lower electrode 305, and is clamped thereto by means of a clamper (not shown).

A window 313 made of, for example, quartz, is formed in the side wall of the chamber 303 for allowing the ultraviolet rays emitted from plasma generated between the electrodes 304 and 305 to travel outwards from the vacuum chamber 303.

Outside the vacuum chamber 303, a focusing lens 314 and an optical fiber 315 are arranged. The focusing lens 314, which is made of quartz, too, collects the ultraviolet rays passing through the window 313. The optical fiber 315, also made of quartz, has its input end opposing the focusing lens 314 and its output end connected to the control section 306. The window 313, the focusing lens 314, and the optical fiber 315 all made of quartz, co-operate to supply the control section 306 with light beams having wavelengths of 250 nm or less.

The control section 306 comprises a spectrometer 361, a photoelectric transducers 362 connected to the spectrometer 361, an amplifier 363 connected to the transducers 361, and an end-point detecting section 364 connected to the output of the amplifier 363.

The spectrometer 361 and the photoelectric transducer 362 serve to monitor a light beam emitted from the plasma generated in the chamber 303 and having a specific wavelength. More precisely, the spectrometer 361 selects, among the input light beams, a beam having a wavelength ranging from 210 nm to 236 nm, preferably a light beam whose wavelength is 219.0 nm, 230.0 nm, 211.2 nm, 232.5 nm, or any wavelength from 224 nm to 229 nm. The light beam selected by the spectrometer 361 is input to the photoelectric 362. The transducer 362 converts the input light beam into an electric signal, which is supplied to the amplifier 363. The amplifier 363 amplifies this signal. The output signal of the amplifier 363 is input to the end-point detecting section 364.

The end-point detecting section 364 comprises an A/D converter and a CPU, processes the signal. It monitors the luminous intensity of the plasma and detecting changes in the luminous intensity and perform various operations (later explained), in order to determine the end point of the plasma etching being carried out within the vacuum chamber 303.

It will now be explained how the plasma etching apparatus and the etching end-point detecting system, both shown in FIG. 16, performs the plasma-process method according to the fourth embodiment of the invention, in order to detect the end point of the plasma etching undergoing in the vacuum chamber 303.

First, the silicon substrate 302, already transported into the load-lock chamber 308, is moved into the vacuum chamber 303 by the transport mechanism (not shown) and is then mounted on the lower electrode 305. As has been described a silicon dioxide film is formed on the substrate 302. Further, a mask having a specific pattern has been formed on the silicon dioxide film by means of exposure process.

Next, the valve 307 is closed, and the chamber 303 was was evacuated though the gas-outlet pipe 310, thereby reducing the pressure inside the chamber 203 to a predetermined value. Thereafter, CF-based gases (i.e., etchant gases), such as $CH_3$ gas and $CF_4$, are introduced into the vacuum chamber 303 via the gas-inlet pipe 309. Also, an inert gas such as argon gas is introduced via the pipe 309 into the chamber 303. The gas pressure within the chamber 303 is thereby maintained at a predetermined value. Next, the high-frequency power supply 312 supplies a high-frequency power of hundreds of watts and a predetermined frequency, for example 13.56 MHz, between the electrodes 304 and 305. As a result, plasma is generated in the vacuum chamber 303 thereby etching the silicon dioxide ($SiO_2$) film on the substrate 302.

In the vacuum chamber 303, the CF-based gases are decomposed, generating various types of active species. These active species contributed to the etching of the silicon dioxide film. The $CF_2$ radical, for example, reacted with silicon dioxide in the way represented by the following formula, removing the silicon dioxide from the silicon substrate 302.

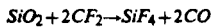

$$SiO_2 + 2CF_2 \rightarrow SiF_4 + 2CO$$

Various reaction products are formed, such as carbon monoxide (CO), $CO^+$ ions, hydrogen radical, and fluorine radical.

The carbon monoxide, the $CO^+$ ions, the argon gas used as plasma-stabilizing gas, and the CF-based gases used as etchants emit light, with the emission spectra which are specific to them. The light passes through the window 313 of the chamber 303 and are collected by the focusing lens 314. The beams output from the lens 314 are applied to the optical fiber 315, and hence to the control section 306.

In the control section 306, the spectrometer 361 extracts a light beam of a specific wave length. This light beam is applied to the photoelectric transducer 362. The spectrum detected by the spectrometer 361 is a combination of the emission spectra of carbon monoxide, $CO^+$ ions, argon gas, and CF-based gases. The emission spectrum of carbon monoxide and that of $CO^+$ ions completely overlap the emission spectrum of argon gas which exists in a greater amount than any other thing in the vacuum chamber 303. Nevertheless, the carbon monoxide and the $CO^+$ ions also emit light at wavelengths ranging from 210 nm to 236 nm, more precisely light beams whose wavelengths are 219.0 nm, 230.0 nm, 211.2 nm, 232.5 nm, and 224 to 229 nm. Hence, it is possible to detect changes in the amount of the reaction product, i.e., CO, which occur at the end of the plasma etching. Therefore, the end point of the plasma etching can be detected by monitoring the luminous intensity at the wavelength of 219.0 nm, 230.0 nm, 211.2 nm, 232.5 nm, or any wavelength ranging from 224 nm to 229 nm.

In the fourth embodiment of the invention, the spectrometer 361 is designed to extract a light beam which has a wavelength ranging from 210 nm to 236 nm. The photoelectric transducer 362 converts the light beam output by the spectrometer 261 into a electric signal representing the intensity of this light beam. This signal is input to the amplifier 363. The amplifier 363 amplifies the signal. The signal output by the amplifier 363 is supplied to the end-point detector section 364.

The amount of CO gas and the number of $CO^+$ ions remain substantially constant or gradually decrease along a specific curve as the plasma etching goes on in the vacuum chamber 303. At the end of the plasma etching, they abruptly decrease. The output signal of the transducer 363 reflects this abrupt decrease in the amount of CO gas and the number of $CO^+$ ions.

The end-point detecting section 364 performs operations on the output signal of the amplifier 363, which represents how the amount of the reaction gas, i.e., the CO gas, is changing, and obtain a curve similar to that curve along which the amount of CO gas changes, in the same way as is practiced in the third embodiment of the invention. When it is determined from the curve thus obtained, that the amount of CO gas greatly changes, then it is determined that the plasma etching has just completed. Alternatively, when the magnitude of the signal abruptly changes, by a value greater than a predetermined threshold, then it is determined that the etching has just come to an end.

When the end-point detecting section 364 detects the end point of the plasma etching, it outputs a detection signal. In accordance with the detecting signal, the plasma etching is stopped, either manually or automatically. If the semiconductor substrate 302 needs to be over-etched, the plasma etching is stopped upon lapse of a desirable over-etching time from the time the section 363 generates the detection signal.

The plasma etching apparatus and the etching end-point detecting system, both shown in FIG. 16, were actually used, effecting the plasma-process method according to the third embodiment, in order to detect the end point of the plasma etching undergoing in the vacuum chamber 303.

EXAMPLE 1

Silicon wafers each having a silicon dioxide film and a rate of hole area of 100% (hereinafter referred to as "covered wafers") were prepared. The silicon dioxide film had a thickness of 10,000 angstroms. Also, silicon wafers having no silicon dioxide film formed on them (hereinafter referred as "bear wafers" were prepared. Each of the covered wafers and bear wafers was plasma-processed in the following way, while maintained at $-15°$ C.

First, the wafer was placed on the lower electrode 305. Then, $CHF_3$ gas and $CF_4$ gas, both used as etching gases, were introduced into the vacuum chamber 303 at the same rate of 20 SCCM. Simultaneously, argon gas was supplied into the chamber 303 at the rate of 400 SCCM. The chamber 303 was evacuated to 250 mTorr (mt). Thereafter, the high-frequency power supply 312 supplied a high-frequency power (RF) of 600 W and 13.56 MHz, between the electrodes 304 and 305, thus initiating selective plasma-etching of the silicon dioxide film formed on the wafer.

Figure 17:
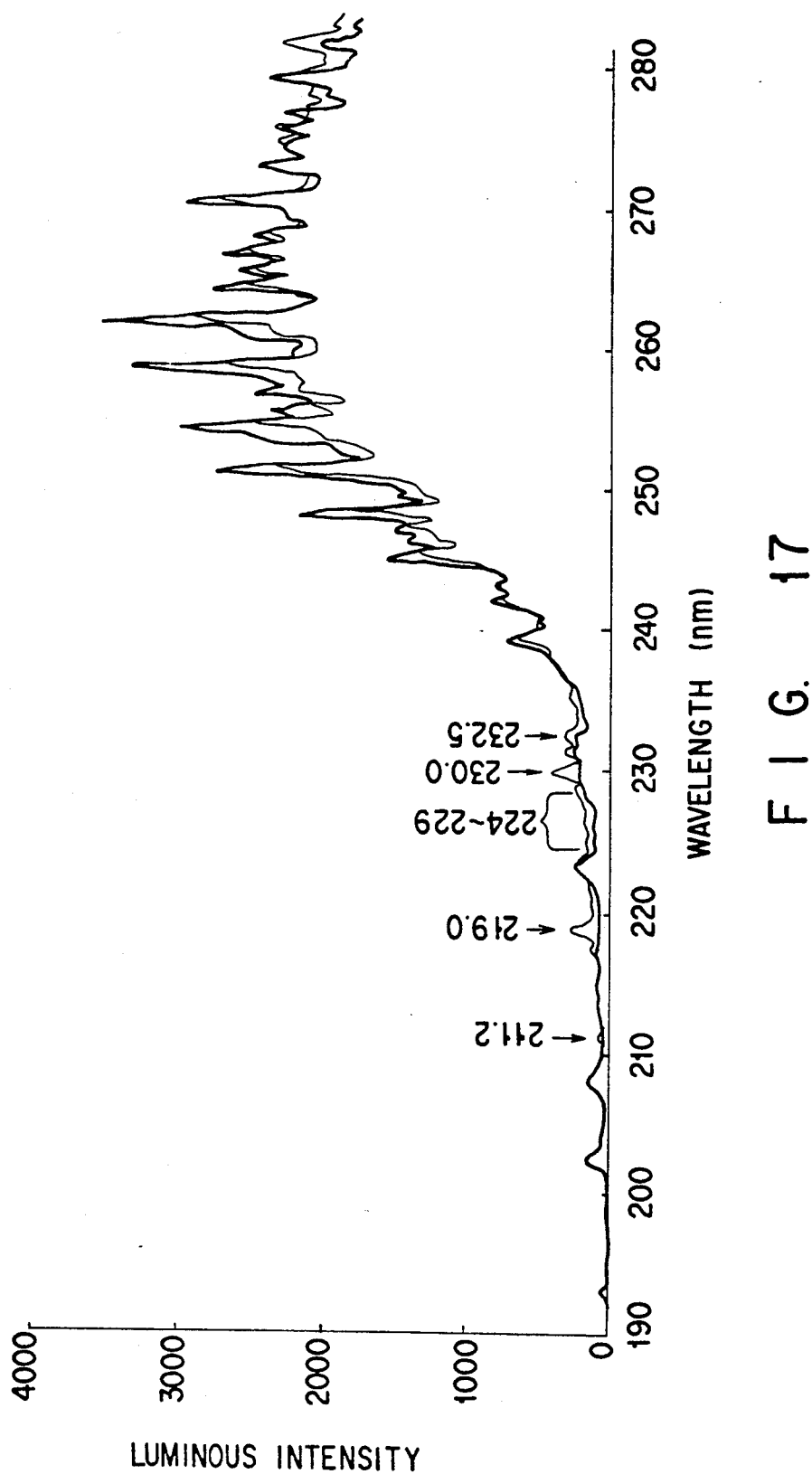
FIG. 17 shows the emission spectrum of the plasma generated in the apparatus shown in FIG. 16, which is recorded for the wavelength range of 210 nm to 236 nm.

FIG. 17 shows the emission spectrum of the covered wafer and that of the bear wafer. More specifically, the thick-line curve represents the emission spectrum of the bear wafer, and the thin-line curve indicates the emission spectrum of the covered wafer. During the plasma etching conducted on the bear wafers under the conditions specified above, neither CO nor $CO^+$ was formed. Hence, as is evident from FIG. 17, the spectra of the etching gases overlapped the spectrum performed on the covered wafers, the luminous intensity of the plasma changed noticeably, due to the CO or the $CO^+$ generated, particularly over a wavelength range from 210 nm to 236 nm. In particular, luminous peaks were found at 211.2 nm, 219.0 nm, 230.0 nm, and 232.5 nm, unlike in the plasma etching of the bear wafers. Also, prominent changes in the luminous intensity of the plasma were observed over the wavelength range of 224 nm to 229 nm. Hence, the changes in the amount of a reaction gas can be detected with accuracy, by sensing the luminous peaks or by monitoring the luminous intensity over the 224–229 nm range.

Figure 20A:
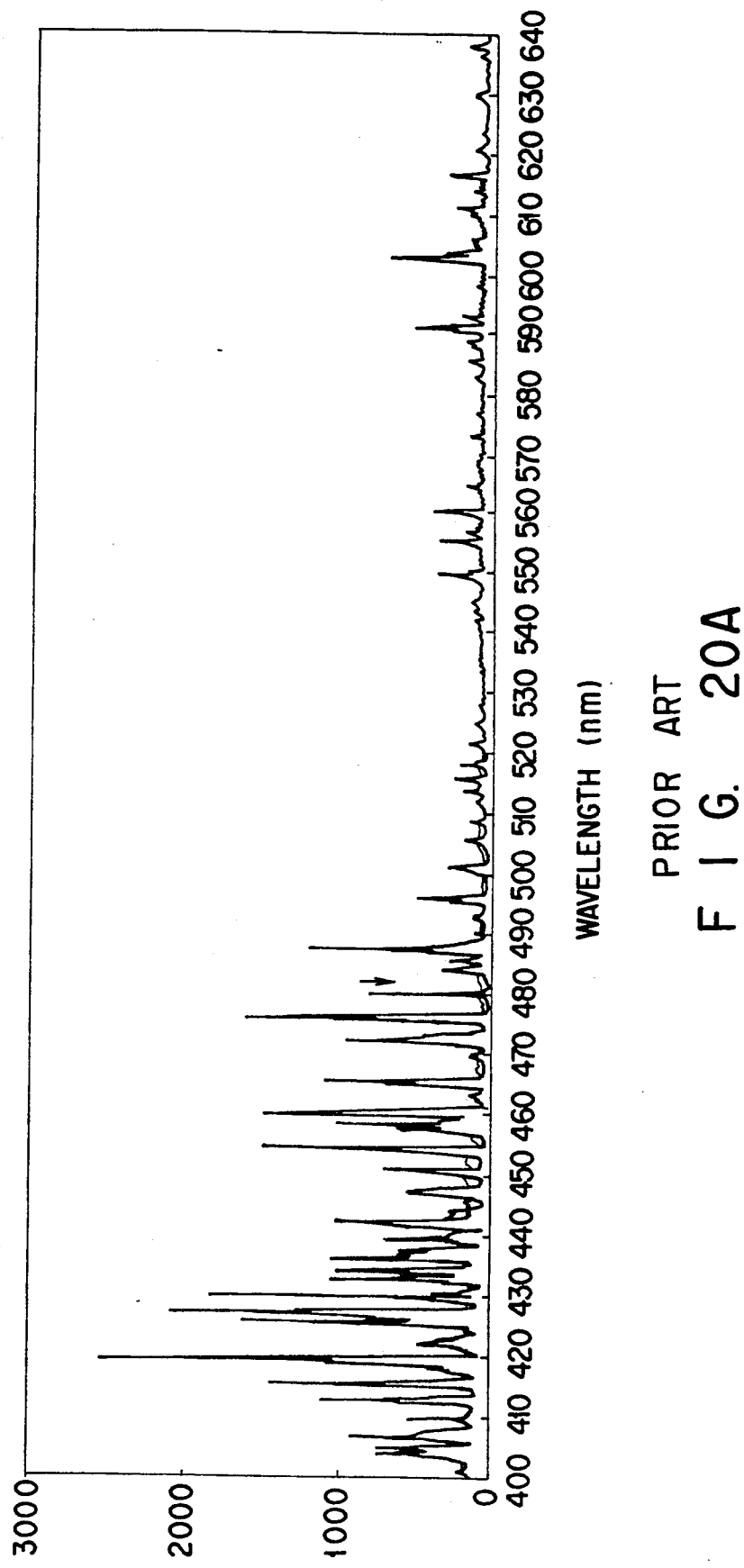
FIGS. 20A and 20B show an emission spectrum obtained when plasma etching was conducted by the conventional method in which the 482 nm luminous intensity is monitored to detect the end point of the plasma etching.
Figure 20B:
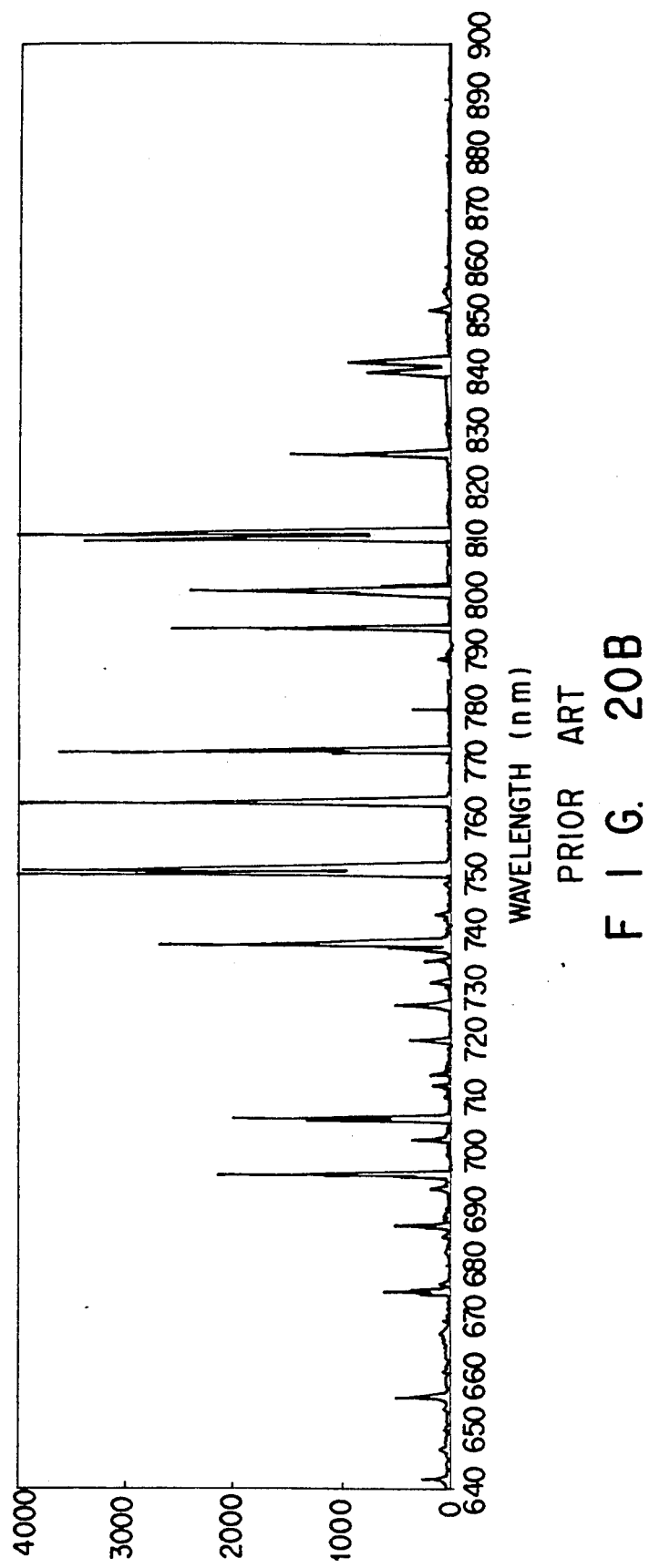

FIGS. 20A and 20B illustrates the emission spectrum over the wavelength range of 400 nm to 900 nm, which has been recorded during the plasma etching performed under the same conditions as the etching which resulted in the emission spectrum of FIG. 17. As the thick-line curve in FIGS. 20A and 20B shows clearly, the luminous intensity of the plasma increases at 400 nm to 600 nm, due to the CO produced, as the plasma etching of a covered wafer proceeds. As indicated by the arrow in FIG. 20A, the luminous intensity of argon is low at about 482 nm. The interval between the two luminous peaks of argon, observed at two wavelength littler shorter and longer than 482 nm, is longer than any other argon-peak intervals over the wavelength range of 400 nm to 500 nm. Further, these luminous peaks of argon are less prominent than most of the other peaks over the 400–500 nm range. Hence, it seems best to monitor a luminous intensity at about 382 nm for the purpose of detecting the end point of the plasma etching. However, the luminous intensity of the CO (i.e., a reaction product) at the wavelength of about 482 nm is about ten times as low as that of argon at the same wavelength. Moreover, the emission wave length of CO differs only about 1.5 nm from that of the argon.

Referring back to FIG. 17, the 223.8 nm luminous intensity of $CF_1$ is nearly equal to the 219 nm luminous intensity of the reaction product. In addition, the difference between the wavelengths at which these luminous intensities are observed is as much as 4.8 nm. Thus, even an inexpensive, low-resolution spectrometer can sense the light beam the CO emits. The use of such a spectrometer is advantageous in that the amount of light can increase in inverse proportion to the resolution, achieving safeguard to noise.

As may now be clear from comparison of the spectrum diagram of FIGS. 20A and 20B with that of FIG. 17 Example 1), it would be better to monitor the intensity of a 219 nm light beam, than to monitor the intensity of a 482 nm light beam, in order to detect the end point of the plasma etching.

EXAMPLE 2

Figure 18:
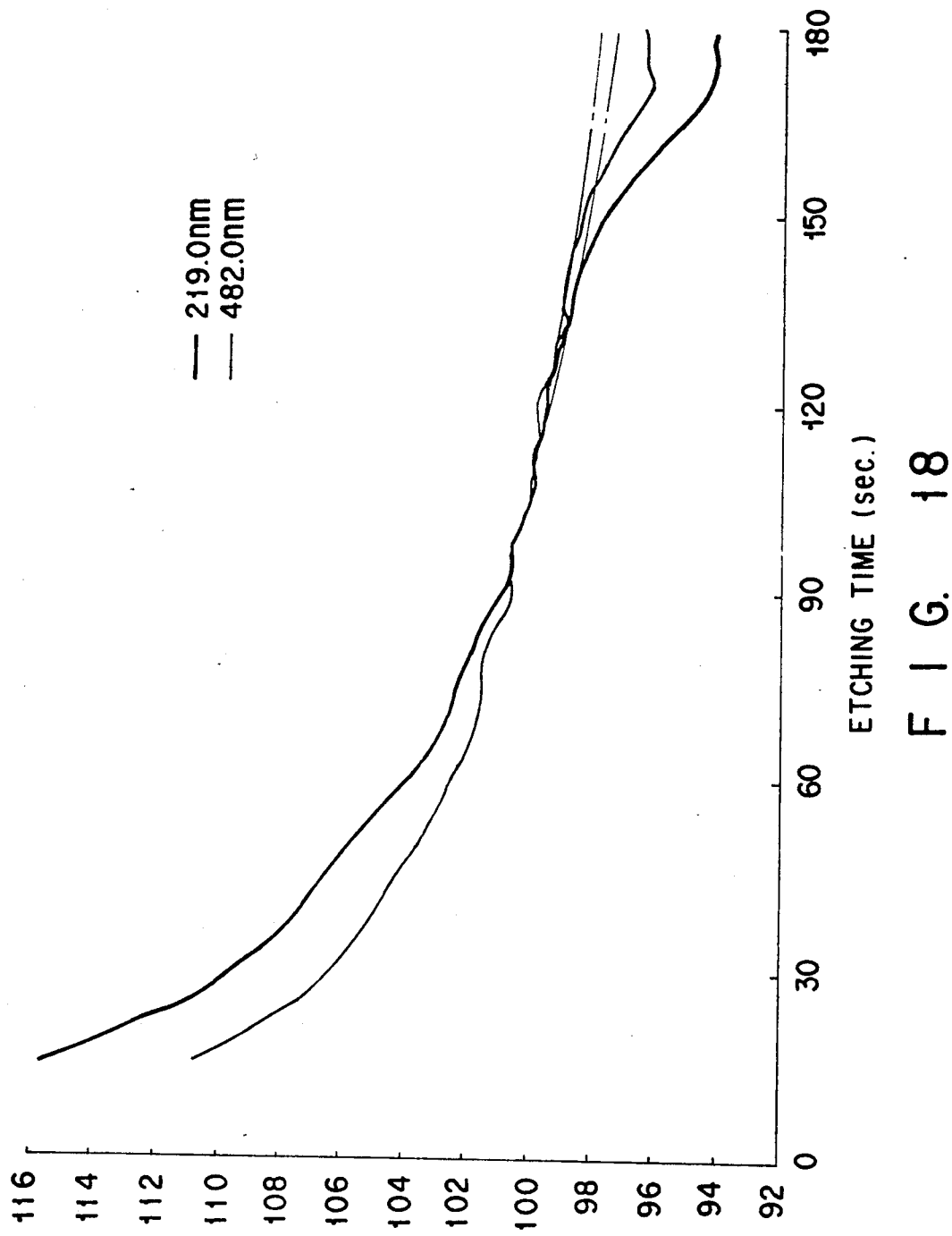
FIG. 18 is a graph showing how the 219.0 nm luminous intensity and the 482.0 nm luminous intensity changed as the plasma etching was performed on a waver having a rate of hole area of 10%, by means of the apparatus shown in FIG. 16.

A silicon wafer having a silicon dioxide film and having a rate of hole area of 10% was plasma-etched under the same conditions as in Example 1. Two spectrometers were used, monitoring the luminous intensities at 219.0 nm and 482.0 nm and, thereby, detecting how these luminous intensities changed as the plasma etching proceeded. The results were as is illustrated in FIG. 18, in which the thick-line curve indicates the 219.0 nm luminous intensity, and the thin-line curve the 482.0 nm luminous intensity. As is evident from FIG. 18, both luminous intensities gradually decreased as the plasma etching went on, sharply decreased upon lapse at about the 150th second point of the etching, and stopped decreasing at about the 170th second point of the etching. As may be understood from FIG. 18, both luminous intensities had a value of 100 at the 100th second point of the plasma etching. During the period between the 100th second point and the 170th second point, the 219.0 nm luminous intensity decreased by a value of 3.4, whereas the 482.0 nm luminous intensity decreased by 1.8. From this fact, too, it would be better to monitor the intensity of a 219 nm light beam, in order to detect the end point of the plasma etching.

Figure 21:
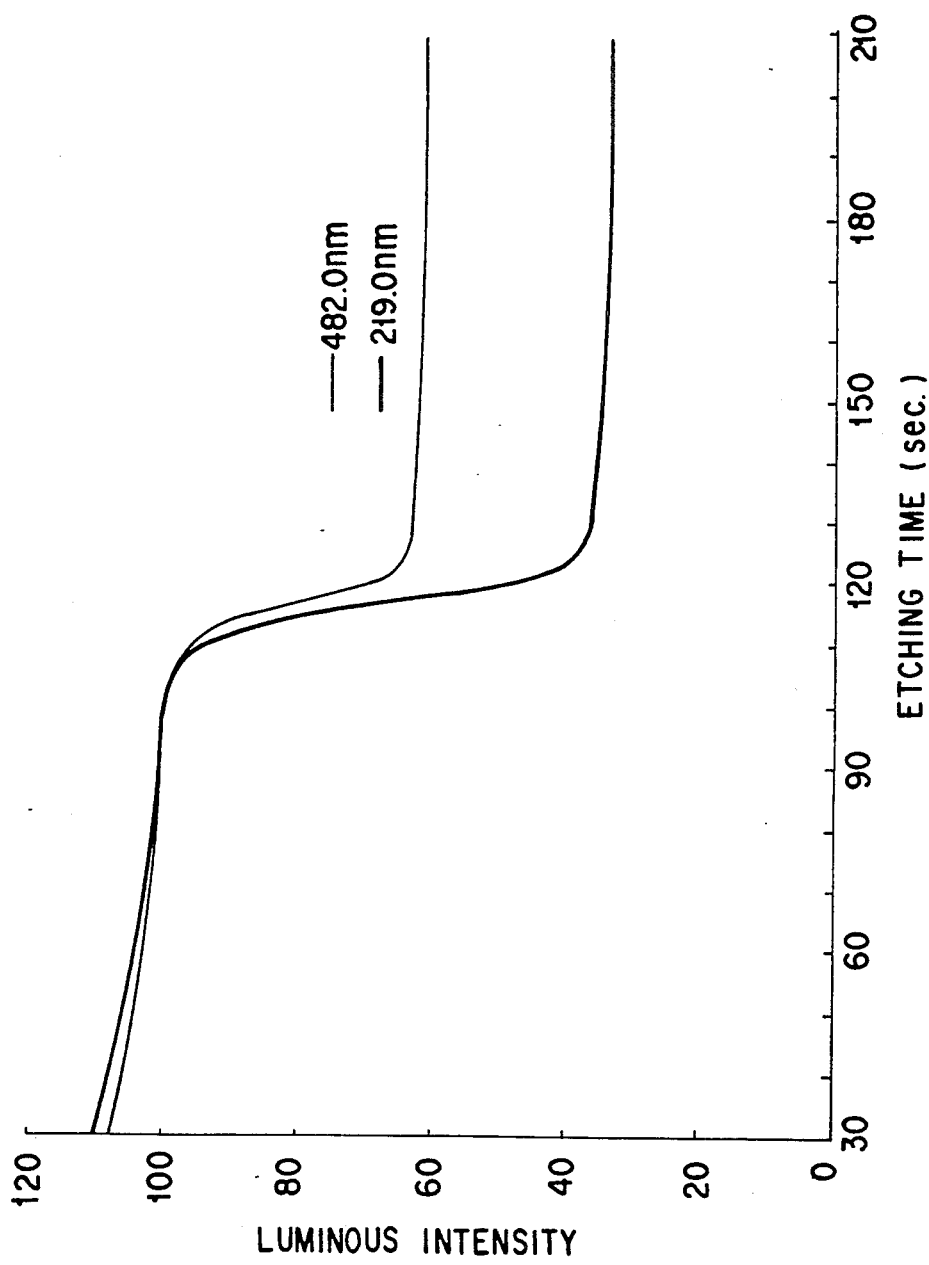
FIG. 21 is is a graph showing how the 219.0 nm luminous intensity and the 482.0 nm luminous intensity changed as the plasma etching was conducted on a wafer having a rate of hole area, by means of the apparatus shown in FIG. 16.

A silicon wafer having a silicon dioxide film on its entire surface (i.e., a covered wafer) and having a rate of hole area of 100% was plasma-etched under the same conditions as in Example 1. The two spectrometers were used, monitoring the luminous intensities at 219.0 nm and 482.0 nm and, thereby, detecting how these luminous intensities changed as the plasma etching proceeded. The results were as is illustrated in FIG. 21, in which the thick-line curve indicates the 219.0 nm luminous intensity, and the thin-line curve the 482.0 nm luminous intensity. As is evident from FIG. 21, the 219.0 nm luminous intensity decreased nearly two times as much as the 482.0 nm luminous intensity. Obviously, it would better to monitor the intensity of a 219 nm light beam, in order to detect the end point of the plasma etching being performed on a covered wafer whose rate of hole area is 100%.

EXAMPLE 3

Figure 19:
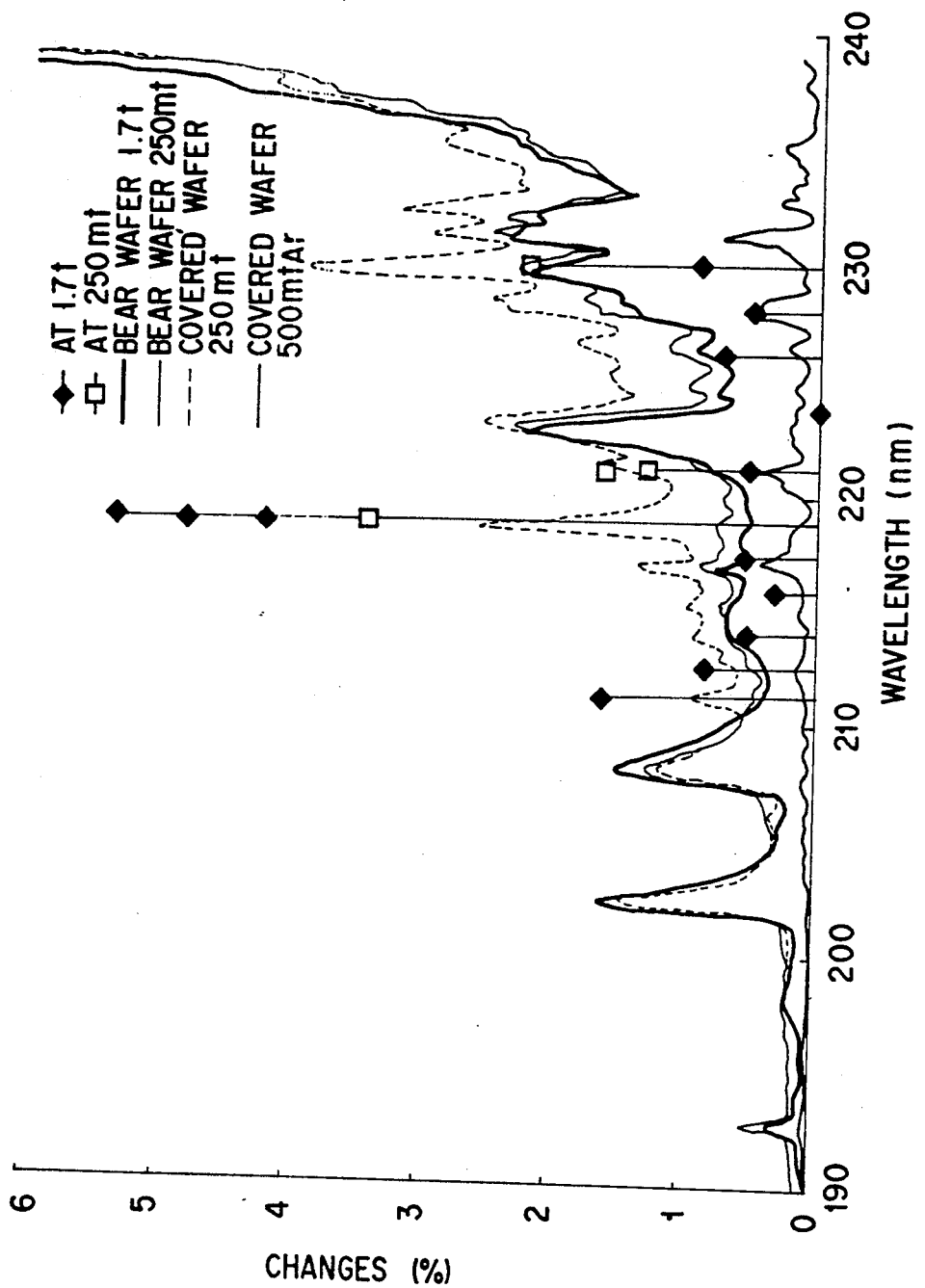
FIG. 19 illustrates an emission spectrum obtained when the plasma etching was conducted by the apparatus shown in FIG. 16, and also represents the changes in the luminous intensity of plasma at various wavelengths.

Silicon bear wafers having a rate of hole area of 10% were plasma-etched under the same conditions as Example 1, except that the pressure in the vacuum chamber 303 was reduced to 1.7 Torr (t). The emission spectrum obtained in this case was as is shown by the thin-line curve in FIG. 19. In FIG. 19, the thick-line curve represents the emission spectrum obtained during plasma etching performed on a bear wafer at pressure of 250 mTorr (mt), and the broken-line curve indicates the emission spectrum obtained during plasma etching conducted on a covered wafer at a pressure of 250 mTorr (mt). Also shown in FIG. 19 is the emission spectrum obtained in the case argon gas and no etching gases have been introduced into the chamber 303, and the pressure in the chamber is 500 mTorr.

As is evident from FIG. 19, the luminous intensity of the plasma changed by 5% or more at the wavelength of 219.0 nm, and by about 2% at 211.2 nm, 230.0 nm, and 232.5 n.

As can be understood from the results of Examples 1, 2, and 3, the plasma-process method according to the fourth embodiment of the invention can accurately detect the end point of plasma etching, by monitoring the luminous intensity at a wavelength ranging from 210 nm to 236 nm, preferably 219.0 nm, 230.0 nm, 211.2 nm, 232.5 nm, or any wavelength from 224 nm to 229 nm. In the fourth embodiment, it suffices to monitor the luminous intensity of any reaction product (CO, CO$^+$, SiF$_1$ SiF$_2$, SiF$_3$, or the like). Instead, the luminous intensity of an etching gas can also be monitored, so that the end point of the etching may be detected from changes in the ratio of the luminous intensity of the reaction product to that of the etching gas.

CF-based gases are used as etching gases, and argon gas is applied as additional gas, the fourth embodiment of the present invention. Nonetheless, the fourth embodiment can be applied to plasma etching which produces gases having luminous peaks in the ultraviolet region, or to plasma etching which uses etchants having luminous peaks in the ultraviolet region.

The forth embodiment of the invention can be applied not only to the plasma etching of silicon dioxide film, but also to the etching of polysilicon film and aluminum-alloy film. In addition, the plasma-process method according to the fourth can be applied to plasma etching of a film formed on a polysilicon substrate or an oxide layer, rather than a single-crystal silicon substrate.

The fourth embodiment of the invention, described above, can be applied to an etching apparatus of cathode-coupling type wherein a semiconductor substrate is placed on the cathode. Alternatively, it can be applied to an etching apparatus of anode-coupling type wherein a semiconductor substrate is placed on the anode. Also can the fourth embodiment be applied to an etching apparatus in which reactive gas plasma is generated in a discharge chamber by using thermoelectrons, and the plasma thus generated is applied into the etching zone.

The plasma-process method according to the fourth embodiment of the invention is advantageous, too. As has been described, the luminous intensity at a wavelength ranging from 210 nm to 236 nm, which falls within the ultraviolet region. Thus, any change in the amount of a reaction product can be detected reliably, even if the semiconductor substrate undergoing the etching has a small rate of hole area and only a small amount of gases is produced, or even if the vacuum chamber contains a great amount of inert gases and the concentration of the gases produced is inevitably low. As a result, the end point of the plasma etching can be detected with high accuracy. Excessive etching of the semiconductor substrate can therefore be prevented. In other words, the substrate, i.e., the base of the film to be etched, will not unnecessarily be etched, or the film partly etched will not have a pattern different from a desired one.

A plasma-process apparatus, which is a fifth embodiment of the present invention, will be described briefly. The apparatus comprises a plasma-processing section and a monitor section. The plasma-processing section has a vacuum chamber, and the monitor section has product-removing means, an optical system, a system-moving mechanism, and a signal-processing section.

The vacuum chamber has an observation window. The product-removing means is connected to the observation window of the chamber. It is designed to heat the window, thereby to remove a reaction product from the inner surface of the window, or is designed to generate local plasma at the inner surface of the window, thereby to prevent a reaction product from sticking onto the inner surface of the window. The product-removing means keeps the window clean, whereby the light emitted from the plasma generated in the chamber can pass through the window to the optical system, with a minimum loss. This enables the optical system to detect even slightest changes in the luminous intensity of the plasma.

The optical system comprises a focusing leans, filters, and photoelectric transducers. The lens collects the light emitted from the plasma and supplied through the window and the air (or vacuum). The light collected by the lens is applied to the photoelectric transducers though the filters, but through no optical fibers. Hence, the light is input to the transducers, with a minimum loss, and even slightest changes in the luminous intensity of the plasma can be monitored from the signals output by the photoelectric transducers.

The system-moving mechanism is connected to the optical system. The mechanism is connected to the optical system. The mechanism is designed to move the optical system, back and forth and up and down, every time the luminous peak shifts in the plasma, thereby to keep the focal point of the lens at the luminous peak. This helps to detect even slightest changes in the luminous intensity of the plasma, and ultimately to detect the end point of plasma etching with high accuracy.

The plasma-process apparatus according to the fifth embodiment, which is, for example, a plasma etching apparatus, will now be described in greater detail, with reference to FIGS. 22 and 23, FIGS. 24A and 24B, and FIGS. 25 and 26.

Figure 22:
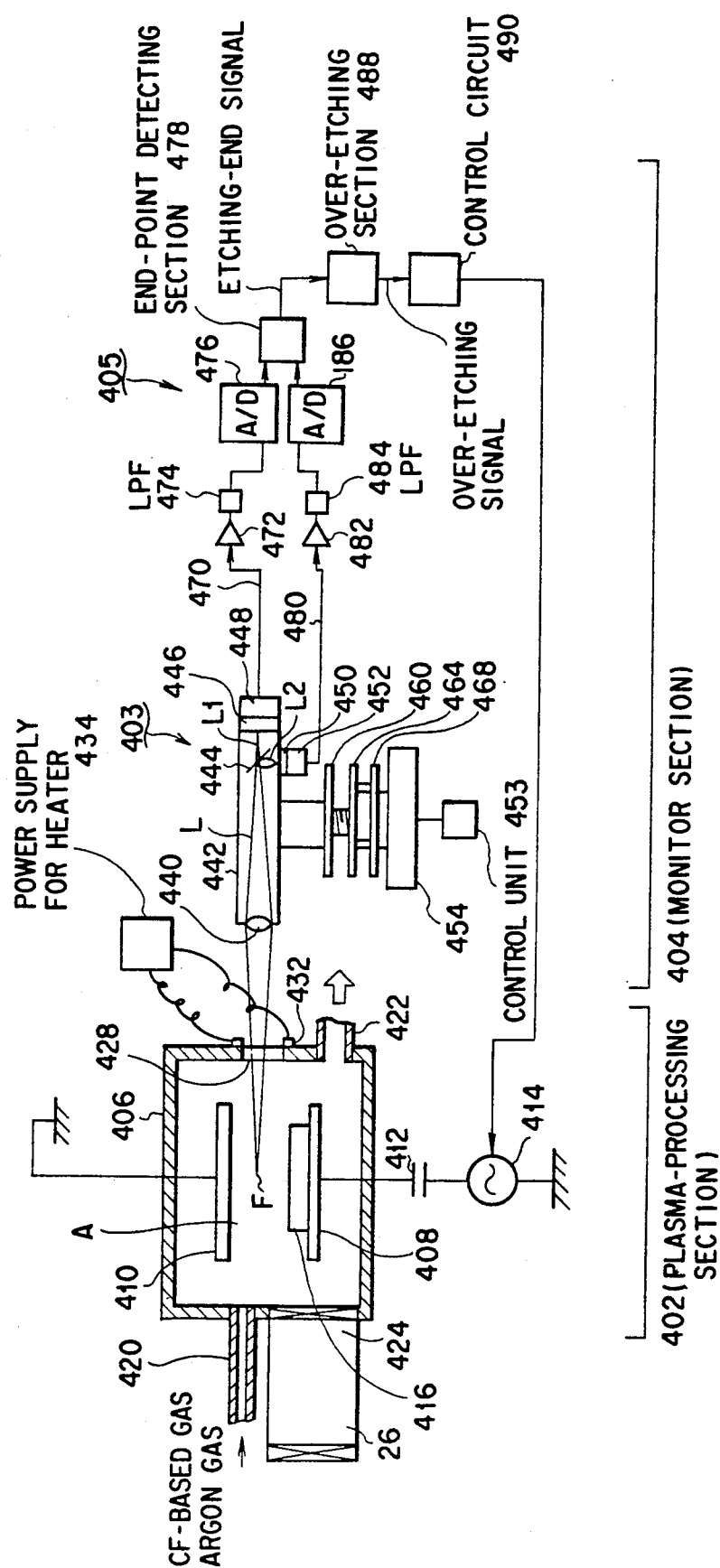
FIG. 22 is a diagram schematically showing a plasma-process apparatus according to a fifth embodiment of the present invention.

As is shown in FIG. 22, the plasma etching apparatus comprises a plasma-processing section 402 and a monitor section 404. The section 402 is designed to perform plasma-etching on a semiconductor substrate 424. The section 404 is designed to monitor the luminous intensity of the plasma generated in the plasma-processing section 402, in order to detect the end point of the plasma etching.

The monitor section 404 comprises an optical system 403 for detecting the light emitted from the plasma generated in the section 402, and a signal-processing section 405 for processing the electric signals output by the optical system 403.

The plasma-processing section 402 comprises, among other components, a vacuum chamber 406 which functions as a reaction chamber. The chamber 406 is made of, for example, aluminum. Two plate-shaped electrodes 408 and 410 are located in the vacuum chamber 406; the electrode 408 is positioned below, and parallel to, the electrode 410. The upper electrode 410 is connected to the ground, whereas the lower electrode 408 is connected to a high-frequency power supply 414 by a capacitor 412. The power supply 414 and the capacitor 412 are located outside the vacuum chamber 406.

According to the invention, the electrodes 408 and 410 can be integral parts of the vacuum chamber 406, the former defining the top thereof, and the latter defining the bottom thereof. For the sake of clarity, the electrodes 408 and 410 are greatly spaced from each other. In fact, however, the distance between them is only 5 mm, more or less. A semiconductor substrate 415, which is to be plasma-etched, is placed on the lower electrode 408, and is clamped thereto by means of a clamper (not shown).

A gas-inlet pipe 420 and a gas-outlet pipe 422 are connected to the vacuum chamber 406. The pipe 420 is used to introduce CF-based gas (a reactant gas) and argon gas (additional gas) into the space between the parallel plate-shaped electrodes 408 and 410. The pipe 422 is connected to a vacuum pump (not shown), for exhausting gases out of the vacuum chamber 406.

A load-lock chamber 426 is connected to the vacuum chamber 406, partitioned therefrom by means of a gate vane 424. The semiconductor substrate 416 can be transported from the chamber 406 into the load-lock chamber 426, and vice versa, without opening the vacuum chamber 406 to the atmosphere.

An observation window 428 made of, for example, quartz, and having a diameter of about 20 mm, is formed in the side wall of the chamber 406 for allowing the light emitted from plasma generated between the electrodes 408 and 410 to travel outwards from the chamber 406. More specifically, as is shown in FIG. 34A, the window 428 is secured to the side wall of the chamber 406 by means of a seal ring 428a, thus covering an opening made in the side wall.

As is shown in FIG. 22, a product-removing device 430, which characterizes the fifth embodiment of the invention is coupled to the outer surface of the window 428. The device 430 is designed to remove a reaction product which is generated and sticks onto the inner surface of the window 428 in the course of the plasma etching.

Figures 24A, 24B:
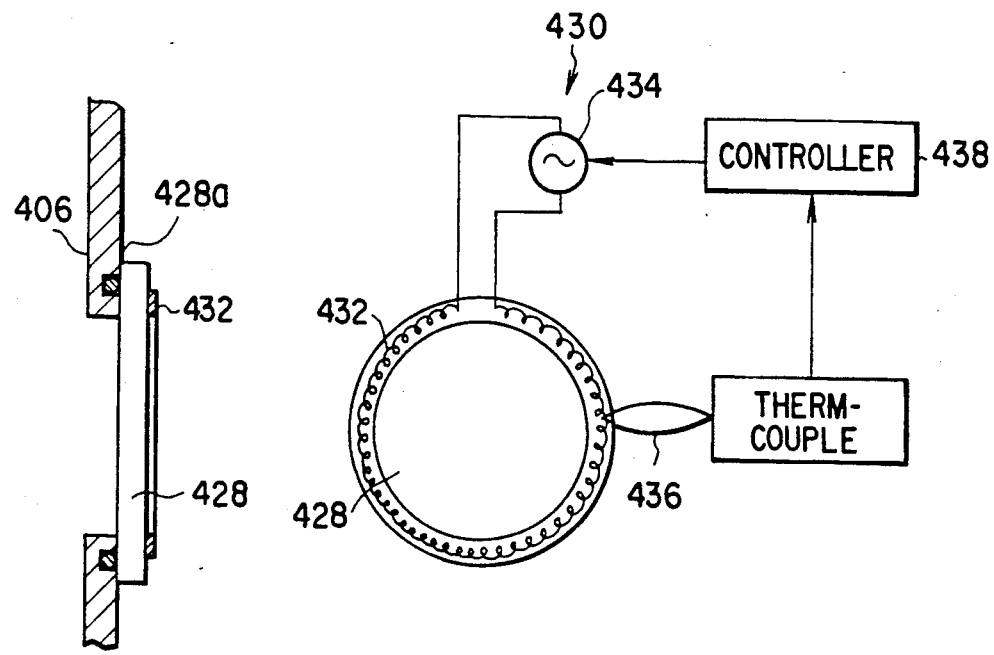
FIGS. 24A and 24B schematically show the product-removing device used in the plasma-process apparatus of FIG. 22.

More specifically, as is shown in FIGS. 24A and 24B, the device 430 comprises a ring-shaped heater 432, a power supply 434, and a thermometer 436, and a controller 438. The heater 432, for example a ceramic heater, is mounted on the outer surface of the observation window 428. The power supply 434 is electrically connected to the heater 432 to supply electric power thereto. The thermometer 436, for example a thermocouple, is located in the vicinity to the heater 432, for detecting the temperature of the window 428. The controller 438 comprises a microcomputer and connected to the power supply 434 and the thermometer 436, for controlling the power supply 434 in accordance with the output signal of the thermometer 436 which represents the temperature of the window 428, thereby to maintain the window 428 at a predetermined temperature. The product-removing device 430 is driven during the plasma etching, thus heating the window 428 and preventing the reaction product from sticking onto the window 428. Alternatively, the device 430 is driven after the plasma etching, thus heating the window 428 and removing the reaction product from the window 428.

The monitor section 404 is designed to monitor the light applied from the process region A of the plasma-processing section 402. As has been described, the section 404 incorporates the optical system 403, which is another component characterizing the fifth embodiment. As is shown in FIG. 22, the optical system 403 comprises a focusing lens 440, a hollow-cylindrical lens holder 442, a half mirror 444, two interference filters 446 and 450, and two photoelectric transducers 448 and 452.

The lens 440 is held in an end-portion of the holder 442 and located near the window 428 and opposing the window 428, for collecting the light passing via the observation window 428. The half mirror 444 is held in the other end portion of he holder 442 and arranged in the optical axis L of the focusing lens 440. The mirror 444 is inclined at 45° to the optical axis L, for splitting the input light into two portions and applying these two portions in two optical axes L1 and L2. The axis L1 is aligned with the axis L, and the axis L2 extends at right angles to the axis L1. It should be noted that light-absorbing guide means, such as an optical fiber, is not used on the downstream side of the focusing lens 440.

The first interference filter 446 is located in the optical axis L1 and at the output end of the lens holder 442. The filter 446 is designed to pass the light emitted from, for example, CF2 gas which is one of the active species generated during the plasma etching, and having a particular wavelength of, for example, about 259.5 nm. The first photoelectric transducer 448, for example a photodiode, is connected to the output of the filter 446, for converting the light output by the filter 446 into a electric signal.

The second interference filter 450 is located in the optical axis L2 and on the outer periphery of the lens holder 442. The filter 450 is designed to pass the light emitted from, for example, CO gas which is one of the reaction products formed during the plasma etching, and having a particular wavelength of, for example, about 428.7 nm. The second photoelectric transducer 452, for example a photodiode, is connected to the output of the filter 450, for converting the light output by the filter 450 into an electric signal.

The interference filters 446 and 450, which are relatively inexpensive filters, can be replaced by single-wavelength spectrometers which can more accurately extract light beams having desired wavelengths.

As has been pointed out, the optical system 403 has no light-guiding media which are likely to absorb light beams of relatively short wavelengths. The system 403 can, therefore, detect even a very low luminous intensity and slightest changes in the luminous intensity.

Figure 23:
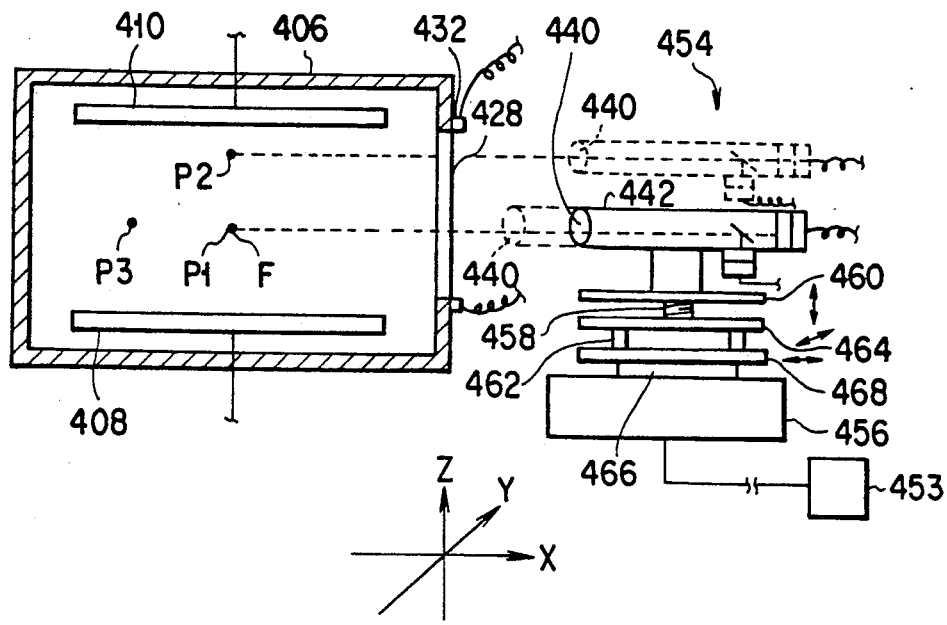
FIG. 23 is a diagram showing the optical system and the mechanism for moving the system, both incorporated in the plasma-process apparatus of FIG. 22.

As is shown in FIG. 22, a mechanism 454 is provided outside the vacuum chamber 406. As is best shown in FIG. 23, the lens holder 442 is connected to the mechanism 454. The mechanism 454 is used to move the lens holder 442, back and forth (along X-axis), left to right and vice versa (along Y axis), and up and down (along Z axis). The mechanism 454, which is sill another component characterizing the fifth embodiment, comprises a base 456, rails 466 laid on the base 456 and extending along the X axis, an X˙ table 468 mounted on the rails 466, rails 462 laid on the X table 468 and extending along the Y axis, a Y table 464 mounted on the rails 462, a lift 458 (e.g., a ball screw) mounted on the Y table 464, and a Z table 460 connected to the lift 458 and also to the lens holder 442. The X table 468 can be moved along the X axis when driven by a linear motor (not shown) or the like. The Y table 464 can be moved along the Y axis when driven by a linear motor or the like. The table Z is moved up and down by the lift 458. The lens holder 442 is connected to the Z table 460. The mechanism 454 moves the lens holder 440 whenever the luminous peak shifts in the plasma, thereby to keep the focal point F of the lens 440 at the luminous peak. The mechanism 454 is electrically connected to a control unit 453, and is driven by a control signal supplied from the unit 453.

As the mechanism 454 moves the lens holder 442 is moved along the X, Y, and Z, the optical axes L1 and L2 of the optical system 403 shift back and forth, left to right and vice versa, and up and down. However, the axes L and L2 shift for so a short distance that they never deviate from the half mirror 444 or from the interference filters 448 and 452. In other words, the mirror 444 and the filters 448 and 452 are large enough to receive the light beams traveling in these axes L1 and L2.

The lens 440, the half mirror 444, the filters 446 and 450, and the transducers 448 and 452—all constitute the optical system 403—are moved by the mechanism 454. Thus, the light passing through the focusing lens 440 reaches the half mirror 444, without fail.

Referring back to FIG. 22, the photoelectric transducers 443 and 452 are connected by two wires 470 and 480 to the signal-processing section 405. The section 405 comprises two amplifiers 472 and 482, two low-pass filters 474 and 484 connected to the amplifiers 474 and 482, respectively, and two A/D converters 476 and 486 connected to the low-pass filters 474 and 474, respectively. The signal-processing section 405 further comprises an end-end point detecting section 478 connected to the A/D converters 476 and 486, an over-etching timer 488 connected to the section 478, and a control circuit 490.

The first amplifier 472 amplifies the electric signal output by the first photoelectric transducer 448. The first low-pass filter 474 passes a component of the input signal, said component being of 10 Hz. The first A/D converter 476 converts the output of the filter 474 into a digital signal. The digital signal is input to the end-point detecting section 478. The section 478 comprises, for example, a microcomputer.

The second amplifier 482 amplifies the electric signal output by the second photoelectric transducer 452. The second low-pass filter 484 passes a component of the input signal, said component being of 10 Hz. The second A/D converter 486 converts the output of the filter 484 into a digital signal. The digital signal is input to the end-point detecting section 478.

The end-point detecting section 478 comprises, for example, a microcomputer, and is designed to find ratio of the signal output by the first A/D converter 476 to the signal output by the second A/D converter 486. The output signal of the A/D converter 476 represents the luminous intensity of the active species, whereas that of the A/D converter 486 indicates the luminous intensity of the reaction product. Hence, the section 478 calculates the ratio of the former luminous intensity to the latter. When this luminous intensity ratio changes by an amount greater than a predetermined value, the section determines that the plasma etching has just completed.

The bands of the low-pass filters 474 and 484 are not limited to 10 Hz. Their bands can be other than 10 Hz, depending on the sampling frequency required of the A/D converters 476 and 486. The A/D converters should have a sampling frequency of at least 4 times higher than the band-frequency of the low-pass filters 474 and 484, in order to produce a digital signal which faithfully represents the original signal. Hence, in the case the filters 474 and 484 have a band of 10 Hz, both A/D converters must have a sampling frequency of 40 Hz or more. The end-point detecting section 478 can thereby detect changes in the luminous intensity of plasma with a sufficiently high accuracy. By averaging the changes of the luminous intensity, a DC component can be extracted. Upon detecting the end point of the plasma etching, the section 478 outputs an etching-end signal, which is supplied to the over-etching timer 488.

A desired over-etching time is preset in the over-etching timer 488. The timer 488 starts counting time in response to the etching-end signal from the end-pint detecting section 478, the timer 488 starts counting time, and outputs an over-etching end signal when its count reaches the preset over-etching time. The over-etching end signal is input to the control circuit 490. The circuit 490 outputs a control signal upon receipt of the over-etching end signal. The control signal is supplied to the high-frequency power supply 414. Upon of this control signal, the power supply 414 stops supplying the high-frequency power to the lower electrode 408 via the capacitor 412, thereby stopping the plasma etching.

By virtue of the over-etching timer 488, the plasma-processing section 402 performs over-etching on the semiconductor substrate 424 in order to, for example, adjusting the taper angle of any opening made in the film formed on the substrate 424. Over etching is necessary, particularly in the case of a circular semiconductor substrate. Without the over-etching, the film on the substrate would be etched uniformly since the gas concentration at the center portion of the substrate is different from that at the peripheral portion thereof. Further, if the over-etching were not carried out, the photoresist might flow down over the surface of any opening made in the film by means of the plasma etching.

The operation of the plasma-process apparatus according to the fifth embodiment will now be explained.

First, the silicon substrate 416, already transported into the load-lock chamber 426, is moved into the vacuum chamber 406 through the gate vane 424 by means of an arm (not shown), and then was mounted on the lower electrode 408. The substrate 416 has a silicon dioxide film formed on its upper surface. Formed on the silicon dioxide film was a mask which had been patterned specifically by means of an exposure process.

Now that the semiconductor substrate 118 is thus positioned within the vacuum chamber 104, the chamber 406 is evacuated though the gas-outlet pipe 422, thereby reducing the pressure inside the chamber 406 to a predetermined value. Thereafter, CF-based gases (i.e., etchant gases), such as $CH_3$ gas and $CF_4$, are introduced into the vacuum chamber 104 at the rate of 60 SCCM through the gas-inlet pipe 420. Also, argon gas, i.e., an additional gas, is introduced via the pipe 420 into the chamber 406 at the rate of 1000 SCCM, in order to stabilize the plasma which would be generated within the vacuum chamber 406. Then, the vacuum pump (not shown) is driven, evacuating the chamber 406 until the pressure within the chamber 406 decreases to about 1.2 Torr. Next, the high-frequency power supply 414 supplies a high-frequency power of 750 W and 13.56 MHz or 380 KHz, between the electrodes 408 and 410. As a result, plasma is generated in the vacuum chamber 406, whereby the silicon dioxide ($SiO_2$) film on the substrate 416 is etched. At this time, the temperature of the substrate 416 is maintained at $-50°$ to $40°$.

The $CH_3$ gas and the $CF_4$ gas, both introduced into the chamber 406, are decomposed, generating various types of active species. These active species contributed to the etching of the silicon dioxide film. The $CF_2$ radical, for example, reacted with silicon dioxide in the way represented by the following formula, removing the silicon dioxide from the silicon substrate 416.

$$SiO_2 + 2CF_2 \rightarrow SiF_4 + 2CO$$

The argon gas (i.e., the plasma-stabilizing gas), the $CF_2$ gas (i.e., the etching gas), and the CO gas (i.e., the reaction product) emit light beams, with specific emission spectra, respectively. These light beams passed through the window 428 and are collected by the focusing lens 440 of the optical system 403. The light, thus collected, is applied to the half mirror 444 through air of vacuum, not via any guiding medium such as an optical fiber. In other words, the light travels along the optical axis L and are applied directly to the half mirror 444. The mirror 444 split the input light into to parts, one passing through the mirror 444, and the other reflected by the mirror 444.

The light, which has passed through the mirror 444, travels through air or vacuum along the optical axis L1 to the first interference filter 446. The filter 446 allows the passage of only the light beam which has been emitted from one of the active species generated from the CF-based gases and which has a predetermined wavelength. The first photoelectric transducer 448 converts this light beam into an electric signal representing the intensity of the light beam. The first amplifier 472 amplifies this signal. The first low-pass filter 474 allows the passage of those components of the input signal whose frequencies are not higher than 10 Hz. The first A/D converter 476 samples the output signal of the filter 474 at a frequency which is four or more times higher than 10 Hz, thus generating a digital signal. The digital signal is input to the end-point detecting section 478.

Meanwhile, the light reflected from the half mirror 444 travels through air or vacuum along the optical axis L2 to the second interference filter 450. The filter 450 allows the passage of only the light beam which has been emitted from one of the reaction products and which has a predetermined wavelength. The second photo-electric transducer 4452 converts this light beam into an electric signal representing the intensity of the light beam. The second amplifier 482 amplifies this signal. The second low-pass filter 484 allows the passage of those components of the input signal whose frequencies are not higher than 10 Hz. The second A/D converter 486 samples the output signal of the filter 484 at a frequency which is four or more times higher than 10 Hz, thus generating a digital signal. The digital signal is input to the end-point detecting section 478.

The end-point detecting section 478, which comprises a microcomputer or the like, calculates the ratio of the luminous intensity of the active species to that of the reaction product, and monitors this luminous intensity ratio. When the luminous intensity ratio changes by an amount greater than a predetermined value, the section 478 determines that the plasma etching has just completed.

Upon determining this fact, the section 478 outputs an etching-end signal, which is supplied to the over-etching timer 488. The timer 488 starts counting time in response to the etching-end signal, and outputs an over-etching end signal the moment its count reaches a preset over-etching time. Hence, the plasma-processing section 402 performs over-etching on the substrate 416 for the time preset in the over-etching timer 488.

It should be noted that the end-point detecting section 478 detects changes in the luminous intensity ratio on the basis of the average of the ratio for the latest 10 seconds. Therefore, the over-etching has already proceeded for 10 seconds at the time the section 478 detects the end point of the plasma etching. This does not matter, however, since the actual over-etching lasts far longer than 10 seconds.

The over-etching end signal output by the over-etching timer 388 is supplied to the control circuit 490. Upon receipt of the over-etching end signal, the circuit 490 outputs a control signal, which turns off the high-frequency power supply 414. Thus, the high-frequency power is no longer supplied from the power supply 414. As a result, the plasma etching is stopped completely in the vacuum chamber 406.

In the fifth embodiment, the first interference filter 446 extracts a light beam from the emission spectrum of CF 2 radical which is one of the active species of the CF-based gases. And the second interference filter 450 extracts a light beam from the emission spectrum of CO gas which is one of the reaction products.

The emission spectrum of the CO gas ranges 300 to 800 nm, and almost completely overlaps the emission spectrum of argon gas. Further, the luminous intensity of the argon gas is enormous since this gas is used in a large amount. Consequently, it is difficult to detect the emission spectrum of the CO gas. However, the argon gas has low luminous intensities at specific wavelengths between 480.6 nm and 484.6 nm as is evident from FIG. 9, whereas the CO gas has high luminous intensities at wavelengths between these two luminous peaks of the argon gas, more precisely at two wave-lengths of 482.7 nm and 483.5 nm.

Hence, in the fifth embodiment, the second interference filter 450 is one designed to extract a light beam whose wavelength is 482.7 nm, thereby to monitor the luminous intensity of the CO gas. On the other hand, the first interference filter 446 is one designed to extract a light beam whose wavelength is 259.5 nm, thereby to monitor the luminous intensity of the $CF_2$ gas. This is because the $CF_2$ gas has a luminous peak at 259.5 nm which is well outside the emission spectrum of argon gas.

FIG. 25 is a graph showing how the luminous intensity of the $CF_2$ gas and that of the CO gas, and the ratio of the former intensity to the latter changed as the plasma etching proceeded in a plasma-process apparatus identical to the apparatus shown in FIG. 22. In FIG. 25, the changes in the luminous intensities are represented in percentage.

As can be understood from FIG. 25, the luminous intensities of the $CF_2$ and CO gases gradually decreased as the plasma etching went on. This is perhaps because the temperature of the semiconductor substrate rose little by little. The luminous intensity of the $CF_2$ gas slightly increased shortly after the point which appeared to be the end point of the plasma etching. This increase in the $CF_2$ luminous intensity alone cannot serve to detect the etching-end point with accuracy since it was not greater than the fluctuation which occurred throughout the plasma etching. Although the CO luminous intensity decreased at a relatively high rate after the point which seemed to be the etching end point, this noticeable decrease alone cannot help to detect, with accuracy, the end point of the plasma etching.

By contrast, the ratio of the $CF_2$ luminous intensity to the CO luminous intensity fluctuated less and more regularly, as is evident from FIG. 25. The ratio ($CF_2$/CO) abruptly increased shortly after a specific point, by a value far greater than the fluctuation. Thereafter, the ratio remained almost constant thereafter, indicating that the plasma etching had come to an end.

The surfaces of the semiconductor substrates which had been plasma-etched by the apparatus of FIG. 22 were examined under a SEM (Scanning Electron Microscope). The SEM analysis proved that the point which seemed to be the etching-end point was the actual end point of the plasma etching. In other words, the plasma etching completed upon lapse of about 128 seconds. Hence, the end point of plasma etching can be detected accurately, by monitoring the changes in the ratio of the CF$_2$ luminous intensity to the CO luminous intensity.

As described above, in the fifth embodiment of the invention, the end point of plasma etching is detected from the changes in the ratio of the luminous intensity of the active species to that of the reaction product. The fluctuation of the luminous intensity of the active species cancels out that of the luminous of the reaction product, and the detection accuracy is doubled. The fifth embodiment of the invention can successfully detect the end point of the plasma etching conducted on a semiconductor substrate having a rate of hole area of 10% or less, which is impossible to accomplish with the conventional plasma-process method.

In the case where the over-etching time preset in the over-etching timer 488 is, for example, 30 seconds, the over-etching will start at the 128th second point and will end at the 158th second point.

The term "overlapping of emission spectra" or the like term, has been used in the above description of the second embodiment of the invention. This term means not only that an emission spectrum completely overlaps another, but also that an emission spectrum overlaps a part (e.g., an end portion) of another emission spectrum.

The way in which plasma is generated in the process region A between the electrodes 408 and 410 differs in accordance with the size of the substrate being plasma-etched, the conditions of the plasma etching, and the properties of the gases used. As a result, the luminous peak shifts in the plasma, though a very little, to a point P2 or P3 from the point P1 (FIG. 23) which coincides with the focal point F of the focusing lens 440. Unless the lens 440 is moved, thus moving the point F from the point P1 to the point P2 or P3, it would be impossible to reliably detect changes in the luminous intensity of the plasma when the luminous intensity of the plasma is relatively low.

Hence, the mechanism 454 is driven by a control signal supplied from the unit 453, thereby moving the lens holder 440 along the X axis, thee Y axis and/or the Z axis. As a result, the focal point F of the lens 440 is moved to the point P2 or P3, as the case may be. More specifically, if the point at which the luminous peak exists in the process region A has moved from the point P1 to the point P2, the Z table 460 is moved up until the focal point F coincides with the point P2. If the luminous peak point has moved from the point P1 to the point P3, the X table 468 is moved to the left until the focal point F coincides with the point P3. Further, if the luminous peak point has moved from the point P1 along an axis perpendicular to the plane of the diagram (FIG. 23), then the Y table 468 is moved along said axis until the focal point F coincides with the luminous peak point newly located.

Since the focal point F of the lens 440 can track the point where the luminous peak exists in the process region A by virtue of the mechanism 454 which can move the lens holder 440, even a slight change in the luminous intensity of the plasma can be detected. This greatly helps to detect the end point of the plasma etching with high accuracy.

As has been described, the mechanism 454 is driven by a control signal supplied from the unit 453. Instead, the mechanism 454 can be driven by a signal output by a detector which has detected the position of the luminous peak point. In this case, the focal point F can be automatically moved to the luminous peak point, wherever the peak point is located in the process region A.

The optical system of the conventional plasma-process apparatus has optical fibers. Though having relatively high transmittance, optical fibers absorb a great part of light beams of so short wavelengths as those at which to monitor the luminous intensities of gases in the fifth embodiment of the present invention. For example, optical fibers absorb as much as 50% of input light. Were optical fibers used in the fifth embodiment, the light output from the fibers would be too weak, and it would be impossible to detect changes in the luminous intensities of the gases.

As has been pointed out, no optical fibers are used in the optical system 403 of the plasma-process apparatus shown in FIG. 22. The light emitted from the plasma is collected by the lens 440 and then travels though air or vacuum until it is applied to the filters 446 and 450 and then to the photoelectric transducers 448 and 452. Thus, the loss of the light, which occurs in the optical system 403, is minimal. Hence, even little changes in the luminous intensities of the gases can be reliably detected even if these intensities are relatively low. As a result, the end point of the plasma etching can be detected with accuracy.

During the plasma etching, the reaction products will likely adhere to the coolest portion of the vacuum chamber 406, i.e., the observation window 428. Therefore, the reaction product may stick onto the inner surface of the window 428, turning the window 428 so opaque that a sufficient amount of light can no longer pass through the window 428. In such a case, the window 428 must be cleaned after the plasma etching, in order that the end point of the next plasma etching can be detected accurately.

With the plasma-process apparatus of FIG. 22, the reaction products are prevented from adhering to the observation window 428, by virtue of the product-removing device 430. More precisely, during the plasma etching, the power supply 434 keeps supplying power to the ring-shaped heater 432 which is mounted on the outer surface of the observation window 428 The thermometer 436, which is located near the heater 432, detects the temperature of the window 428 and outputs a signal representing the temperature detected. The controller 438 controls the power supply 434 in accordance with the output signal of the thermometer 436, thereby maintaining the window 428 at a predetermined temperature of, for example, 100° C. Since the window 428 is so heated throughout the plasma etching, the reaction products do not adhere to the window 428. Alternatively, the product-removing device 430 can be driven after the plasma etching, thus heating the window 428 and removing the reaction product from the window 428.

Since the device 430 prevents the reaction products are prevented from adhering to the window 428 during the plasma etching, the window 428 remains clean enough to allow the passage of a sufficient amount of light to the focusing lens 440. The signal-processing section 405 can, therefore, detect changes in the luminous intensities of the gases even if the changes are small, and can ultimately detect the end point of the etching with high accuracy. Needless to say, the window 428 need not be cleaned manually at all.

Figure 26:
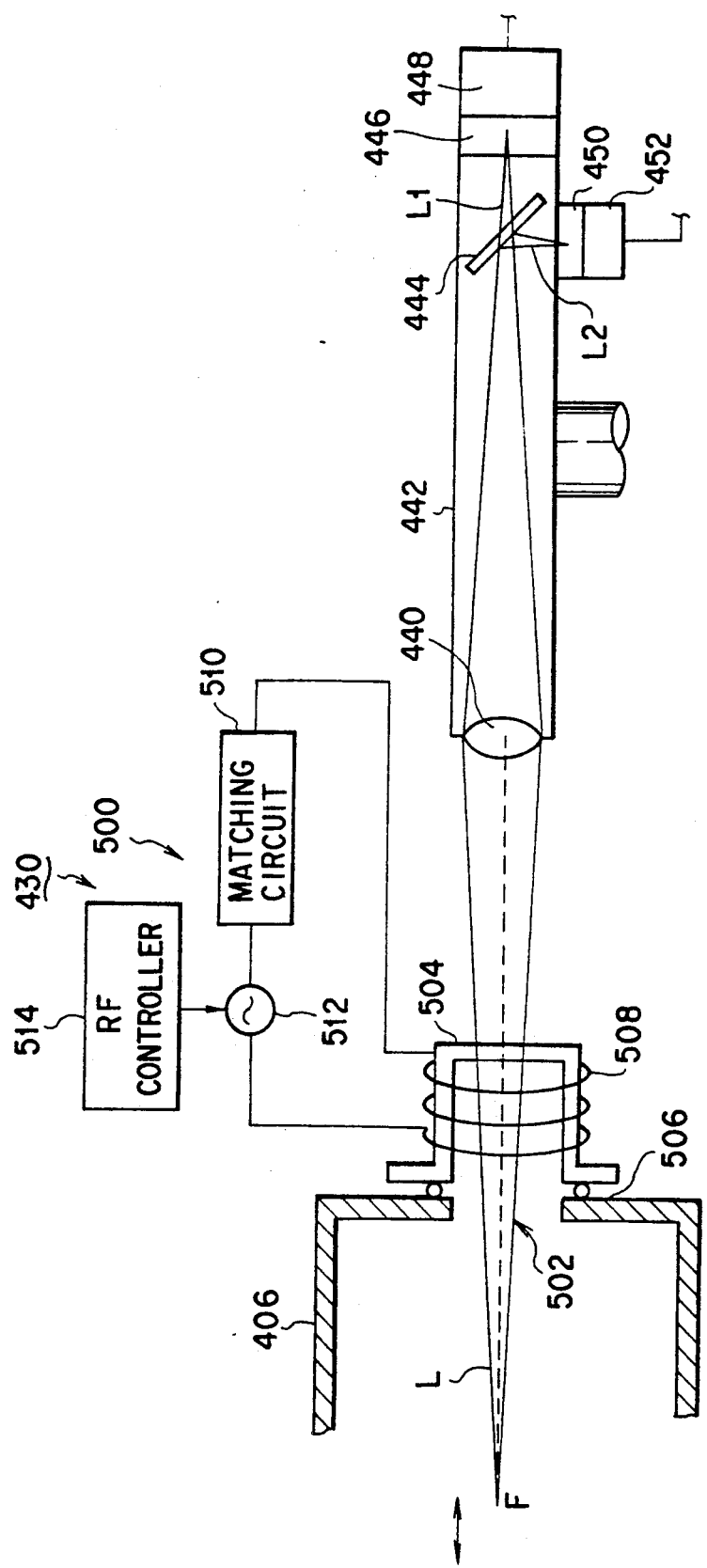
FIG. 26 is a diagram showing a modification of the product-removing device incorporated in the apparatus of FIG. 22.

In the fifth embodiment, the product-removing device 430 including the ring-shaped heater 432 can be replaced by such a local plasma-generating device 500 as is shown in FIG. 26. The device 500 will be described.

As is evident from FIG. 26, an opening 502 is made in the side wall of the vacuum chamber 406. A hollow cylinder having an observation window 504 is secured to the chamber 406 in airtight fashion by means of an O-ring 506. This cylinder is made of quartz glass or the like and has a diameter of about 20 mm and a length of about 10 mm. A high-frequency coil 508 is wound around the hollow cylinder. The coil 508 is connected at one end to a matching circuit 510 and at the other end to a high-frequency power supply 512. The matching circuit 510 is connected to the power supply 512. The power supply 512 supplies high-frequency power to the coil 508, thereby to generate a cleaning plasma in the hollow cylinder to clean the observation window 504.

A controller 514 is connected to the high-frequency power supply 512, for driving the power supply 512. To be more specific, a cleaning gas (e.g., O2) is introduced into the vacuum chamber 406 when the plasma etching is completed. Then, the controller 514 drives the high-frequency 512 power supply 512, thereby generating a cleaning plasma in the hollow cylinder only. The cleaning plasma is generated by supplying a high-frequency power of 750 W and 13.56 MHz from the power supply 512 to the high-frequency coil 508, for about 30 seconds.

The reaction products stuck to the inner surface of the window 504 is removed by means of the plasma sputtering. Hence, the observation window 504 is cleaned, whereby the light emitted from the plasma in the vacuum chamber 406 can pass through the window 504 without loss. This cleaning is carried out every time the etching is completed either on a semiconductor substrate or on a lot of substrates, if a monitor device (not shown) located outside the window 504 detects that the reaction products have accumulated too much on the inner surface of the window 504.

Since the cleaning plasma is confined in the hollow cylinder, it would not affect the etching plasma generated in the chamber 406 at all.

The high-frequency 512 power supply 512 can be dispensed with, provided the high-frequency power supply 414 used for generating the etching plasma in the chamber 406 is connected not only to the lower electrode 408 but also to the high-frequency coil 508.

It should be noted that the product-removing device 430 can be employed not only in a plasma-process apparatus of FIG. 22, but also in any other apparatus, such as an ashing apparatus or a CVD apparatus, in which reaction product are likely to adhere to the inner surface of the reaction chamber.

In the fifth embodiment, the end point of the plasma etching is detected from an abrupt change in the ratio of the luminous intensity of an active species to that of a reaction product. However, it is difficult to determine the etching-end point from the ratio of a luminous intensity at one wavelength to that at another wavelength if these luminous intensities decrease at different rates. In this case, various operations are performed on the first luminous intensity, thus modifying it or adjusting the slop of this luminous intensity to the slope of the second luminous intensity. Then, the end point of the etching can be detected from the ratio of the modified first luminous intensity to the second luminous intensity.

As has been described, the luminous intensity of the active species is monitored at a wavelength of about 260 nm. Nonetheless, the $CF_2$ luminous intensity can be monitored at a wavelength ranging from 240 to 380 nm, and the $CF_1$ luminous intensity can be monitored at 202.4 nm or 208 nm. Further, the luminous intensity of the reaction product can be monitored at a wave length ranging from 210 to 236 nm. In particular, the luminous intensity of CO gas and $CO^+$ ions can be monitored at 219.0 nm, 230.0 nm, 211.2 nm, 232.5 nm, or any wavelength ranging from 224 to 229 nm.

In the fifth embodiment, the CF-based etching gases are $CF_4$ and $CH_3$ gases. The etching gases are not limited to these, however. Other CF-based gases such as $C_2F_6$, $C_3F_8$, $C_4F_8$, $CH_2F_2$, $CF_3Cl$, $C_2F_5Cl$, $CF_2Cl_2$, $CF_3Br$ and $C_2F_5Br$. Further, $CCl_4$ can be used as an etching gas.

The fifth embodiment of the invention can be applied not only to the plasma etching of silicon dioxide film, but also to the etching of polysilicon film and aluminum-alloy film. In addition, the plasma-process apparatus according to the fifth can be used to plasma-etch a film formed on a polysilicon substrate or an oxide layer, rather than a single-crystal silicon substrate.

In other words, the object of plasma-etching is not limited to $SiO_2$. The plasma-process apparatus shown in FIG. 22 can be employed to etch polysilicon, silicon nitride, amorphous silicon, GaAs, aluminum, and the like. To plasma-etching a GaAs film, $CF_4$-$O_2$ gas can be applied as etching gas. To plasma-etch an aluminum film, $CCl_4$, $BCl_4$, $SiCl_4$ and the like can be used as etching gases.

The plasma-process apparatus according to the fifth embodiment of the invention, described above, can be applied to a plasma etching apparatus of cathode-coupling type wherein a semiconductor substrate is placed on the cathode. Alternatively, it can be applied to an etching apparatus of anode-coupling type wherein a semi-conductor substrate is placed on the anode. Also can the fifth embodiment be applied to an etching apparatus in which reactive gas plasma is generated in a discharge chamber by using thermoelectrons, and the plasma thus generated is applied into the etching zone.

As can be understood from the above, the plasma-process apparatus shown in FIG. 22 is advantageous in the following respects.

First, the light emanating from the plasma can pass through the window 428 with a minimum loss since the reaction products are removed from the window 428 almost completely. The monitor section 404 can therefore detect even small changes in the luminous intensity of the plasma.

Second, the light collected by the lens 440 travels the filters 446 and 450 and then to the transducers 448 and 452 through air or vacuum, not though optical fibers which absorb much light, the loss of the light is reduced to a minimum. This also enables the monitor section 404 to detect even small changes in the luminous intensity of the plasma.

Third, the luminous peak point in the process region A can be tracked through out the plasma etching by virtue of the mechanism 454, no matter how the plasma undergoes changes in term of its shape and extension. Thus, even slightest changes in the luminous intensity of the plasma can be detected reliably.

A plasma-process apparatus, which is a sixth embodiment of the present invention, will be described briefly.

In any embodiment described above, plasma is generated between two parallel, plate-shaped electrodes, and the plasma is applied to a semiconductor wafer mounted on the lower electrode. The wafer can indeed be plasma-etched uniformly, but relatively high gas pressure is necessarily be built up to generate the plasma. Because of the high gas pressure, the collision energy of the active species is very great, damaging the wafer. If the wafer is so damaged, there will be the possibility that the electronic elements formed in the wafer have but degraded characteristics, in particular if the elements are arranged in high density To avoid such damages to the wafer, it has been proposed that a magnetic field be generated in an electric field, thereby to trap electrons, so that high-density plasma may be generated even under a low gas pressure. It is, however, difficult to generate a magnetic field which extends throughout the process region. A method is proposed which may help to apply a magnetic field to any part of the process region. This method is to rotate a permanent magnet outside a vacuum chamber, around the vertical axis thereof.

As the magnetic field is thus rotated, however, the plasma inevitably moves, raising a problem with the conventional plasma-process method in which the intensity of a light beam emanating from a fixed point above the wafer is monitored. Namely, every time the plasma moves, the intensity of that light beam does change, making it difficult to accurately determine changes in the luminous intensity of the plasma itself. To detect the changes in the plasma luminous intensity correctly, the optical system of the apparatus may be moved to track the luminous peak point in the plasma. This technique requires, however, a complex mechanism for moving the optical system. Further, light is reflected, depending on the conditions around the measuring point, making it impossible to detect changes in the luminous intensity of the plasma.

The plasma-process apparatus, i.e., the sixth embodiment of the invention, comprises a rotary encoder, a light-receiving section, a sampling section, and a signal-processing section. The rotary encoder generates pulses as a permanent magnet is rotated outside a vacuum chamber. The light-receiving section converts the light emitted from the chamber into an electric signal. Upon receipt of each pulse from the rotary encoder, the sampling section samples the electric signal. Each output of the sampling section is related to the position the magnet assumes upon rotating through a predetermined angle, and thus related to the position of the plasma. Hence, the luminous intensity of the plasma can be reliably measured by processing the outputs of the sampling section.

The plasma-process apparatus, which is the sixth embodiment of the invention, will now be described in detail, with reference to FIGS. 27 and 28.

Figure 27:
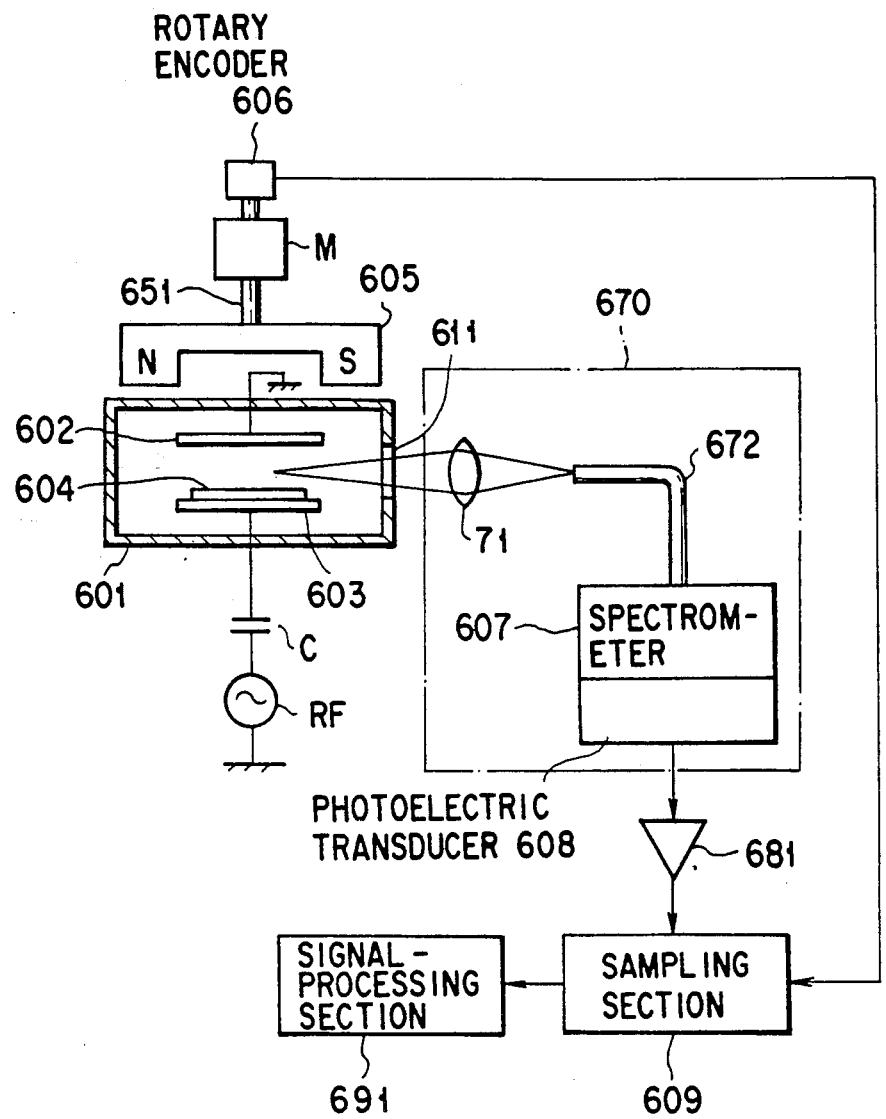
FIG. 27 is a diagram illustrating a plasma-process apparatus according to a sixth embodiment of the present invention.

As is shown in FIG. 27, the plasma-process apparatus comprises a vacuum chamber 601 which functions as a reaction chamber. Two plate-shaped electrodes 602 and 603 are located in the vacuum chamber 601; the electrode 602 is positioned above, and parallel to, the electrode 603. The upper electrode 602 is connected to the ground, whereas the lower electrode 603 is coupled to a high-frequency power supply RF by a capacitor C. The power supply RF and the capacitor C are located outside the vacuum chamber 601.

According to the invention, the electrodes 602 and 603 can be integral parts of the vacuum chamber 601, the former defining the top thereof, and the latter defining the bottom thereof.

The vacuum chamber 601 can be evacuated, and reactant gases and predetermined additional gases can be introduced into the space between the parallel plate-shaped electrodes 602 and 603. A semiconductor wafer 604, which is to be plasma-etched, is placed on the lower electrode 403, and is clamped thereto by means of a clamper (not shown).

The plasma-process apparatus further comprises a rod magnet 605, a motor M, and a rotary encoder 606—all located above the vacuum chamber 601. The magnet 605 having N and S poles is connected by the vertical shaft 651 of the motor M, to be rotated thereby around the axis of the shaft 651. The rotary encoder 606 is connected to the shaft 651 of the motor M.

An observation window 611 is made in the side wall of the vacuum chamber 601, for allowing the light emitted from the plasma generated in the space between the electrodes 602 and 603 to pass outwards from the vacuum chamber 601.

The plasma-process apparatus has a light-receiving section 270 located outside the chamber 601 and near the observation window 611. This section 670 comprises a spectrometer 607, a photoelectric transducer 608, a focusing lens 671, and an optical fiber 672. The lens 671 opposes the window 611 to collect the light passing through the window 611. The optical fiber 672 has its input end opposing the lens 671 and its output end connected to the spectrometer 607. The spectrometer 607 is connected to the transducer 608. In operation, the optical fiber 672 guides the light collected by the lens 671, to the spectrometer 607. The spectrometer 607 extracts a light beam having a predetermined wavelength from the input light. The transducer 608 converts this light beam into an electric signal.

The plasma-process apparatus further comprises a sampling section 609, an amplifier 681, and a signal-processing section 691. The amplifier 681 is connected to the photoelectric transducer 608, for amplifying the electric signal output by the transducer 608. The sampling section 609 is connected to the rotary encoder 606 and also to the amplifier 681. The section 609 has a D/A converter for sampling the electric signal with the output pulses of the encoder 606, thereby converting the signal into a digital signal. The signal-processing section comprises a memory and a CPU. The memory stores the digital signal, and the CPU performs operations (later described) on the digital signal.

The operation of the plasma-process apparatus according to the sixth embodiment will now be explained.

First, the silicon wafer 604, having a silicon dioxide film formed on its upper surface, and a mask formed on the film and patterned specifically, is mounted on the lower electrode 603. Then, an etching gas such s $CHF_3$ is introduced into the vacuum chamber 601 at the rate of 50 SCCM. Next, the chamber 601 is evacuated, thereby reducing the pressure inside the chamber 601 to, for example, 400 mmTorr. Next, the high-frequency power supply RF supplies a high-frequency power of 600 W and 13.56 MHz, and the bar magnet 605 is rotated 360° every 3 to 5 seconds. Plasma is thereby generated in the chamber 601, thus plasma-etching the silicon dioxide film formed on the wafer 604.

The spectrometer 7 extracts a light beam emitted from CO and having the wavelength of 483.5 nm, and the photoelectric transducer 608 generates an electric signal (a voltage) which corresponds to the intensity of the 483.5 nm light beam. The amplifier 681 amplifies this signal, which is input to the sampling section 609.

In the meantime, the rotary encoder 606 generates 100 pulses every time it is rotated through 360° C. These pulses are supplied to the sampling section 609.

The sampling section 609 samples the signal with the pulses supplied from the rotary encoder 606, thereby outputting sampled voltage signals to the signal-processing section 691. The section 691 processes these voltage signals into time-series data, and outputs the data in the form of a graph. Further, the section 691 obtains the sum of the voltage signals the sampling section 609 produces every time the magnet 605 is rotated through 360°, or the average of these voltage signals. Either the sum or the average is monitored as the luminous intensity of the plasma.

More specifically, to find the sum of the voltage signals, the section 691 first adds the first 100 voltage signals output by the sampling section 609. Thereafter, every time the sampling section 609 outputs a voltage signal, the section 691 adds this voltage signal to the sum and subtracts the oldest voltage signal from the sum. Hence, the sum of the voltage signals is updated every time the plasma is rotated by 3.6°. Also, the signal-processing section 691 divides the updated sum by 100, thereby calculating the average of the changing luminous intensity of the plasma.

Either the sum of the voltage signals or the average of the luminous intensity corresponds to the luminous intensity of the plasma being rotated by the rotating magnet 605, and is monitored to detect a change or deviation of the plasma luminous intensity, so as to determine the condition of the wafer 604 and the operating condition of the chamber 601.

A plasma-process apparatus identical to the apparatus shown in FIG. 27 was actually operated, thereby plasma-etching a semiconductor wafer identical to the wafer 604 described above, under the same conditions specified above. The signal-possessing section 691 of the apparatus processed the voltage signals sequentially output from the sampling section 609, and plotted the sampled values on the time axis, thereby forming a time-series data. FIG. 28 is a graph representing the time-series data thus prepared.

Figure 28:
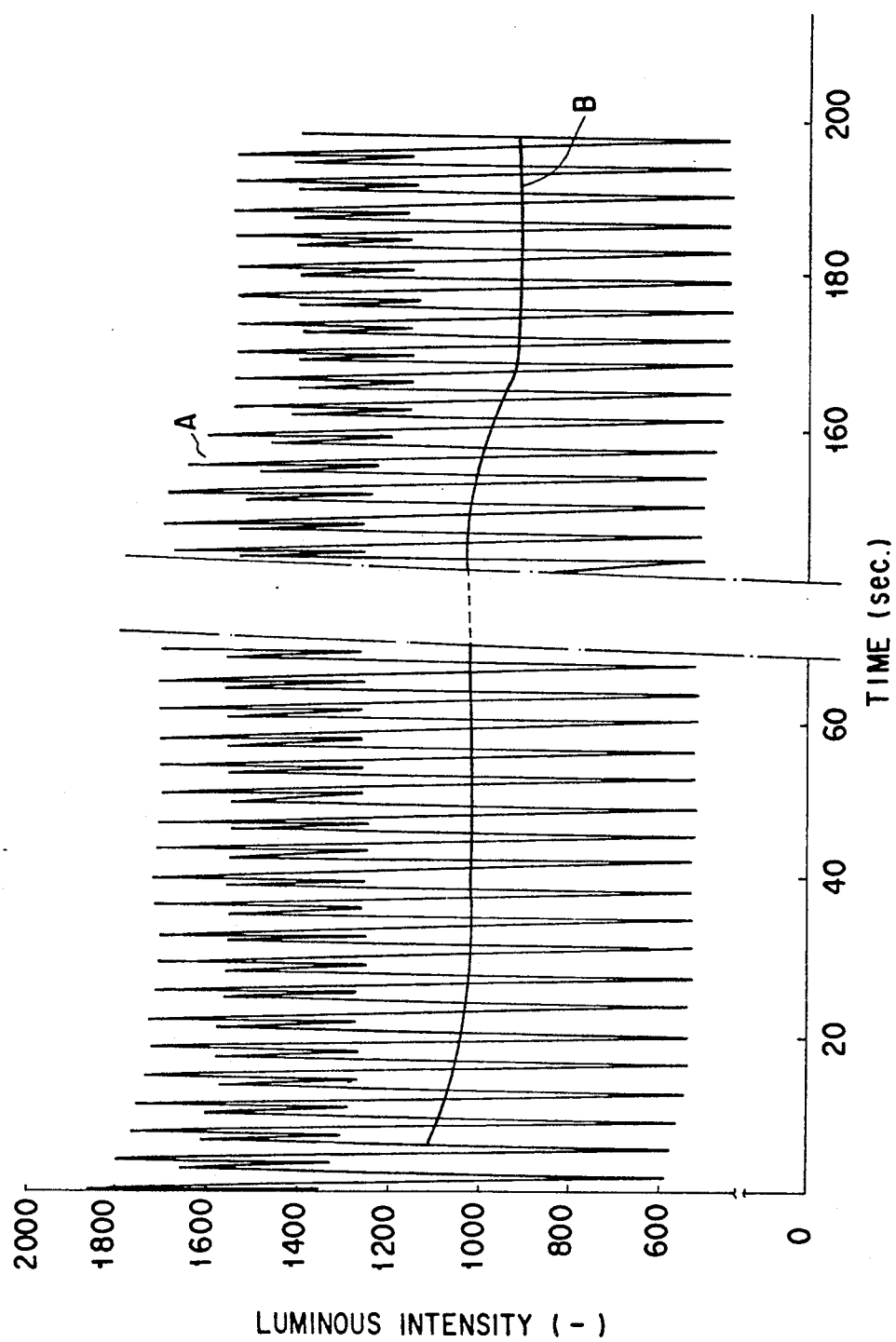
FIG. 28 is a graph showing how the luminous intensity of the plasma changed as the plasma etching proceeded in the apparatus of FIG. 27.

As is evident from FIG. 28, the luminous intensity at the measuring point within the vacuum chamber 601 changed at regular intervals between 600 to 1700 as the plasma moved due to the rotation of the magnetic field, immediately after the start of monitoring. In this graph, the distance between any two adjacent luminous intensity peaks corresponds to the one-rotation period of the rod magnet 605.

The manner, in which the luminous intensity at the measuring point changes periodically as is shown in FIG. 28, depends on the position of the measuring point and the light reflection occurring in the chamber 601. As can be seen from FIG. 28, two luminous peaks appeared during each one-rotation period of the magnet 605.

The solid-line curve B in FIG. 28 indicates how the average of the plasma luminous intensity changed as the plasma etching proceeded. As this curve B shows, the average luminous intensity decreased about 10% upon lapse of about 160 seconds from the start of the plasma etching. This decrease is due to the fact that CO gas was no longer generated at the end of etching and thereafter, and its concentration in the chamber 601 decreased abruptly.

In order to determine whether or not the plasma etching did actually end at the time the average luminous intensity decreased abruptly, plasma etching wa performed two times under the same conditions on the same wafer, as has been specified. In the first experiment, the etching was stopped some time before the average luminous intensity deceased sharply. In the second experiment, the etching was stopped shortly after before the average luminous intensity deceased drastically. The wafers which had been plasma-etched experimentally were photographed by means of an SEM. The SEM photos showed that a very thin silicon dioxide film remained on the surface of the wafer processed in the first experiment, whereas no silicon dioxide film remained on the wafer processed in the second experiment. Therefore, the abrupt decrease in the average luminous intensity was proved to have occurred at the end of the plasma etching. It was also established that the average luminous intensity calculated by the signal-processing section 69 changed in accordance with the plasma emission.

As has been described, the bar magnet 605 is rotated to rotate the magnetic field. Instead, a three-phase AC current can be supplied to three-phase windings, so that the motor M generates a magnetic field. In this case, it suffices to sample the current flowing through the three-phase windings.

The plasma-process apparatus, which is the sixth embodiment of the invention, can be applied not only to perform plasma etching. Also can it be applied to ash resist films and generate ions by applying plasma to a target.

This plasma-process apparatus can also be employed to the case where the plasma is repeatedly moved along a path while being processed. When the apparatus is put to this use, the magnetic field is rotated, not only but moved back and forth in a straight line.

The plasma-process apparatus shown in FIG. 27 is advantageous. Since the luminous intensity of the plasma is sampled in synchronism with the motion of the plasma, the sampled values (i.e., luminous intensities), for example the nth value sampled during the first one-rotation period and the nth value sampled during the second one-rotation period, represent the change in the position of the plasma. Hence, the sum or average of the values sampled during each one-rotation period of the magnet 605, calculated by the signal-processing section 691, is not affected by the luminous-intensity fluctuation accompanying the motion of the plasma. The sum or average of the sampled values well corresponds to the luminous intensity of the plasma itself, making it possible to measure the plasma luminous intensity with high accuracy.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A plasma-process method comprising the steps of:
   placing an object at a predetermined position within a reaction chamber in which to generate plasma, said object having a silicon dioxide film formed on at least a part of a surface thereof;
   conducting a CF-based gas used as reactant gas and a predetermined additional gas into said reaction chamber;

generating plasma in said reaction chamber, thereby to perform etching the silicon dioxide film formed on the object;

monitoring luminous intensity of active species present in the CF-based gas, which contributes to the etching and detecting an end point of the etching from a monitored luminous intensity of the active species, without influence of influence of an emission spectrum of the additional gas.

2. The method according to claim 1, wherein said CF-based gas includes at least one of CHF$_3$ and CF$_4$, and said active species includes at least one of CF$_2$ radical, CF ion, CF radical and CF$_3$ radical.

3. The method according to claim 1, wherein said additional gas includes argon gas.

4. The method according to claim 1, further comprising the steps of:

monitoring luminous intensity of a reaction product formed in the plasma during the etching; and calculating a ratio of the luminous intensity the active species present in the CF-based gas and contributing to the etching, and the luminous intensity of the reaction product, wherein the end point of the etching is detected from variation of the luminous intensity ratio thus calculated.

5. The method according to claim 4, wherein said CF-based gas includes CF$_2$ gas, and said reaction product includes CO gas.

6. The method according to claim 4, further comprising the step of:

calculating a transformation coefficient for coinciding curves representing changes in the luminous intensities of the active species and the reaction product, wherein said luminous intensity ratio is calculated on the basis of the transformation coefficient.

7. The method according to claim 6, further comprising the step of controlling an over-etching time in accordance with the luminous-intensity ratio, after the end point of the etching has been detected on the basis of changes in the luminous intensity ratio.

8. A plasma-process method comprising the steps of:

placing an object at a predetermined position within a reaction chamber in which to generate plasma, said object having a silicon dioxide film formed on at least a part of a surface thereof;

conducting a CF-based gas used as reactant gas and a predetermined additional gas into said reaction chamber;

generating plasma in said reaction chamber, thereby to perform etching the silicon dioxide film formed on the object;

monitoring an intensity of a light beam emitted from the plasma and having a desired wavelength which falls within a range of 210 to 236 nm; and detecting an end point of the etching from a monitored intensity of the light beam having the desired wavelength, without influence of influence of an emission spectrum of the additional gas.

9. The method according to claim 8, wherein said desired wavelength is at least one of 219.0 nm, 230.0 nm, 211.2 nm, 232.5 nm and any wavelength ranging from 224 to 229 nm.

10. The method according to claim 8, wherein said CF-based gas includes at least one of CHF$_3$ and CF$_4$.

11. The method according to claim 8, wherein said additional gas includes argon gas.

12. A plasma-process method comprising the steps of:

placing an object at a predetermined position within a reaction chamber in which to generate plasma, said object having a silicon dioxide film formed on at least a part of a surface thereof;

conducting a CF-based gas used as reactant gas into said reaction chamber;

generating plasma in said reaction chamber, thereby to perform etching the silicon dioxide film formed on the object;

monitoring luminous intensity of active species present in the CF-based gas, which contributes to the etching; and detecting an end point of the etching from a monitored luminous intensity of the active species.

13. The method according to claim 12, wherein said CF-based gas includes at least one of CHF$_3$ and CF$_4$, and said active species includes at least one of CF$_2$ radical, CF ion, CF radical and CF$_3$ radical.

14. The method according to claim 12, further comprising the steps of:

monitoring luminous intensity of a reaction product formed in the plasma during the etching; and calculating a ratio of the luminous intensity of the active species present in the CF-based gas and contributing to the etching, and the luminous intensity of the reaction product, wherein the end point of the etching is detected from variation of the luminous intensity ratio thus calculated.

15. The method according to claim 12, wherein said CF-based gas includes CF$_2$ gas, and said reaction product includes CO gas.

16. The method according to claim 12, further comprising the step of:

calculating a transformation coefficient for coinciding curves representing changes in the luminous intensities of the active species and the reaction product, wherein said luminous intensity ratio is calculated on the basis of the transformation coefficient.

17. The method according to claim 16, further comprising the step of controlling an over-etching time in accordance with the luminous-intensity ratio, after the end point of the etching has been detected on the basis of changes in the luminous intensity ratio.

18. A plasma-process method comprising the steps of:

placing an object at a predetermined position within a reaction chamber in which to generate plasma, said object having a silicon dioxide film formed on at least a part of a surface thereof;

conducting a CF-based gas used as a reactant gas into said reaction chamber;

generating plasma in said reaction chamber, thereby to perform etching the silicon dioxide film formed on the object;

monitoring an intensity of a light beam emitted from the plasma and having a desired wavelength which falls within a range of 210 to 236 nm; and detecting an end point of the etching from a monitored intensity of the light beam having the desired wavelength.

19. The method according to claim 18, wherein said desired wavelength is at least one of 219.0 nm, 230.0 nm, 211.2 nm, 232.5 nm and any wavelength ranging from 224 to 229 nm.

20. The method according to claim 18, wherein said CF-based gas includes at least one of CHF$_3$ and CF$_4$.

* * * * *

UNITED STATES PATENT AND TRADEMARK OFFICE
CERTIFICATE OF CORRECTION

PATENT NO. : 5,322,590
DATED : June 21, 1994
INVENTOR(S) : CHISHIO KOSHIMIZU

It is certified that error appears in the above-indentified patent and that said Letters Patent is hereby corrected as shown below:

In column 47, line 9, change "influence of influence of" to --influence of--.

In column 47, line 59, change "influence of influence of" to --influence of--.

Signed and Sealed this

Twenty-eight Day of February, 1995

Attest:

BRUCE LEHMAN

Attesting Officer    Commissioner of Patents and Trademarks